(12) United States Patent
Kataoka et al.

(10) Patent No.: US 12,718,871 B2
(45) Date of Patent: Aug. 25, 2026

(54) SEMICONDUCTOR MEMORY DEVICE TRANSITIONING TO STANDBY MODE IN BETWEEN TWO OPERATIONS

(71) Applicant: Kioxia Corporation, Tokyo (JP)

(72) Inventors: Hideyuki Kataoka, Yokohama Kanagawa (JP); Yoshinao Suzuki, Yokohama Kanagawa (JP); Mai Shimizu, Kamakura Kanagawa (JP); Kazuyoshi Muraoka, Yokohama Kanagawa (JP); Masami Masuda, Chigasaki Kanagawa (JP); Yoshikazu Hosomura, Kamakura Kanagawa (JP)

(73) Assignee: Kioxia Corporation, Tokyo (JP)

( * ) Notice: Subject to any disclaimer, the term of this patent is extended or adjusted under 35 U.S.C. 154(b) by 247 days.

(21) Appl. No.: 18/504,018

(22) Filed: Nov. 7, 2023

(65) Prior Publication Data

US 2024/0071478 A1 Feb. 29, 2024

Related U.S. Application Data

(63) Continuation of application No. PCT/JP2021/043812, filed on Nov. 30, 2021.

(30) Foreign Application Priority Data

May 18, 2021 (JP) ................................ 2021-084117

(51) Int. Cl.
*G11C 11/4096* (2006.01)
*G11C 5/06* (2006.01)
(Continued)

(52) U.S. Cl.
CPC .......... *G11C 11/4096* (2013.01); *G11C 5/063* (2013.01); *G11C 11/4072* (2013.01); *G11C 11/4076* (2013.01)

(58) Field of Classification Search
CPC ........... G11C 11/4096; G11C 11/4072; G11C 11/4076; G11C 11/5635; G11C 11/5628;
(Continued)

(56) References Cited

U.S. PATENT DOCUMENTS 7,586,807 B2 * 9/2009 Noda .................. G11C 29/022 365/222
9,466,342 B2 * 10/2016 Miyano .................... G11C 8/08
(Continued)

FOREIGN PATENT DOCUMENTS

JP H10149683 A 6/1998
JP 2012185897 A 9/2012
(Continued)

OTHER PUBLICATIONS

International Search Report (ISR) (and English translation thereof) dated Jan. 25, 2022, issued in International Application No. PCT/JP2021/043812.

(Continued)

*Primary Examiner* — Sultana Begum
(74) *Attorney, Agent, or Firm* — Holtz, Holtz & Volek PC

(57) ABSTRACT

A semiconductor memory device comprises a first memory cell and a second memory cell. The semiconductor memory device is configured to be able to perform: a first operation which is a read operation or the like to the first memory cell; and a second operation which is a read operation or the like to the second memory cell. The semiconductor memory device transitions to a standby mode after performing the first operation in response to an input of a first command set and a second command set. The semiconductor memory device performs a charge share operation after the standby mode is released in response to an input of a third command set and a fourth command set during the standby mode. The semiconductor memory device performs the second opera- (Continued)

tion using at least a part of an electric charge generated when the first operation is performed.

12 Claims, 43 Drawing Sheets

(51) Int. Cl.
*G11C 11/4072* (2006.01)
*G11C 11/4076* (2006.01)

(58) Field of Classification Search
CPC ..... G11C 11/5642; G11C 5/063; G11C 5/148; G11C 16/16; G11C 16/30; G11C 16/08; G11C 16/10; G11C 16/26; G11C 16/32; G11C 16/3459; G11C 16/0483; G11C 2211/5621; G11C 2207/2227; H10D 30/021; H10B 41/27; H10B 43/27
See application file for complete search history.

(56) References Cited

U.S. PATENT DOCUMENTS

| | | | |
|---|---|---|---|
| 9,666,296 | B1 | 5/2017 | Maejima |
| 2011/0116322 | A1 | 5/2011 | Seol et al. |
| 2012/0206977 | A1 | 8/2012 | Shibata et al. |
| 2017/0133094 | A1 | 5/2017 | Wang |
| 2017/0243656 | A1 | 8/2017 | Murakami et al. |
| 2019/0303042 | A1* | 10/2019 | Kim ...................... G06F 3/0659 |

FOREIGN PATENT DOCUMENTS

| | | | |
|---|---|---|---|
| JP | 2017091595 | A | 5/2017 |
| JP | 2017147011 | A | 8/2017 |
| JP | 2017157260 | A | 9/2017 |

OTHER PUBLICATIONS

Written Opinion dated Jan. 25, 2022, issued in International Application No. PCT/JP2021/043812.

* cited by examiner

MD
PC
MCA
RD
SAM
DBUS
RA
CM
ADR
CMR
STR
SQC
VG
CA
DB
DAT
$D_{ADD}$
$D_{CMD}$
$D_{ST}$
I/O
CTR
$V_{PP}$
$V_{CCQ}$
$V_{CC}$
$V_{SS}$
DQ0
DQ1
DQ2
DQ7
DQS
$\overline{DQS}$
$\overline{CE}n$
CLE
ALE
$\overline{WE}$
$\overline{RE}$
RE
RY/$\overline{BY}$ DRV
VG
VSEL1
VSEL2
VSEL3
VSEL4
SW1
SW2
vg1
vg2
vg3
WLD
RD
wld
BLKD
BLKSEL
blkd
CG
WL
WLSEL
WLSEL
CG
CG Z
Y
X
$L_{MCA}$
$L_{TR}$
ST
CC
121
BL
Vy
Ch
BLK
B
130
125
120
110
101
111
112
100
D0, D1, D2
CS
gc
Tr
100I
GC SU
BLK
ST
Ch
Vy
BL
Y
Z
X
SU
130
120
125
110(SGD)
SHE
SU
BLK
110(SGD)
SHE
SU
110(SGD)
110(WL)
SHE
SU
110(SGD)
SHE
SU
$Y_{WL}$
$Y_{SGD}$
110(SGD)

FIG. 14B (1-3-3 code)

| | Er | A | B | C | D | E | F | G |
|---|---|---|---|---|---|---|---|---|
| Upper | 1 | 1 | 0 | 0 | 0 | 1 | 1 | 0 |
| Middle | 1 | 0 | 0 | 1 | 1 | 1 | 0 | 0 |
| Lower | 1 | 1 | 1 | 1 | 0 | 0 | 0 | 0 |

FIG. 14C (1-2-4 code)

| | Er | A | B | C | D | E | F | G |
|---|---|---|---|---|---|---|---|---|
| Upper | 1 | 0 | 0 | 1 | 1 | 0 | 0 | 1 |
| Middle | 1 | 1 | 0 | 0 | 0 | 0 | 1 | 1 |
| Lower | 1 | 1 | 1 | 1 | 0 | 0 | 0 | 0 |

DQx
CLE
ALE
DQS
DQS
WE
RE
RE
RY/BY
CSW
80h
A201
A202
A203
A204
A205
D201
D202
D203
D2XX
10h
70h
D211
t201
t202
t203
t204
t205
t206
t207
t208
t209
t210
t211
t212
t213
t214

MDA
MDB
RD
MS
MCA
BL
$C_{MC}$
BLK
$SL_{MDA}$
$SL_{MDB}$
SU
$WL_{MDA}$
$WL_{MDB}$
SW1
SW2
$T_{VG1}$
$T_{VG2}$
$P(V_{PP})$
$P(V_{SS})$
VG
vg1

MDA
MCA
MS
RD
BL
BL
$WL_{MDA}$
$C_{MC}$
BLK
$C_{MC}$
$SL_{MDA}$
SU
SU
BLK
BLK
SW1
SW2
vg1
$P(V_{SS})$
$P(V_{PP})$
VG
$T_{VG1}$
$T_{VG2}$
MDB
$WL_{MDB}$
$SL_{MDB}$

MD
MCAA
MS
RD
MCAB
BL
$C_{MC}$
BLK
$SL_{MCAA}$
$SL_{MCAB}$
SU
$WL_{MCAA}$
$WL_{MCAB}$
SW1
SW2
vg1
$P(V_{SS})$
VG
$T_{VG1}$
$T_{VG2}$

SEMICONDUCTOR MEMORY DEVICE TRANSITIONING TO STANDBY MODE IN BETWEEN TWO OPERATIONS

CROSS-REFERENCE TO RELATED APPLICATIONS

This application is based upon and claims the benefit of PCT International Application No. PCT/JP2021/043812, filed on Nov. 30, 2021, which claims the benefit of Japanese Patent Application No. 2021-084117, filed on May 18, 2021, the entire contents of which are incorporated herein by reference.

BACKGROUND

Field

Embodiments described herein relate generally to a semiconductor memory device.

Description of the Related Art

There has been known a semiconductor memory device that includes a plurality of memory cells and configured to be able to perform a read operation, a write operation, and an erase operation to the plurality of memory cells.

DETAILED DESCRIPTION

Figure 1:
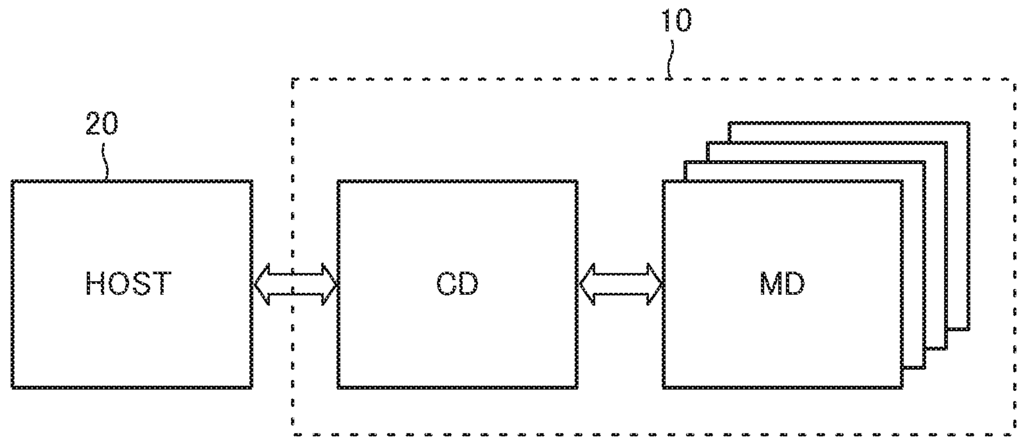
FIG. 1 is a schematic block diagram illustrating a configuration of a memory system 10.

A semiconductor memory device according to an embodiment comprises a first memory cell and a second memory cell. The semiconductor memory device is configured to be able to perform: a first operation which is a read operation, a write operation, or an erase operation to the first memory cell; and a second operation which is a read operation, a write operation, or an erase operation to the second memory cell. The semiconductor memory device transitions to a standby mode after performing the first operation in response to an input of a first command set and a second command set. The semiconductor memory device performs a charge share operation after the standby mode is released in response to an input of a third command set and a fourth command set during the standby mode. The semiconductor memory device performs the second operation using at least a part of an electric charge generated when the first operation is performed.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

A "control circuit" in this specification may mean a peripheral circuit, such as a sequencer, disposed in a memory die, may mean a controller die, a controller chip, or the like connected to a memory die, and may mean a configuration including both of them.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Memory System 10]

FIG. 1 is a schematic block diagram illustrating a configuration of a memory system 10 according to the first embodiment.

The memory system 10, for example, reads, writes, and erases user data in response to a signal transmitted from a host computer 20. The memory system 10 is, for example, any system that can store the user data including a memory chip, a memory card, and an SSD. The memory system 10 includes a plurality of memory dies MD and a controller die CD. The memory die MD stores the user data. The controller die CD is connected to the plurality of memory dies MD and the host computer 20. The controller die CD includes, for example, a processor, RAM, and the like. The controller die CD performs processes, such as a conversion between the logical address and the physical address, a bit error detection/correction, a garbage collection (compaction), and a wear leveling.

Figure 2:
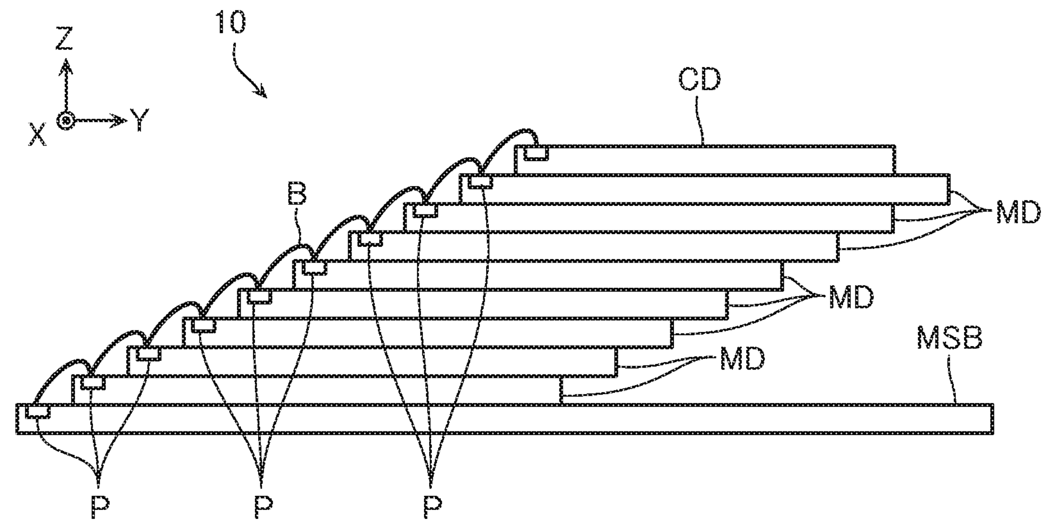
FIG. 2 is a schematic side view illustrating an exemplary configuration of the memory system 10.
Figure 3:
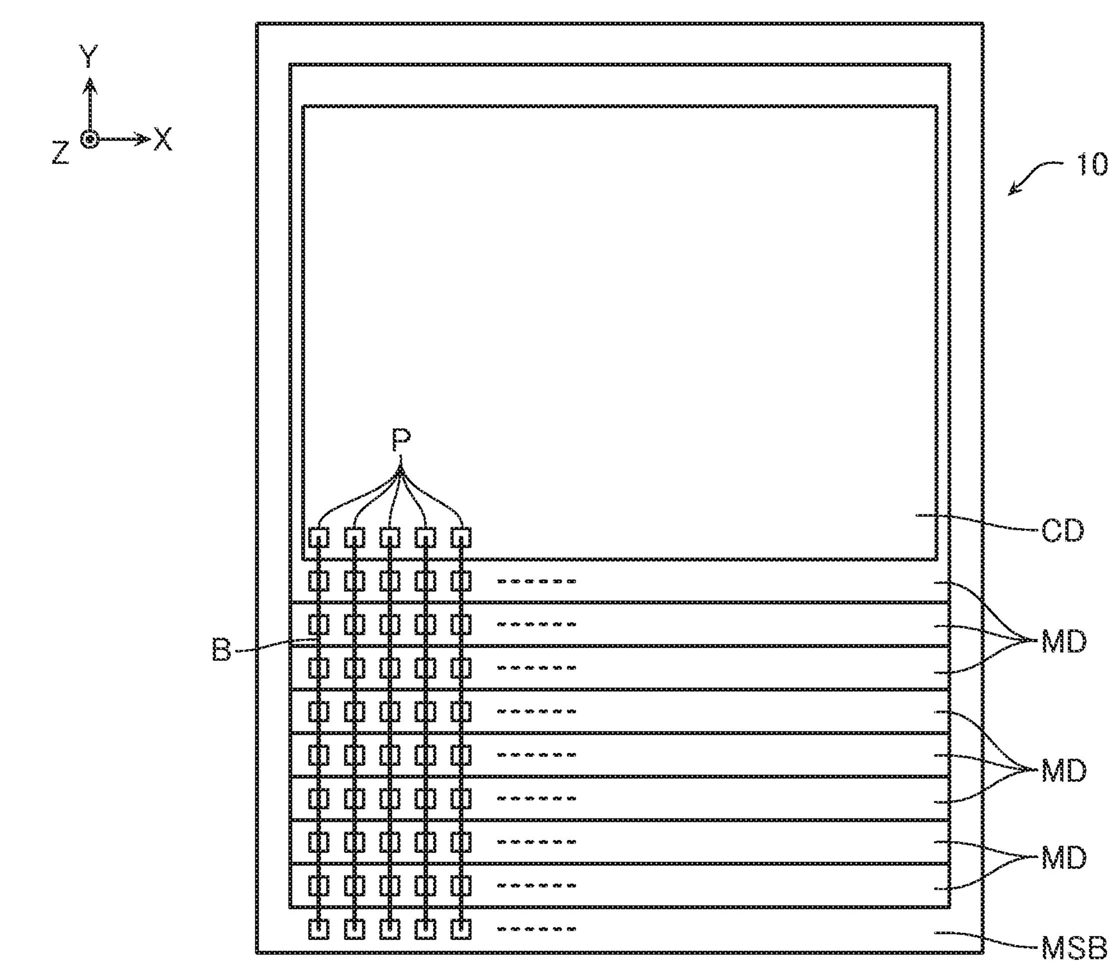
FIG. 3 is a schematic plan view illustrating the exemplary configuration of the memory system 10.

FIG. 2 is a schematic side view illustrating an exemplary configuration of the memory system 10 according to the embodiment. FIG. 3 is a schematic plan view illustrating the exemplary configuration. For convenience of description, FIG. 2 and FIG. 3 omit a part of the configuration.

As illustrated in FIG. 2, the memory system 10 according to the embodiment includes a mounting substrate MSB, the plurality of memory dies MD, and the controller die CD. On an upper surface of the mounting substrate MSB, a pad electrode P is disposed in a region at an end portion in the Y-direction. A region excluding the end portion in the Y-direction in the upper surface of the mounting substrate MSB is bonded to a lower surface of the memory die MD via an adhesive and the like. A plurality of the memory dies MD are stacked on the mounting substrate MSB. On an upper surface of the memory die MD, the pad electrode P is disposed in a region at an end portion in the Y-direction. A region excluding the end portion in the Y-direction in the upper surface of the memory die MD is bonded to a lower surface of another memory die MD or the controller die CD via the adhesive and the like. The controller die CD is stacked on the memory die MD. On an upper surface of the controller die CD, the pad electrode P is disposed in a region at an end portion in the Y-direction.

As illustrated in FIG. 3, the mounting substrate MSB, the plurality of memory dies MD, and the controller die CD each include a plurality of the pad electrodes P arranged in the X-direction. The plurality of pad electrodes P disposed to each of the mounting substrate MSB, the plurality of memory dies MD, and the controller die CD are mutually connected via bonding wires B.

Note that the configuration illustrated in FIG. 2 and FIG. 3 is merely an example, and specific configurations are appropriately adjustable. For example, in the example illustrated in FIG. 2 and FIG. 3, the controller die CD is stacked on the plurality of memory dies MD. The memory die MD and the controller die CD are connected by the bonding wires B. The plurality of memory dies MD and the controller die CD are included in one package. However, the controller die CD may be included in a package different from the memory die MD. Additionally, the plurality of memory dies MD and the controller die CD may be connected to one another via through electrodes or the like, not the bonding wires B.

[Circuit Configuration of Memory Die MD]

Figure 4:
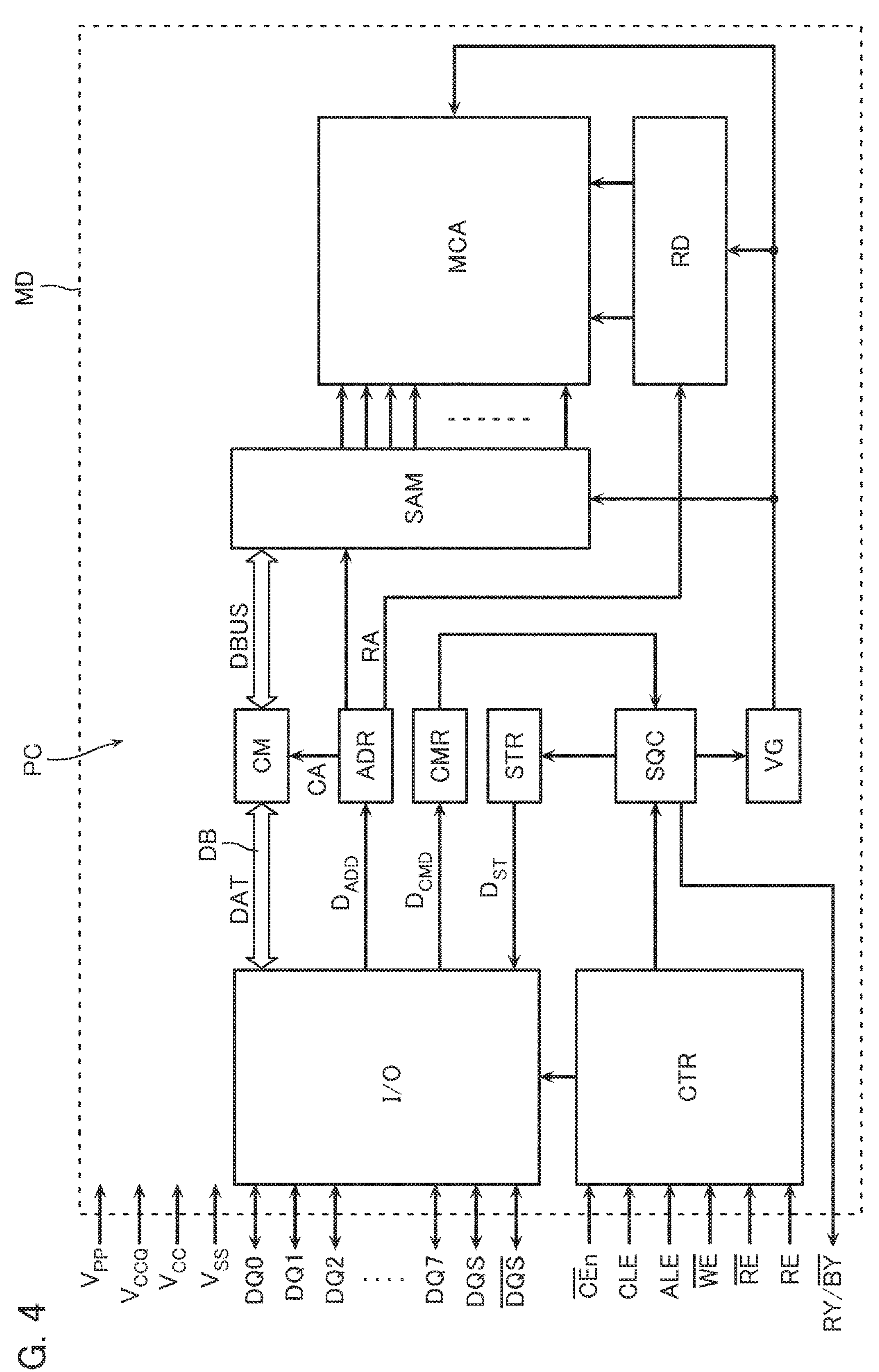
FIG. 4 is a schematic block diagram illustrating a configuration of a memory die MD according to the first embodiment.

FIG. 4 is a schematic block diagram illustrating the configuration of the memory die MD according to the first embodiment. FIG. 5 to FIG. 9 are schematic circuit diagrams illustrating a part of the configuration of the memory die MD.

FIG. 4 illustrates a plurality of control terminals and the like. These plurality of control terminals are indicated as control terminals corresponding to a high active signal (positive logic signal) in some cases. These plurality of control terminals are indicated as control terminals corresponding to a low active signal (negative logic signal) in some cases. These plurality of control terminals are indicated as control terminals corresponding to both the high active signal and the low active signal in some cases. In FIG. 4, a reference sign of the control terminal corresponding to the low active signal includes an over line (overbar). In this specification, a reference sign of the control terminal corresponding to the low active signal includes a slash ("/"). The description of FIG. 4 is an example, and specific aspects are appropriately adjustable. For example, a part of or all of the high active signals can be changed to the low active signals, or a part of or all of the low active signals can be changed to the high active signals.

As illustrated in FIG. 4, the memory die MD includes a memory cell array MCA and a peripheral circuit PC. The peripheral circuit PC includes a voltage generation circuit VG, a row decoder RD, a sense amplifier module SAM, and a sequencer SQC. The peripheral circuit PC includes a cache memory CM, an address register ADR, a command register CMR, and a status register STR. The peripheral circuit PC includes an input/output control circuit I/O and a logic circuit CTR.

[Circuit Configuration of Memory Cell Array MCA]

Figure 5:
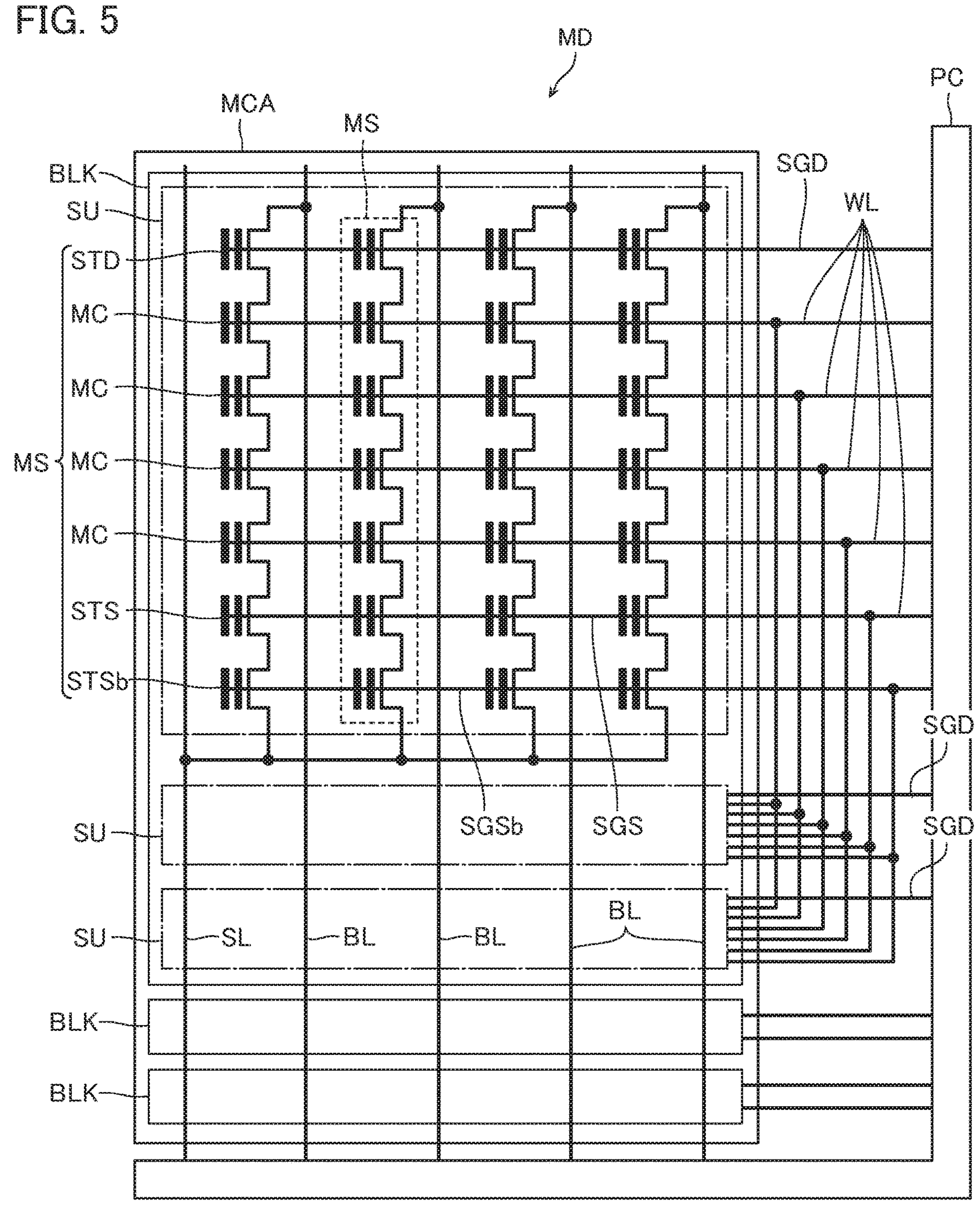
FIG. 5 is a schematic circuit diagram illustrating a part of the configuration of the memory die MD.

As illustrated in FIG. 5, the memory cell array MCA includes the above-described plurality of memory blocks BLK. Each of these plurality of memory blocks BLK includes a plurality of string units SU. Each of these plurality of string units SU includes a plurality of memory strings MS. Each of these plurality of memory strings MS has one end connected to the peripheral circuit PC via a bit line BL. Each of these plurality of memory strings MS has the other end connected to the peripheral circuit PC via a common source line SL.

The memory string MS includes a drain-side select transistor STD, a plurality of memory cells MC (memory transistors), a source-side select transistor STS, and a source-side select transistor STSb. The drain-side select transistor STD, the plurality of memory cells MC, the source-side select transistor STS, and the source-side select transistor STSb are connected in series between the bit line BL and the source line SL. Hereinafter, the drain-side select transistor STD, the source-side select transistor STS, and the source-side select transistor STSb are simply referred to as select transistors (STD, STS, STSb) in some cases.

The memory cell MC is a field-effect type transistor. The memory cell MC includes a semiconductor layer, a gate insulating film, and a gate electrode. The semiconductor layer functions as a channel region. The gate insulating film includes an electric charge accumulating film. The memory cell MC has a threshold voltage that varies corresponding to an electric charge amount in the electric charge accumulating film. The memory cell MC stores data of one bit or a plurality of bits. The gate electrodes of the plurality of memory cells MC corresponding to one memory string MS are connected to respective word lines WL. Each of these word lines WL is connected to all the memory strings MS in one memory block BLK in common.

The select transistors (STD, STS, STSb) are field-effect type transistors. The select transistors (STD, STS, STSb) each include a semiconductor layer, a gate insulating film, and a gate electrode. The semiconductor layer functions as a channel region. The gate electrodes of the select transistors (STD, STS, STSb) are connected to the select gate lines (SGD, SGS, SGSb), respectively. One drain-side select gate line SGD is commonly connected to all the memory strings MS in one string unit SU. One source-side select gate line SGS is commonly connected to all the memory strings MS in one memory block BLK. One source-side select gate line SGSb is commonly connected to all the memory strings MS in one memory block BLK.

[Circuit Configuration of Voltage Generation Circuit VG]

Figure 6:
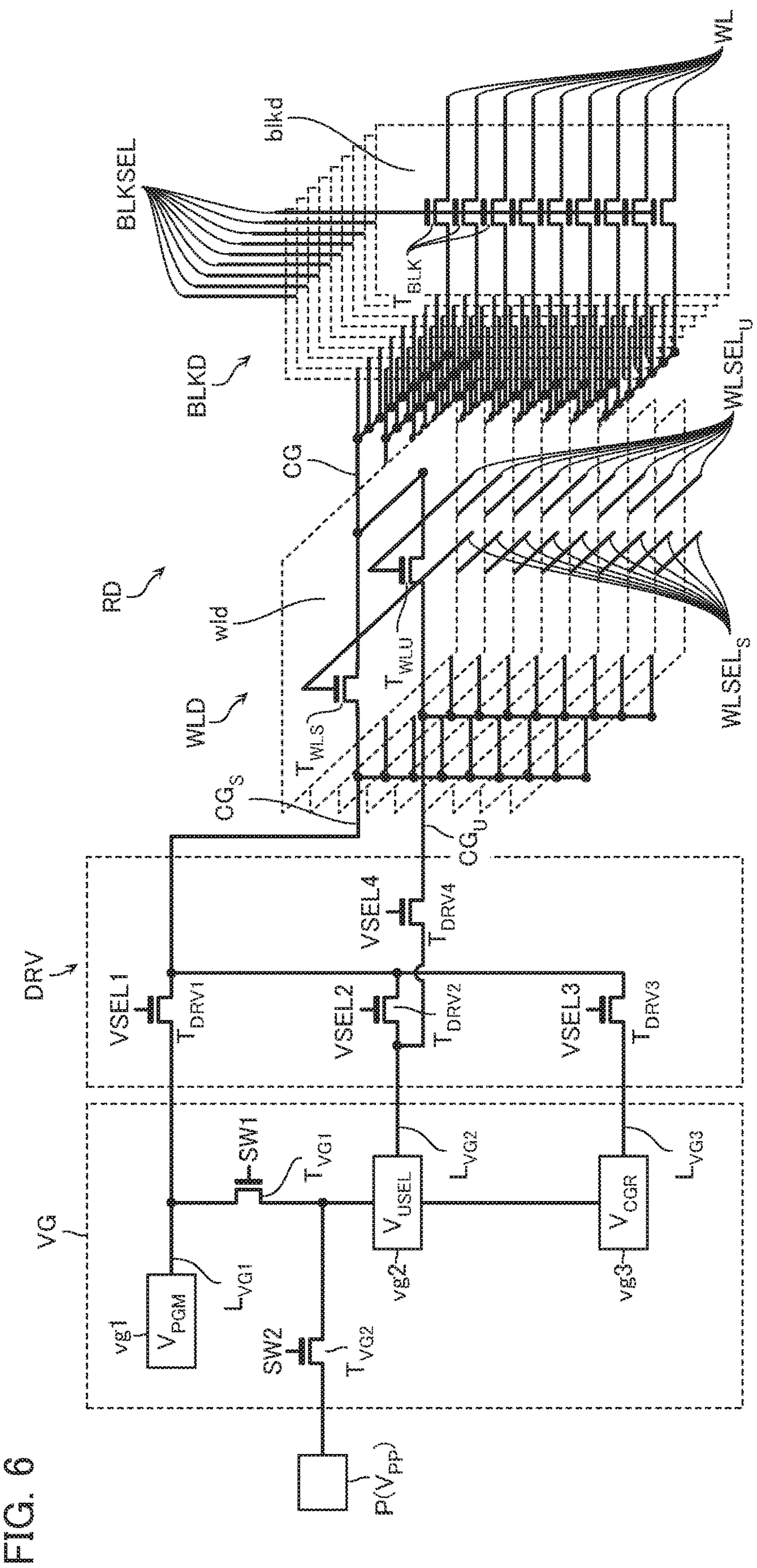
FIG. 6 is a schematic circuit diagram illustrating a part of the configuration of the memory die MD.

For example, as illustrated in FIG. 6, the voltage generation circuit VG (FIG. 4) includes a plurality of $T_{VG1}$, voltage generation units vg1 to vg3 and transistors $T_{VG2}$. The voltage generation units vg1 to vg3 generate voltages of predetermined magnitudes and output them via voltage supply lines $L_{VG1}$, $L_{VG2}$, and $L_{VG3}$ in the read operation, the write operation, and the erase operation. Operating voltages output from each of the voltage generation units vg1 to vg3 are adjusted as necessary in accordance with control signals from the sequencer SQC.

The voltage generation units vg1 is a step-up circuit such as a charge pump circuit. The voltage generation unit vg1 outputs a program voltage used in the write operation. An output terminal of the voltage generation unit vg1 is connected to a voltage supply line $L_{VG1}$. The voltage supply line $L_{VG1}$ is connected to the voltage generation unit vg2 via the transistor $T_{VG1}$. The voltage supply line $L_{VG1}$ is connected to a pad electrode P which is able to supply a voltage $V_{PP}$, via the transistors $T_{VG1}$, $T_{VG2}$. In operations of the semiconductor memory device according to the embodiment, the voltage $V_{PP}$ may be supplied to the pad electrode P, or the voltage $V_{PP}$ need not to be supplied to the pad electrode P. Gate electrodes of the transistors $T_{VG1}$, $T_{VG2}$ are connected to signal lines SW1, SW2.

The voltage generation unit vg2 is a step-down circuit such as a regulator. The voltage generation unit vg2 outputs a read pass voltage $V_{READ}$ described later in the read operation. The voltage generation unit vg2 outputs a write pass voltage $V_{PASS}$ described later in the write operation.

The voltage generation unit vg3 is a step-down circuit such as a regulator. The voltage generation unit vg3 outputs a read voltage described later in the read operation. The voltage generation unit vg3 outputs a verify voltage described later in the write operation.

A charge pump circuit 32 (FIG. 7) in the voltage generation circuit VG includes a voltage output circuit 32*a*, a voltage dividing circuit 32*b*, and a comparator 32*c*. The voltage output circuit 32*a* outputs a voltage $V_{OUT}$ to the voltage supply line $L_{VG}$. The voltage dividing circuit 32b is connected to the voltage supply line $L_{VG}$. The comparator 32c outputs a feedback signal FB to the voltage output circuit 32a corresponding to a magnitude relation between a voltage $V_{OUT}'$ output from the voltage dividing circuit 32b and a reference voltage $V_{REF}$.

Figure 8:
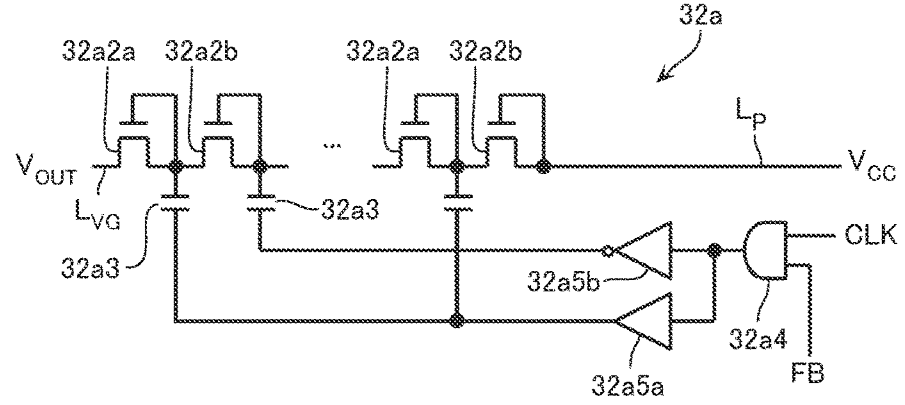
FIG. 8 is a schematic circuit diagram illustrating a part of the configuration of the memory die MD.

As illustrated in FIG. 8, the voltage output circuit 32a includes a plurality of transistors 32a2a, 32a2b. The plurality of transistors 32a2a, 32a2b are alternately connected between the voltage supply line $L_{VG}$ and the voltage supply line $L_P$. The illustrated voltage supply line $L_P$ is applied with the power supply voltage $V_{CC}$. Gate electrodes of the plurality of transistors 32a2a, 32a2b connected in series are connected to their own drain electrodes and respective capacitors 32a3. The voltage output circuit 32a includes an AND circuit 32a4, a level shifter 32a5a, and a level shifter 32a5b. The AND circuit 32a4 outputs a logical disjunction of the clock signal CLK and the feedback signal FB. The level shifter 32a5a steps up the output signal of the AND circuit 32a4 and outputs it. The level shifter 32a5a includes an output terminal connected to the gate electrode of the transistor 32a2a via the capacitor 32a3. The level shifter 32a5b steps up an inverted signal of the output signal of the AND circuit 32a4 and outputs it. The level shifter 32a5b includes an output terminal connected to the gate electrode of the transistor 32a2b via the capacitor 32a3.

When the feedback signal FB is in an "H" state, the AND circuit 32a4 outputs the clock signal CLK. In response to this, electrons are transferred from the voltage supply line $L_{VG}$ to the voltage supply line $L_P$, and the voltage of the voltage supply line $L_{VG}$ increases. Meanwhile, when the feedback signal FB is in an "L" state, the AND circuit 32a4 does not output the clock signal CLK. Therefore, the voltage of the voltage supply line $L_{VG}$ does not increase.

Figure 7:
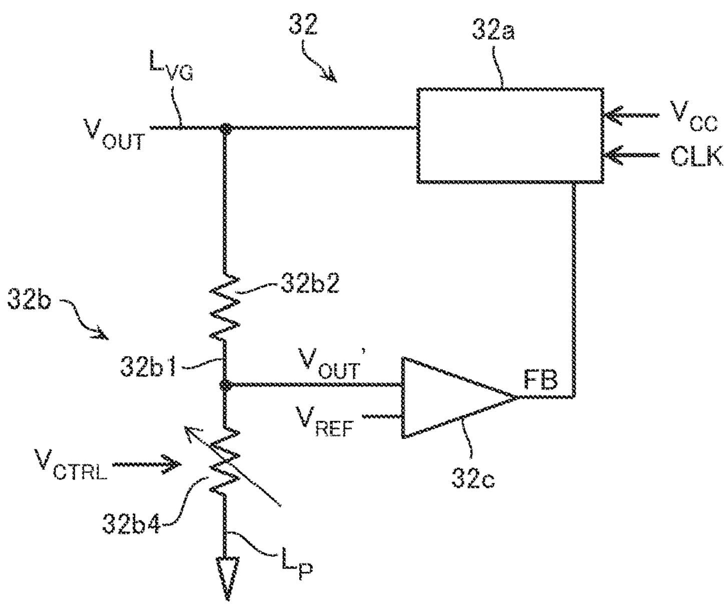
FIG. 7 is a schematic circuit diagram illustrating a part of the configuration of the memory die MD.

As illustrated in FIG. 7, the voltage dividing circuit 32b includes a resistor element 32b2 and a variable resistor element 32b4. The resistor element 32b2 is connected between the voltage supply line $L_{VG}$ and a voltage dividing terminal 32b1. The variable resistor element 32b4 is connected in series between the voltage dividing terminal 32b1 and the voltage supply line $L_P$. The voltage supply line $L_P$ is applied with the ground voltage $V_{SS}$. The variable resistor element 32b4 has a resistance value adjustable in accordance with an operating voltage control signal $V_{CTRL}$. Therefore, a magnitude of a voltage $V_{OUT}'$ of the voltage dividing terminal 32b1 is adjustable in accordance with the operating voltage control signal $V_{CTRL}$.

Figure 9:
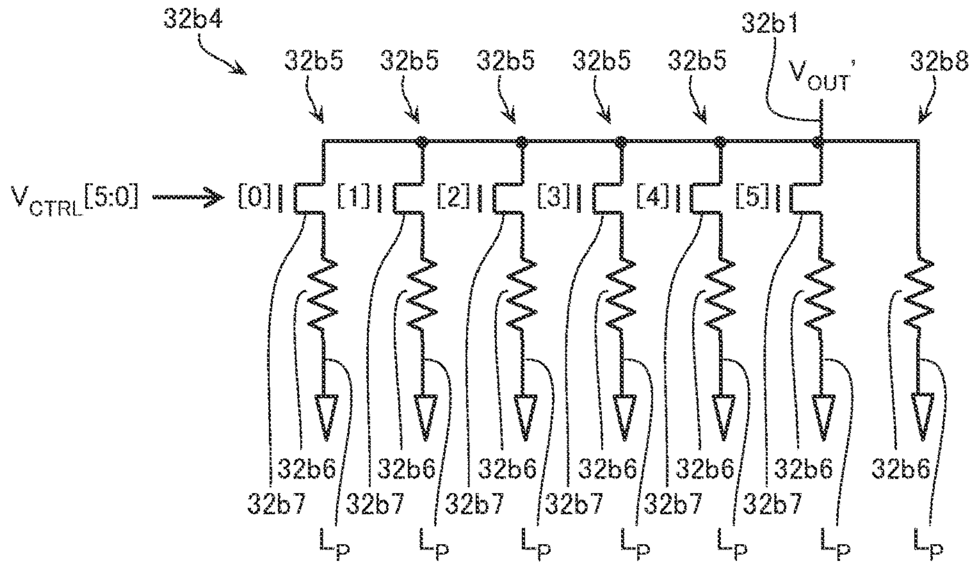
FIG. 9 is a schematic circuit diagram illustrating a part of the configuration of the memory die MD.

As illustrated in FIG. 9, the variable resistor element 32b4 includes a plurality of current paths 32b5. The plurality of current paths 32b5 are connected in parallel between the voltage dividing terminal 32b1 and the voltage supply lines $L_P$. The plurality of current paths 32b5 each include a resistor element 32b6 and a transistor 32b7 connected in series. The resistor elements 32b6 disposed in the respective current paths 32b5 may have mutually different resistance values. Different bits of the operating voltage control signal $V_{CTRL}$ are input to respective gate electrodes of the transistors 32b7. The variable resistor element 32b4 may include a current path 32b8 without the transistor 32b7.

As illustrated in FIG. 7, the comparator 32c outputs the feedback signal FB. The feedback signal FB turns to the "L" state, for example, when the voltage $V_{OUT}'$ of the voltage dividing terminal 32b1 is larger than the reference voltage $V_{REF}$. The feedback signal FB turns to the "H" state, for example, when the voltage $V_{OUT}'$ is smaller than the reference voltage $V_{REF}$.

[Circuit Configuration of Row Decoder RD]

For example, as illustrated in FIG. 6, the row decoder RD includes a block decoder BLKD, a word line decoder WLD, a driver circuit DRV, and an address decoder (not illustrated).

The block decoder BLKD includes a plurality of block decode units blkd. The plurality of block decode units blkd correspond to the plurality of memory blocks BLK in the memory cell array MCA. The block decode unit blkd includes a plurality of transistors $T_{BLK}$. The plurality of transistors $T_{BLK}$ correspond to the plurality of word lines WL in the memory block BLK. The transistor $T_{BLK}$ is, for example, a field-effect type NMOS transistor. The transistor $T_{BLK}$ includes a drain electrode connected to the word line WL. The transistor $T_{BLK}$ includes a source electrode connected to a wiring CG. The wiring CG is connected to all of the block decode units blkd in the block decoder BLKD. The transistor $T_{BLK}$ includes a gate electrode connected to a signal line BLKSEL. A plurality of the signal lines BLKSEL are disposed corresponding to all of the block decode units blkd. The signal line BLKSEL is connected to all of the transistors $T_{BLK}$ in the block decode unit blkd.

In the read operation, the write operation, and the like, for example, the voltage of one signal line BLKSEL corresponding to a block address in the address register ADR (FIG. 4) turns to the "H" state, and the voltages of the other signal lines BLKSEL turn to the "L" state. For example, the one signal line BLKSEL is applied with a predetermined driving voltage having a positive magnitude, and the other signal lines BLKSEL are applied with the ground voltage $V_{SS}$ or the like. Accordingly, all of the word lines WL in one memory block BLK corresponding to this block address are electrically conductive to all of the wirings CG. All of the word lines WL in the other memory blocks BLK turn to a floating state.

The word line decoder WLD includes a plurality of word line decode units wld. The plurality of word line decode units wld correspond to the plurality of memory cells MC in the memory string MS. In the illustrated example, the word line decode unit wld includes two transistors $T_{WLS}$, $T_{WLU}$. The transistors $T_{WLS}$, $T_{WLU}$ are, for example, field-effect type NMOS transistors. The transistors $T_{WLS}$, $T_{WLU}$ include drain electrodes connected to the wiring CG. The transistor $T_{WLS}$ includes a source electrode connected to a wiring $CG_S$. The transistor $T_{WLU}$ includes a source electrode connected to a wiring $CG_U$. The transistor $T_{WLS}$ includes a gate electrode connected to a signal line $WLSEL_S$. The transistor $T_{WLU}$ includes a gate electrode connected to a signal line $WLSEL_U$. A plurality of the signal lines $WLSEL_S$ are disposed corresponding to the one transistors $T_{WLS}$ included in all of the word line decode units wld. A plurality of the signal lines $WLSEL_U$ are disposed corresponding to the other transistors $T_{WLU}$ included in all of the word line decode units wld.

In the read operation, the write operation, and the like, for example, the voltage of the signal line $WLSEL_S$ corresponding to one word line decode unit wld corresponding to a page address in the address register ADR (FIG. 4) turns to the "H" state, and the voltage of the signal line $WLSEL_U$ corresponding to this turns to the "L" state. The voltages of the signal lines $WLSEL_S$ corresponding to the other word line decode units wld turn to the "L" state, and the voltages of the signal lines $WLSEL_U$ corresponding to them turn to the "H" state. The wiring $CG_S$ is applied with a voltage corresponding to a selected word line $WL_S$. The wiring $CG_U$ is applied with a voltage corresponding to an unselected word line $WL_U$. Accordingly, the one word line WL corresponding to the page address is applied with the voltage corresponding to the selected word line $WL_S$. The other word lines WL are applied with the voltage corresponding to the unselected word line $WL_U$.

The driver circuit DRV includes, for example, four transistors $T_{DRV1}$ to $T_{DRV4}$. The transistors $T_{DRV1}$ to $T_{DRV4}$ are, for example, field-effect type NMOS transistors. The transistors $T_{DRV1}$ to $T_{DRV3}$ include drain electrodes connected to the wiring $CG_S$. The transistor $T_{DRV4}$ includes drain electrodes connected to the wiring $CG_U$. The transistor $T_{DRV1}$ includes a source electrode connected to an output terminal of the voltage generation unit vg1 via a voltage supply line $L_{VG1}$. The transistors $T_{DRV2}$, $T_{DRV4}$ include source electrodes connected to an output terminal of the voltage generation unit vg2 via a voltage supply line $L_{VG2}$. The transistor $T_{DRV3}$ includes a source electrode connected to an output terminal of the voltage generation unit vg3 via a voltage supply line $L_{VG3}$. The transistors $T_{DRV1}$ to $T_{DRV4}$ include gate electrodes to which signal lines VSEL1 to VSEL4 are connected, respectively.

In the read operation, the write operation, and the like, for example, one of the voltages of the plurality of signal lines VSEL1 to VSEL3 corresponding to the wiring $CG_S$ turns to the "H" state, and the other voltages turn to the "L" state. A voltage of the signal line VSEL4 corresponding to the wiring $CG_U$ turns to the "H" state.

The address decoder (not illustrated), for example, sequentially refers to the row address RA of the address register ADR (FIG. 4) in accordance with the control signal from the sequencer SQC (FIG. 4). The row address RA includes the block address and the page address described above. The address decoder controls the voltages of the signal lines BLKSEL, $WLSEL_S$, and $WLSEL_U$ to the "H" state or the "L" state.

In the example of FIG. 6, the row decoder RD includes one block decode unit blkd for each memory block BLK. However, this configuration can be changed as necessary. For example, one block decode unit blkd may be disposed for two or more memory blocks BLK.

[Circuit Configuration of Sense Amplifier Module SAM]

The sense amplifier module SAM (FIG. 4) includes, for example a plurality of sense amplifier units. The plurality of sense amplifier units correspond to the plurality of bit lines BL. The sense amplifier units each include a sense circuit connected to the bit line BL, a latch circuit, and a voltage transfer circuit. The sense circuit includes a sense transistor and a data wiring. The sense transistor includes a gate electrode connected to the bit line BL. The sense transistor includes a drain electrode connected to the data wiring. The sense transistor turns to the ON state according to a voltage or a current of the bit line BL. The data wiring is charged or discharged in accordance with ON/OFF state of the sense transistor. The latch circuit latches data of "1" or "0" in accordance with a voltage of the data wiring. The voltage transfer circuit conducts the bit line BL with one of two voltage supply lines (not shown) in accordance with the data latched in the latch circuit.

[Circuit Configuration of Cache Memory CM]

The cache memory CM (FIG. 4) includes a plurality of latch circuits. The plurality of latch circuits are connected to the latch circuits in the sense amplifier module SAM via the wiring DBUS. Data DAT included in these plurality of latch circuits is sequentially transferred to the sense amplifier module SAM or the input/output control circuit I/O.

A decode circuit and a switch circuit (not illustrated) are connected to the cache memory CM. The decode circuit decodes a column address CA latched in the address register ADR. The switch circuit causes the latch circuit corresponding to the column address CA to be electrically conductive with a bus DB (FIG. 4) in response to the output signal of the decode circuit.

[Circuit Configuration of Sequencer SQC]

The sequencer SQC (FIG. 4) outputs an internal control signal to the row decoder RD, the sense amplifier module SAM, and the voltage generation circuit VG in accordance with command data $D_{CMD}$ latched in a command register CMR. The sequencer SQC outputs status data $D_{ST}$ indicating a status of itself to the status register STR as necessary.

The sequencer SQC generates a ready/busy signal and outputs it to a terminal RY//BY. In a period in which the voltage of the terminal RY//BY is in the "L" state, an access to the memory die MD is basically inhibited. In a period in which the voltage of the terminal RY//BY is in the "H" state, the access to the memory die MD is permitted.

[Circuit Configuration of Input/Output Control Circuit I/O]

The input/output control circuit I/O includes data signal input/output terminals DQ0 to DQ7, toggle signal input/output terminals DQS, /DQS, a plurality of input circuits, a plurality of output circuits, a shift register, and a buffer circuit. The plurality of input circuits, the plurality of output circuits, the shift register, and the buffer circuit are each connected to terminals to which a power supply voltage $V_{CCQ}$ and the ground voltage $V_{SS}$ are applied.

The data input via the data signal input/output terminals DQ0 to DQ7 is output to the cache memory CM, the address register ADR, or the command register CMR from the buffer circuit in response to the internal control signal from the logic circuit CTR. The data output via the data signal input/output terminals DQ0 to DQ7 is input to the buffer circuit from the cache memory CM or the status register STR in response to the internal control signal from the logic circuit CTR.

The plurality of input circuits include, for example, a comparator connected to any of the data signal input/output terminals DQ0 to DQ7 or both of the toggle signal input/output terminals DQS, /DQS. The plurality of output circuits include, for example, an Off Chip Driver (OCD) circuit connected to any of the data signal input/output terminals DQ0 to DQ7 or any of the toggle signal input/output terminals DQS, /DQS.

[Circuit Configuration of Logic Circuit CTR]

The logic circuit CTR (FIG. 4) receives an external control signal from the controller die CD via external control terminals /CEn, CLE, ALE, /WE, /RE, RE, and outputs the internal control signal to the input/output control circuit I/O in response to the external control signal.

[Structure of Memory Die MD]

Figure 10:
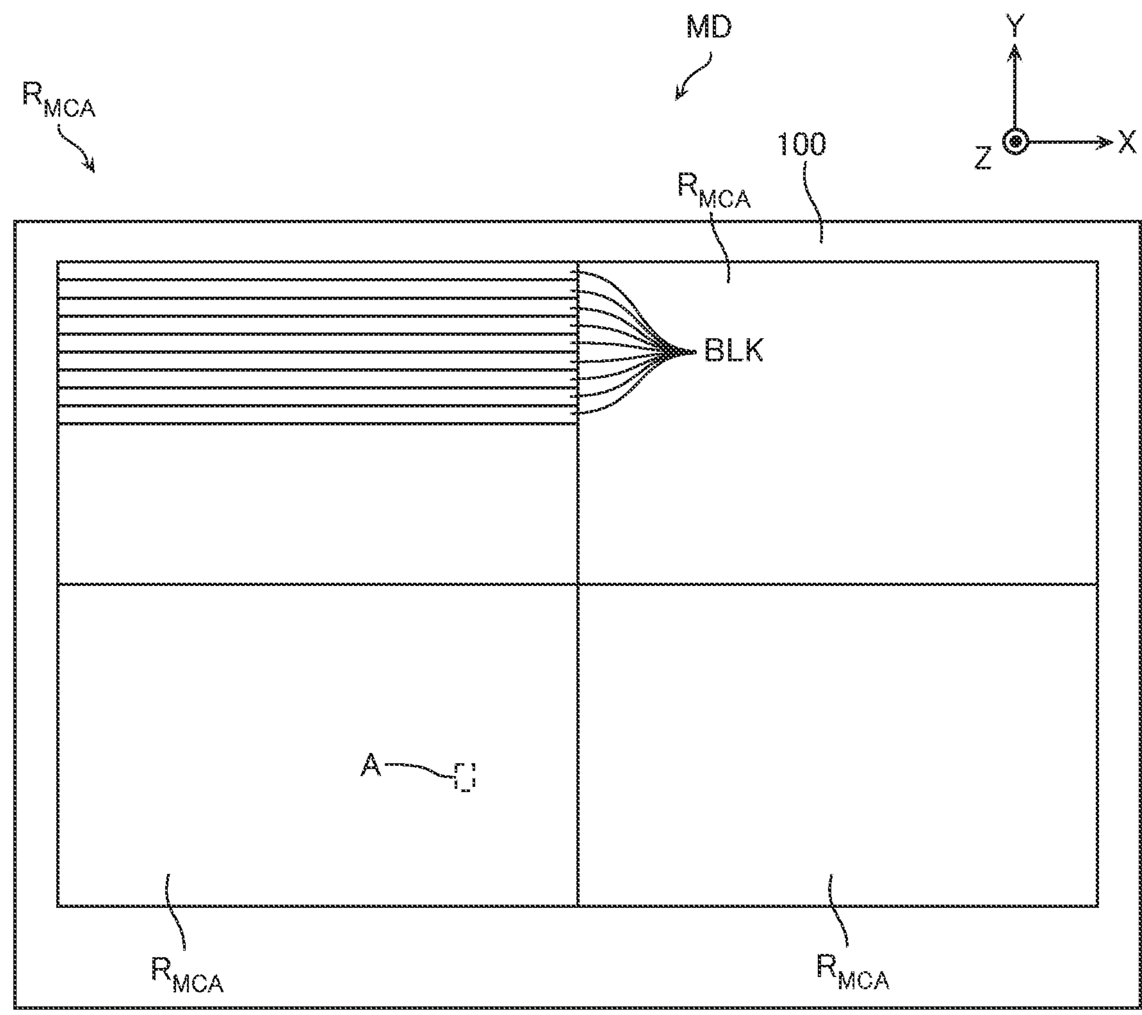
FIG. 10 is a schematic plan view of the memory die MD.
Figure 11:
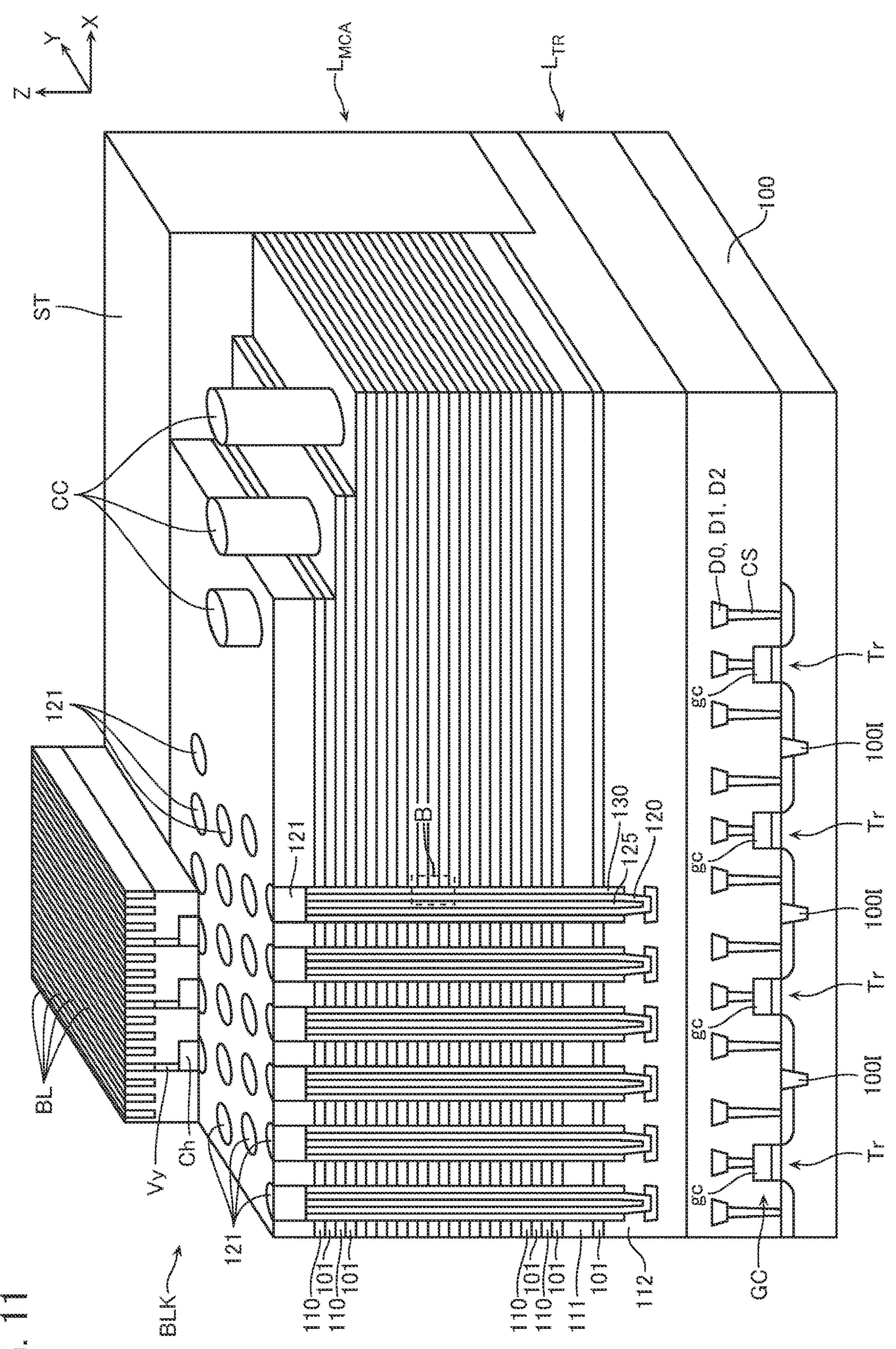
FIG. 11 is a schematic perspective view of the memory die MD.
Figure 12:
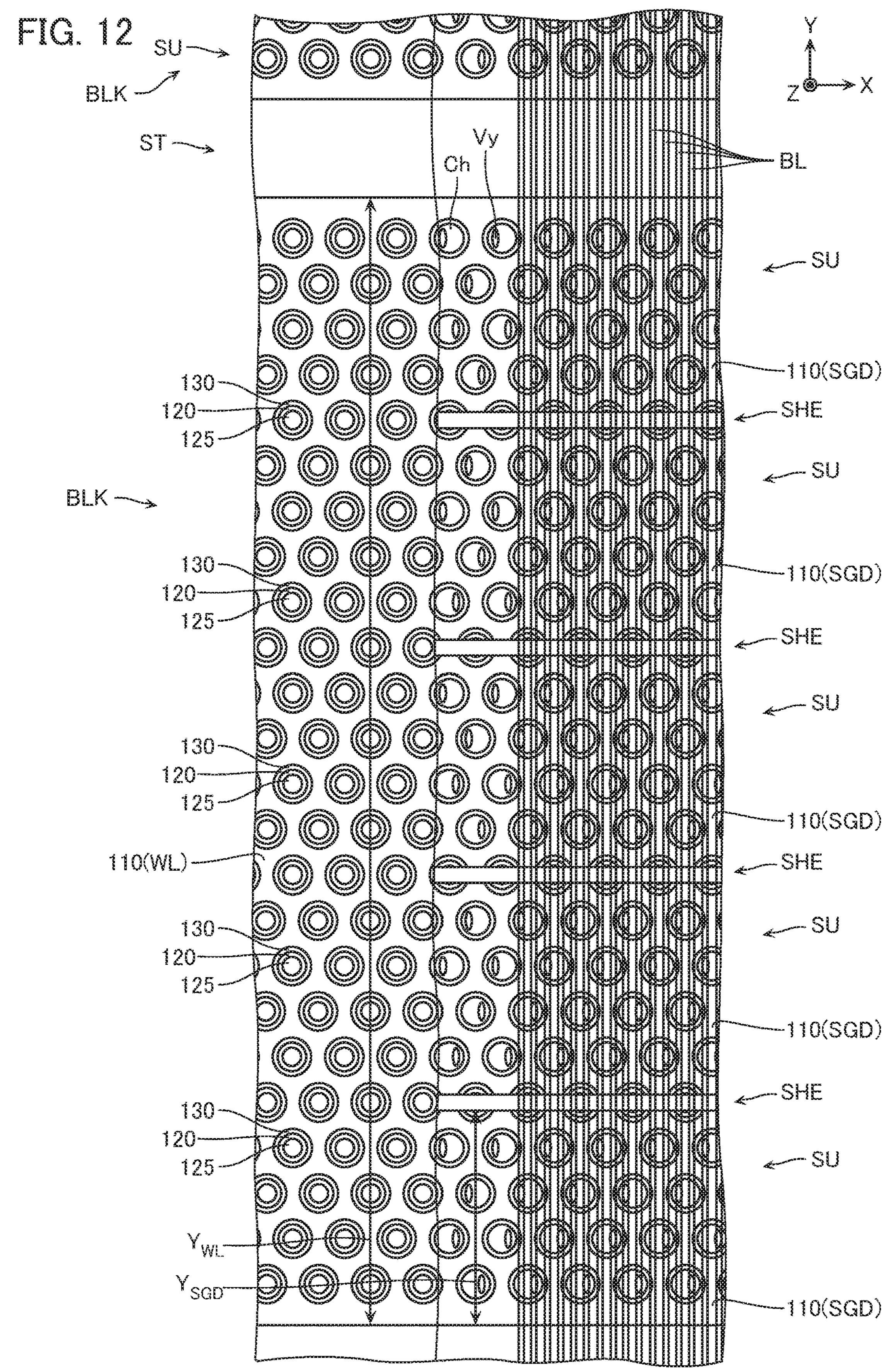
FIG. 12 is a schematic enlarged view of a part indicated by A in FIG. 10.
Figure 13:
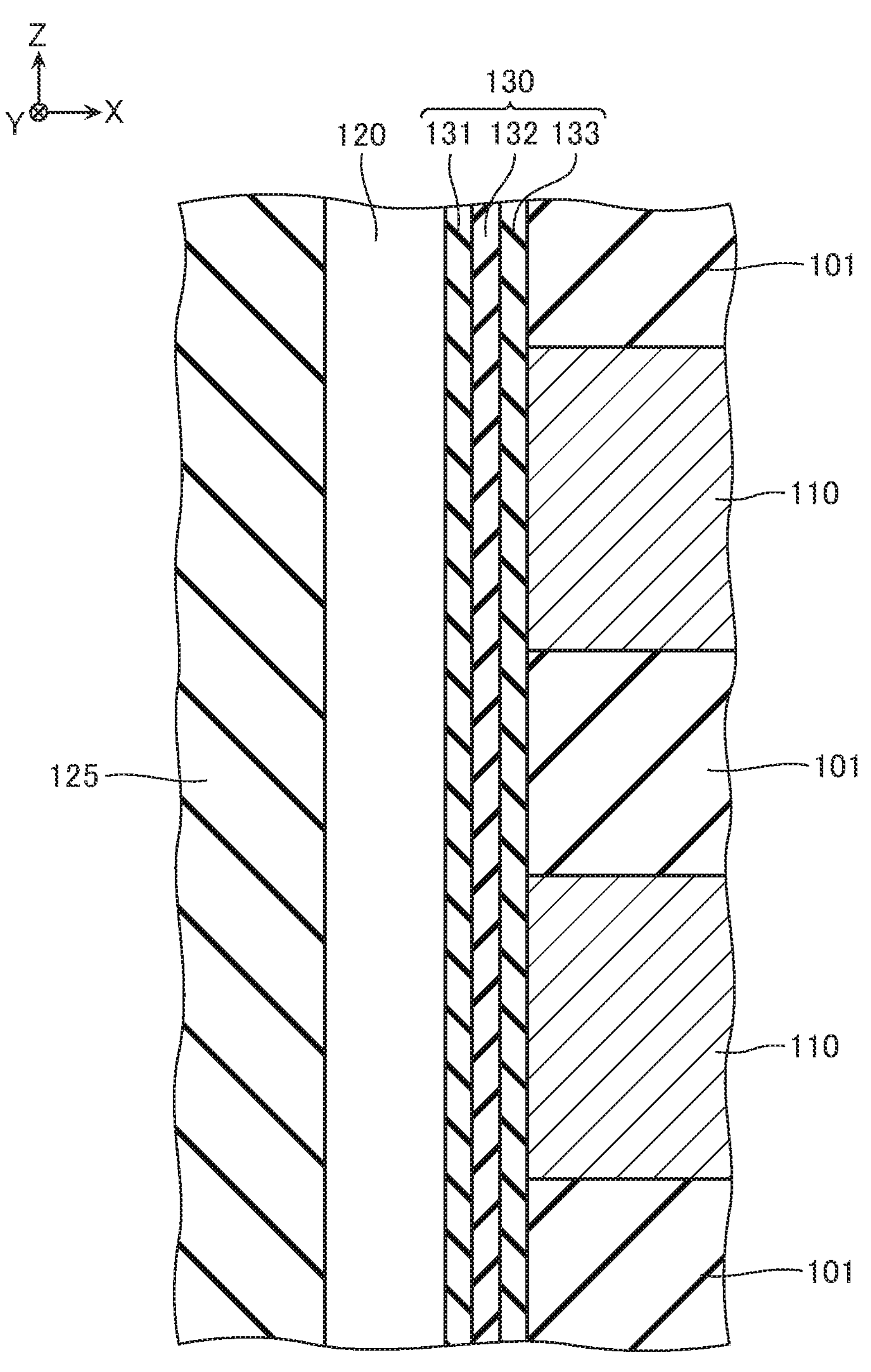
FIG. 13 is a schematic enlarged view of a part indicated by B in FIG. 11.

FIG. 10 is a schematic plan view of the memory die MD. FIG. 11 is a schematic perspective view of a part of the memory die MD. FIG. 11 is a drawing for describing the schematic configuration of the memory die MD, and does not indicate the specific number, shapes, arrangement, and the like of components. FIG. 12 is a schematic enlarged view of a part indicated by A in FIG. 10. FIG. 13 is a schematic enlarged view of a part indicated by B in FIG. 11.

For example, as illustrated in FIG. 10, the memory die MD includes a semiconductor substrate 100. In the illustrated example, the semiconductor substrate 100 includes four memory cell array regions $R_{MCA}$ arranged in the X-direction and the Y-direction. In each of the four memory cell array regions $R_{MCA}$, the memory cell array MCA, the row decoder RD, the sense amplifier module SAM, the voltage generation circuit VG, and the like mentioned above may be disposed.

For example, as illustrated in FIG. 11, the memory die MD includes the semiconductor substrate 100, a transistor layer $L_{TR}$ disposed above the semiconductor substrate 100, a memory cell array layer $L_{MCA}$ disposed above the transistor layer $L_{TR}$, and a wiring layer (not illustrated) disposed above the memory cell array layer $L_{MCA}$.

[Structure of Semiconductor Substrate 100]

For example, the semiconductor substrate 100 is formed of a P-type silicon (Si) containing P-type impurities, such as boron (B). On a surface of the semiconductor substrate 100, an N-type well region containing N-type impurities, such as phosphorous (P), a P-type well region containing P-type impurities, such as boron (B), a semiconductor substrate region in which the N-type well region or the P-type well region is not disposed, and an insulating region 1001 are disposed.

[Structure of Transistor Layer $L_{TR}$]

For example, as illustrated in FIG. 11, a wiring layer GC is disposed above an upper surface of the semiconductor substrate 100 via the insulating layer. The wiring layer GC includes a plurality of electrodes gc opposed to the surface of the semiconductor substrate 100. These respective plurality of electrodes gc function as gate electrodes of a plurality of transistors Tr, electrodes of a plurality of capacitors, or the like constituting the peripheral circuit PC. These plurality of electrodes gc are connected to respective contacts CS. The contact CS may include, for example, a stacked film of a barrier conductive film, such as titanium nitride (TiN), and a metal film, such as tungsten (W). These plurality of contacts CS are connected to a plurality of wirings included in wiring layers D0, D1, and D2. Each of these plurality of wirings may include, for example, a stacked film of a barrier conductive film, such as titanium nitride (TiN), and a metal film, such as tungsten (W).

[Structure of Memory Cell Array Layer $L_{MCA}$]

For example, as illustrated in FIG. 10, the memory cell array layer $L_{MCA}$ includes a plurality of memory blocks BLK arranged in the Y-direction. The memory block BLK includes, for example, as illustrated in FIG. 12, a plurality of string units SU arranged in the Y-direction. Between the two memory blocks BLK mutually adjacent in the Y-direction, an inter-block insulating layer ST of silicon oxide ($SiO_2$) or the like is disposed. For example, as illustrated in FIG. 12, between the two string units SU mutually adjacent in the Y-direction, an inter-string unit insulating layer SHE of silicon oxide ($SiO_2$) or the like is disposed.

For example, as illustrated in FIG. 11, the memory block BLK includes a plurality of conductive layers 110 arranged in the Z-direction, a plurality of semiconductor pillars 120 extending in the Z-direction, and a plurality of gate insulating films 130 disposed between the plurality of conductive layers 110 and the respective plurality of semiconductor pillars 120.

The conductive layer 110 is an approximately plate-shaped conductive layer extending in the X-direction. The conductive layer 110 may include a stacked film of a barrier conductive film, such as titanium nitride (TiN), and a metal film, such as tungsten (W), or the like. For example, the conductive layer 110 may contain polycrystalline silicon containing impurities, such as phosphorous (P) or boron (B), or the like. Between the respective adjacent conductive layers 110 arranged in the Z-direction, insulating layers 101 of silicon oxide ($SiO_2$) or the like are disposed. A contact electrode CC extending in the Z-direction is disposed in one end portion in the X-direction of the conductive layer 110.

A conductive layer 111 is disposed below the conductive layer 110, for example, as illustrated in FIG. 11. For example, the conductive layer 111 may contain polycrystalline silicon containing impurities, such as phosphorous (P) or boron (B). Between the conductive layer 111 and the conductive layer 110, an insulating layer 101 is disposed.

A conductive layer 112 is disposed below the conductive layer 111. The conductive layer 112 may contain, for example, polycrystalline silicon containing impurities, such as phosphorous (P) or boron (B). The conductive layer 112 may include, for example, a conductive layer of a metal, such as tungsten (W), tungsten silicide, or the like or another conductive layer. Between the conductive layer 112 and the conductive layer 111, an insulating layer 101 is disposed.

The conductive layer 112 functions as the source line SL (FIG. 5). The conductive layer 112 is, for example, disposed in common between all of the memory blocks BLK included in the memory cell array region $R_{MCA}$ (FIG. 10).

The conductive layer 111 functions as the source-side select gate line SGSb (FIG. 5) and gate electrodes of the plurality of source-side select transistors STSb connected thereto. The conductive layer 111 is electrically independent for each memory block BLK.

Among the plurality of conductive layers 110, one or the plurality of conductive layers 110 positioned at the lowermost layer function as the source-side select gate line SGS (FIG. 5) and gate electrodes of the plurality of source-side select transistors STS connected thereto. These plurality of conductive layers 110 are electrically independent for each memory block BLK.

The plurality of conductive layers 110 positioned above these conductive layers 110 function as the word lines WL (FIG. 5) and the gate electrodes of the plurality of memory cells MC (FIG. 5) connected thereto. These plurality of conductive layers 110 are electrically independent for each memory block BLK.

One or the plurality of conductive layers 110 positioned above these conductive layers 110 function as the drain-side select gate line SGD and gate electrodes of the plurality of drain-side select transistors STD (FIG. 5) connected thereto. These plurality of conductive layers 110 have widths $Y_{SGD}$ in the Y-direction smaller than width $Y_{WL}$ in the Y-direction of the other conductive layers 110, for example, as illustrated in FIG. 12. Between the two conductive layers 110 adjacent in the Y-direction, the above-described inter-string unit insulating layer SHE is disposed, for example, as illustrated in FIG. 12. These plurality of conductive layers 110 are electrically independent for each string unit SU.

For example, as illustrated in FIG. 12, the semiconductor pillars 120 are arranged in a predetermined pattern in the X-direction and the Y-direction. The semiconductor pillars 120 function as channel regions of the plurality of memory cells MC and the select transistors (STD, STS, STSb) included in one memory string MS (FIG. 5). The semiconductor pillar 120 is, for example, a semiconductor layer of polycrystalline silicon (Si) or the like. The semiconductor pillar 120 has, for example, as illustrated in FIG. 11, an approximately cylindrical shape and includes an insulating layer 125 of silicon oxide or the like at its center part.

The semiconductor pillars 120 have outer peripheral surfaces each surrounded by the plurality of conductive layers 110 and the conductive layer 111 and opposed to these plurality of conductive layers 110 and the conductive layer 111. The semiconductor pillar 120 has a lower end connected to the conductive layer 112. The semiconductor pillar 120 has an upper end connected to the bit line BL via an impurity region 121 including N-type impurities such as phosphorous (P), and contacts Ch, Vy. The bit lines BL extend in the Y-direction and are arranged in the X-direction.

The gate insulating film 130 has an approximately cylindrical shape that covers the outer peripheral surface of the semiconductor pillar 120. For example, as illustrated in FIG. 13, the gate insulating film 130 includes a tunnel insulating film 131, an electric charge accumulating film 132, and a block insulating film 133, which are stacked between the semiconductor pillar 120 and the conductive layers 110. The tunnel insulating film 131 and the block insulating film 133 are, for example, insulating films of silicon oxide ($SiO_2$) or the like. The electric charge accumulating film 132 is, for example, a film of silicon nitride ($Si_3N_4$) or the like that can accumulate an electric charge. The tunnel insulating film 131, the electric charge accumulating film 132, and the block insulating film 133, which have approximately cylindrical shapes, extend in the Z-direction along the outer peripheral surface of the semiconductor pillar 120 excluding a contact portion of the semiconductor pillar 120 and the conductive layer 112.

FIG. 13 illustrates an example in which the gate insulating film 130 includes the electric charge accumulating film 132 of silicon nitride or the like. However, the gate insulating film 130 may include, for example, a floating gate of polycrystalline silicon containing N-type or P-type impurities or the like.

[Threshold Voltage of Memory Cell MC]

Next, the threshold voltage of the memory cell MC will be described with reference to FIG. 14A, FIG. 14B, and FIG. 14C.

FIG. 14A is a schematic histogram for describing the threshold voltage of the memory cell MC that stores 3-bit data. The horizontal axis indicates the voltage of the word line WL, and the vertical axis indicates the number of the memory cells MC. FIG. 14B is a table illustrating an exemplary relation between the threshold voltage of the memory cell MC that stores the 3-bit data and the stored data. FIG. 14C is a table illustrating another exemplary relation between the threshold voltage of the memory cell MC that stores the 3-bit data and the stored data.

In the example of FIG. 14A, the threshold voltages of the memory cells MC are controlled in states of eight patterns. The threshold voltage of the memory cell MC controlled in a state Er is smaller than an erase verify voltage $V_{VFYEr}$. For example, the threshold voltage of the memory cell MC controlled in a state A is larger than a verify voltage $V_{VFYA}$ and smaller than a verify voltage $V_{VFYB}$. Additionally, for example, the threshold voltage of the memory cell MC controlled in a state B is larger than the verify voltage $V_{VFYB}$ and smaller than a verify voltage $V_{VFYC}$. Hereinafter, similarly, the threshold voltages of the memory cells MC controlled in a state C to a state F are larger than the verify voltage $V_{VFYC}$ to a verify voltage $V_{VFYF}$ and smaller than a verify voltage $V_{VFYD}$ to a verify voltage $V_{VFYG}$, respectively. For example, the threshold voltage of the memory cell MC controlled in a state G is larger than the verify voltage $V_{VFYG}$ and smaller than a read pass voltage $V_{READ}$.

In the example in FIG. 14A, a read voltage $V_{CGAR}$ is set between a threshold distribution corresponding to the state Er and a threshold distribution corresponding to the state A. A read voltage $V_{CGBR}$ is set between the threshold distribution corresponding to the state A and a threshold distribution corresponding to the state B. The same applies to the following, and a read voltage $V_{CGCR}$ to a read voltage $V_{CGGR}$ are respectively set between the threshold distribution corresponding to the state B and a threshold distribution corresponding to the state C to between a threshold distribution corresponding to the state F and a threshold distribution corresponding to the state G.

For example, the state Er corresponds to the lowest threshold voltage. The memory cell MC of the state Er is, for example, the memory cell MC in an erase state. For example, data "111" is assigned to the memory cell MC of the state Er.

The state A corresponds to the threshold voltage higher than the threshold voltage corresponding to the state Er. For example, data "101" is assigned to the memory cell MC of the state A.

The state B corresponds to the threshold voltage higher than the threshold voltage corresponding to the state A. For example, data "001" is assigned to the memory cell MC of the state B.

Hereinafter, similarly, the state C to the state G in the drawing correspond to threshold voltages higher than threshold voltages corresponding to the state B to the state F. For example, data "011", "010", "110", "100", and "000" are assigned to the memory cells MC of these states.

In the case of the assignment as exemplified in FIG. 14B, the data of a low-order bit is distinguishable with one read voltage $V_{CGDR}$. The data of a middle-order bit is distinguishable with three read voltages $V_{CGAR}$, $V_{CGCR}$, $V_{CGFR}$. The data of a high-order bit is distinguishable with three read voltages $V_{CGBR}$, $V_{CGER}$, $V_{CGGR}$.

The number of bits of the data stored in the memory cell MC, the number of states, the assignment of the data to each state, and the like are changeable as necessary.

For example, in the case of the assignment as exemplified in FIG. 14C, the data of the low-order bit is distinguishable with one read voltage $V_{CGDR}$. The data of the middle-order bit is distinguishable with the two read voltages $V_{CGBR}$, $V_{CGFR}$. The data of the high-order bit is distinguishable with the four read voltages $V_{CGAR}$, $V_{CGCR}$, $V_{CGER}$, $V_{CGGR}$.

[Read Operation]

Next, the read operation of the semiconductor memory device according to this embodiment will be described.

Figure 15:
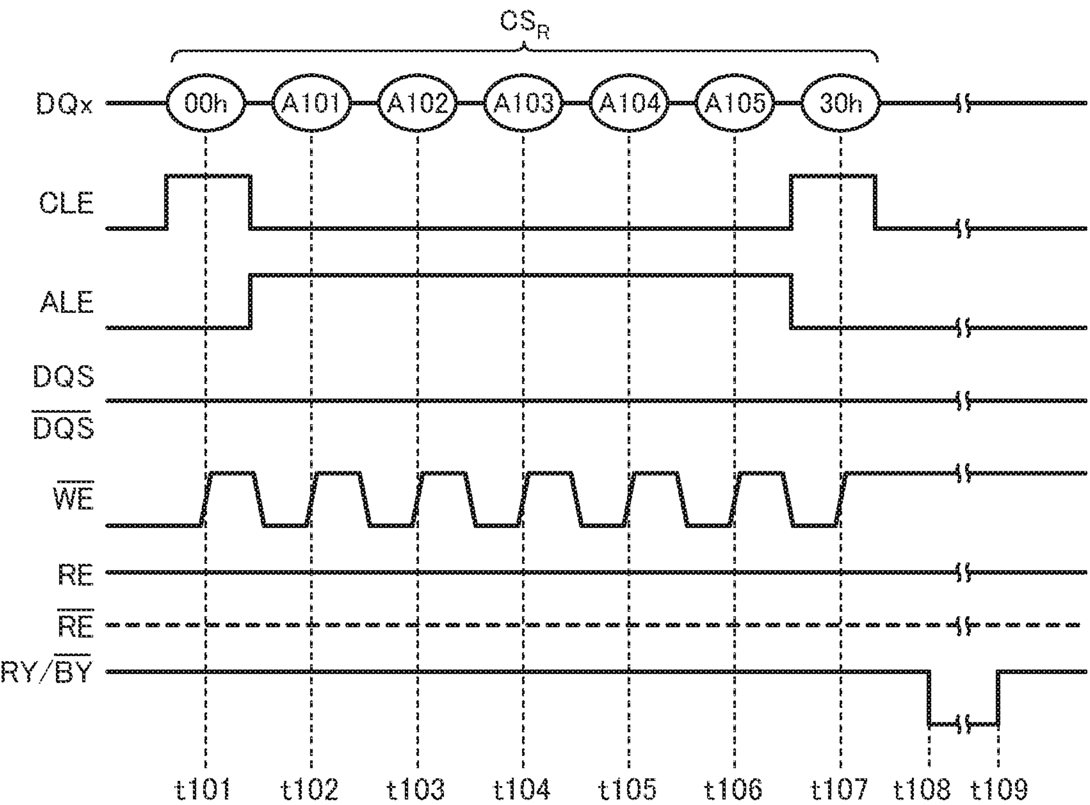
FIG. 15 is a timing chart for describing a read operation.

FIG. 15 is a timing chart for describing the read operation.

FIG. 15 illustrates an example of a command set $CS_R$ input to the memory die MD in the read operation. This command set $CS_R$ includes data 00*h*, A101, A102, A103, A104, and A105, and data 30*h*.

At timing t101, the controller die CD inputs the data 00*h* to the memory die MD as command data $D_{CMD}$. That is, the voltages of the data signal input/output terminals DQ0 to DQ7 are set to "H" or "L" according to the respective bits of the data 00*h*, "H" is input to the external control terminal CLE, "L" is input to the external control terminal ALE, and the external control terminal /WE is raised from "L" to "H" in this state. The data 00*h* is a command input at the start of the read operation.

At timing t102, the controller die CD inputs the data A101 to the memory die MD as address data $D_{ADD}$. That is, the voltages of the data signal input/output terminals DQ0 to DQ7 are set to "H" or "L" according to the respective bits of the data A101, "L" is input to the external control terminal CLE, "H" is input to the external control terminal ALE, and the external control terminal /WE is raised from "L" to "H" in this state. The data A101 is a part of the column address CA.

At timing t103, the controller die CD inputs the data A102 to the memory die MD as the address data $D_{ADD}$. The data A102 is a part of the column address CA.

At timing t104, the controller die CD inputs the data A103 to the memory die MD as the address data $D_{ADD}$. The data A103 is a part of the row address RA. The data A103 includes, for example, a block address and a page address.

The block address is data to identify the memory block BLK (FIG. 5). The page address is data to identify the string unit SU and the word line WL.

At timing t105, the controller die CD inputs the data A104 to the memory die MD as the address data $D_{ADD}$. The data A104 is a part of the row address RA. The data A104 includes, for example, the block address and the page address.

At timing t106, the controller die CD inputs the data A105 to the memory die MD as the address data $D_{ADD}$. The data A105 includes a chip address. The chip address is data to identify one memory die MD from the plurality of memory dies MD controlled by the controller die CD.

At timing t107, the controller die CD inputs the data 30*h* to the memory die MD as the command data $D_{CMD}$. The data 30*h* is a command indicative of the termination of the input of the command set $CS_R$ regarding the read operation.

At timing t108, the voltage of the terminal RY//BY turns to the "L" state from the "H" state and an access to the memory die MD is inhibited. The read operation is performed in the memory die MD.

At timing t109, the read operation in the memory die MD terminates. Additionally, the voltage of the terminal RY//BY turns to the "H" state from the "L" state and the access to the memory die MD is permitted.

Figure 16:
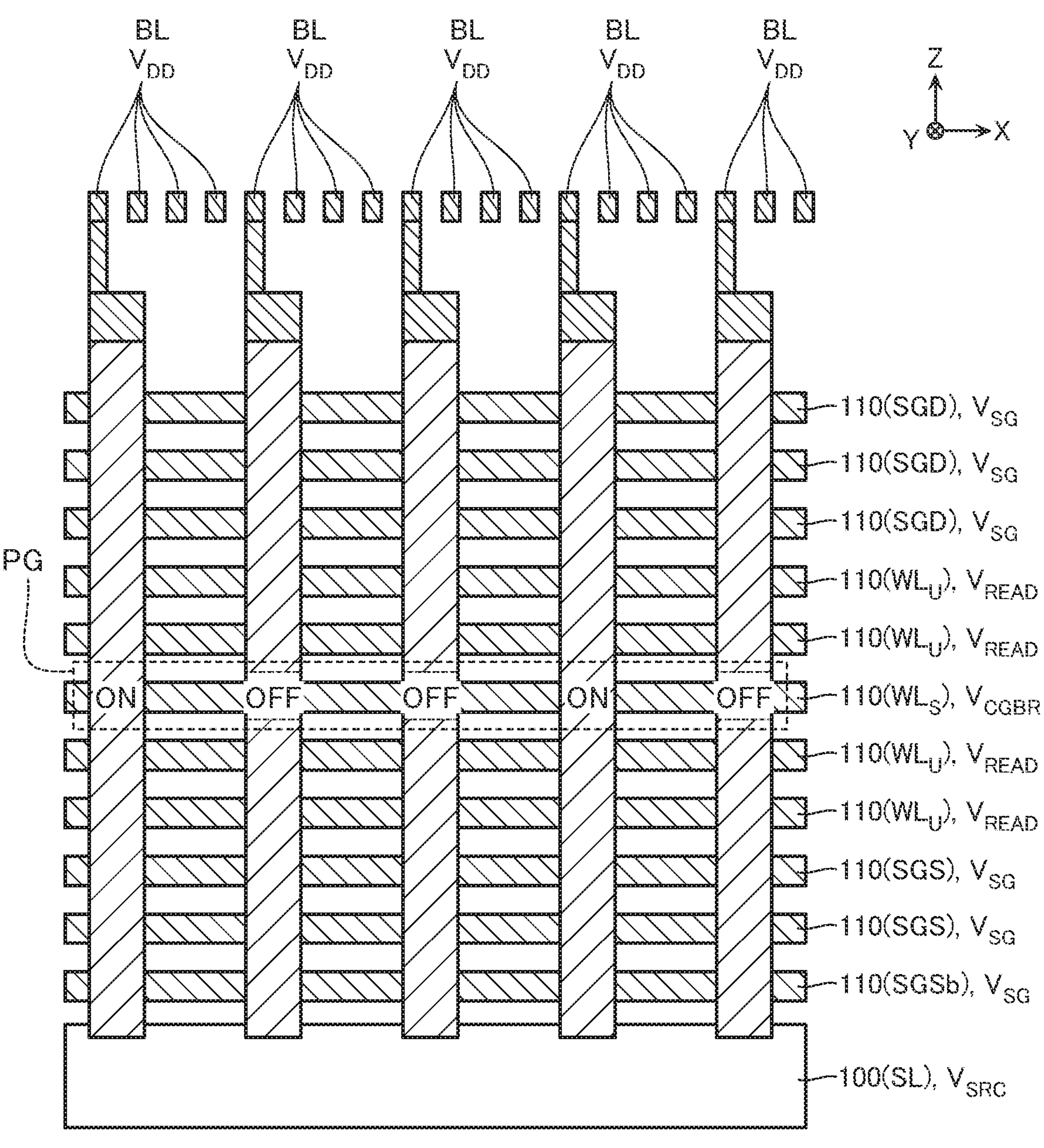
FIG. 16 is a schematic cross-sectional view for describing the read operation.
Figure 17:
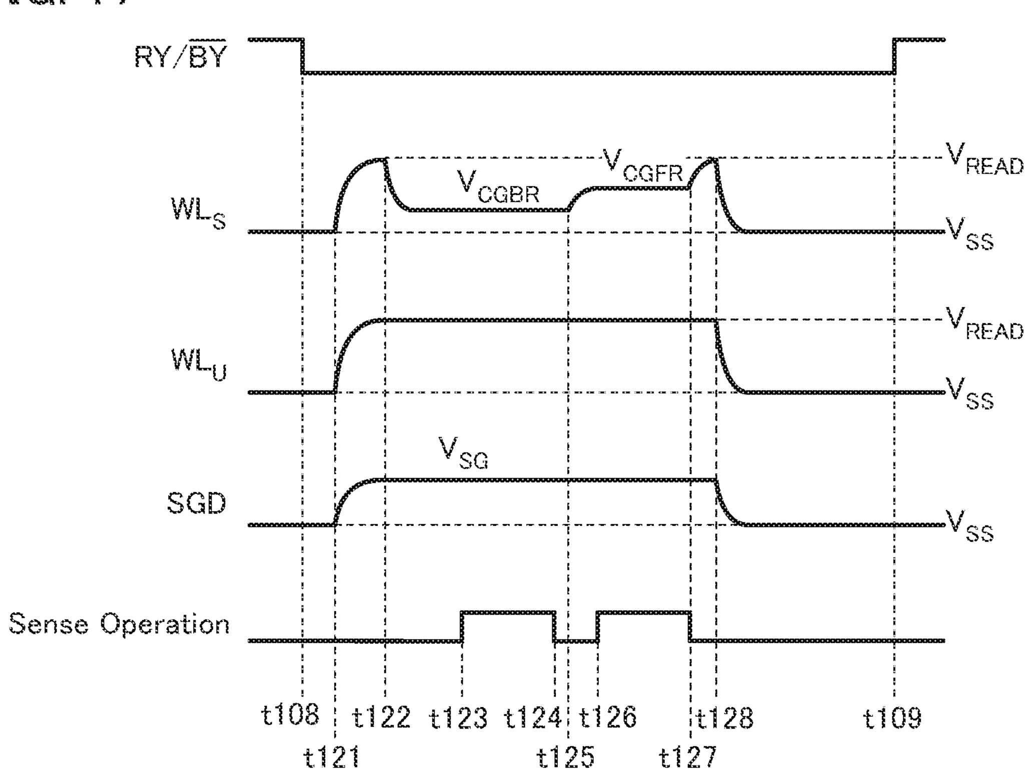
FIG. 17 is a timing chart for describing the read operation.

FIG. 16 is a schematic cross-sectional view for describing the read operation. FIG. 17 is a timing chart for describing the read operation. In the following description, an example in which each of memory cells MC stores data of a plurality of bits, and a plurality of read voltages are used in the read operation.

Unless otherwise described, only a drain-side select gate line SGD corresponding to the string unit SU that is a target of the operation will be explained. In the following description, the word line WL that is a target of the operation may be referred to as "selected word line $WL_S$" and the word line WL other than the target of the operation may be referred to as "unselected word line $WL_U$". In the following description, an example where the read operation is performed on the memory cell MC connected to the selected word line $WL_S$ (hereinafter sometimes referred to as "selected memory cell MC") among the plurality of memory cells MC included in the string unit SU as a target of the operation will be described. In the following description, the configuration including such a plurality of selected memory cells MC may be referred to as a selected page PG.

For example, as illustrated in FIG. 17, at timing t121 in the read operation, the selected word line $WL_S$ and the unselected word lines $WL_U$ are applied with the read pass voltage $V_{READ}$, and all of the memory cells MC are turned to the ON state. The select gate lines (SGD, SGS, SGSb) are applied with the voltage $V_{SG}$. The voltage $V_{SG}$ has a magnitude enough to form electron channels in the channel regions of the select transistors (STD, STS, STSb), thereby causing the select transistors (STD, STS, STSb) to be in the ON state.

At timing t122 in the read operation, the selected word line $WL_S$ is applied with a certain read voltage $V_{CGR}$. The certain read voltage is $V_{CGR}$ one of the read voltages $V_{CGAR}$–$V_{CGGR}$ described with reference to FIG. 14A to FIG. 14C. Accordingly, for example, as illustrated in FIG. 16, a part of the selected memory cells MC are turned to the ON state, and the other selected memory cells MC are turned to the OFF state.

At timing t122, for example, the bit lines BL are charged.

From timing t123 to timing t124 in the read operation, for example, as illustrated in FIG. 17, a sense operation is performed. That is, the ON/OFF state of the memory cell MC is detected by the sense amplifier module SAM (FIG. 4), and data indicating the state of this memory cell MC is obtained.

Figure 14:
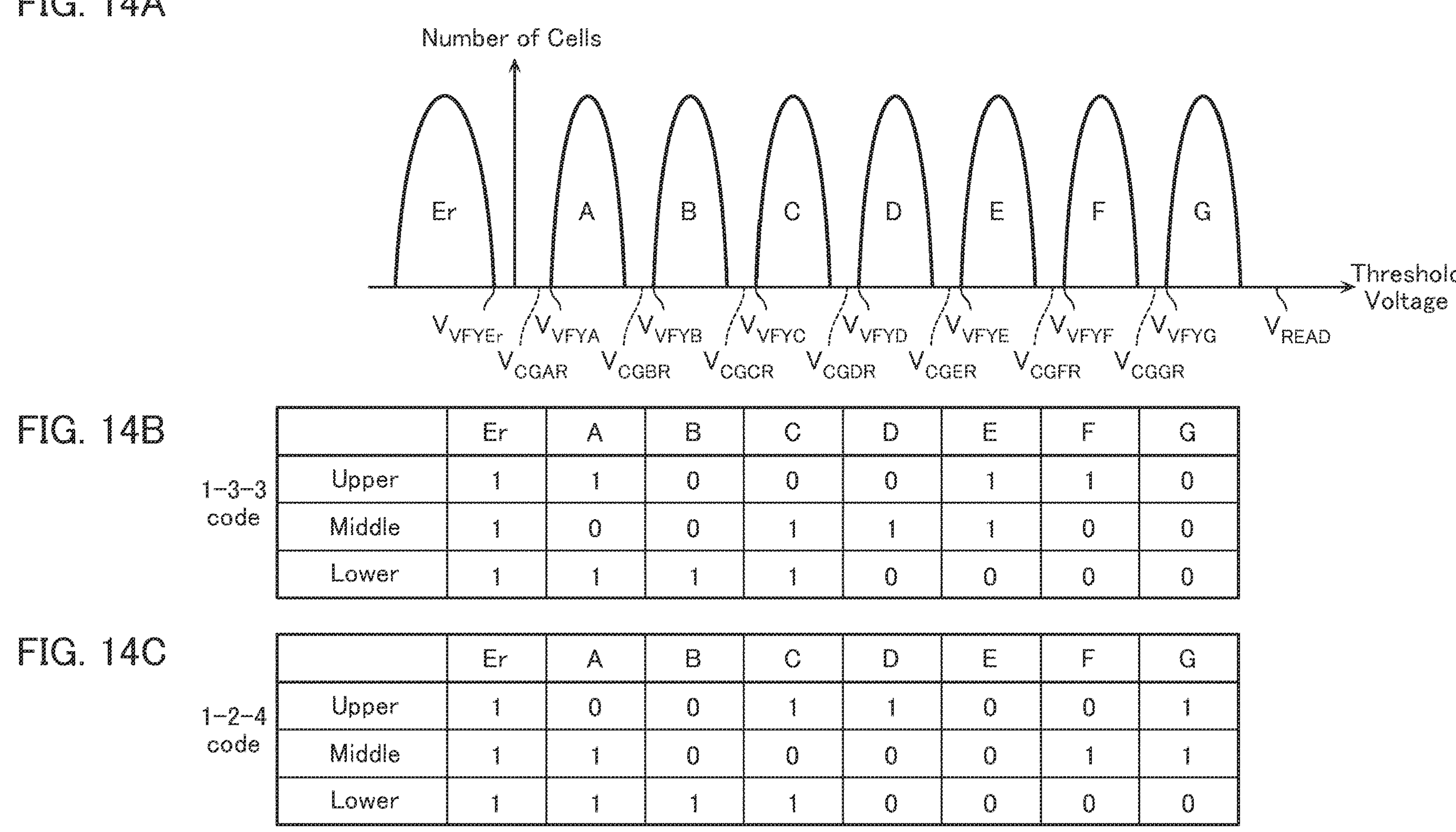
FIG. 14A is a schematic histogram for describing a threshold voltage of a memory cell MC that stores 3-bit data.
FIG. 14B is a table illustrating an exemplary relation between the threshold voltage of the memory cell MC that stores the 3-bit data and the stored data.
FIG. 14C is a table illustrating another exemplary relation between the threshold voltage of the memory cell MC that stores the 3-bit data and the stored data.

At timing t125 in the read operation, the selected word line $WL_S$ is applied with another read voltage $V_{CGR}$ (one of the read voltages $V_{CGAR}$–$V_{CGGR}$ described with reference to FIG. 14). Accordingly, a part of the selected memory cells MC is turned to the ON state, and the other selected memory cells MC are turned to the OFF state.

From timing t126 to timing t127 in the read operation, for example, as illustrated in FIG. 17, the sense operation is performed, and the data indicating the state of this memory cell MC is obtained.

At timing t127 in the read operation, the read pass voltage $V_{READ}$ is applied to the selected word line $WL_S$ and the unselected word line $WL_U$, and all of the memory cells MC are turned to the ON state. Additionally, the voltage $V_{SG}$ is applied to the select gate lines (SGD, SGS, SGSb), and the select transistors (STD, STS, STSb) are turned to the ON state.

At timing t128 in the read operation, the ground voltage $V_{SS}$ is applied to the selected word line $WL_S$, the unselected word line $WL_U$, and the select gate lines (SGD, SGS, SGSb).

In the read operation, an arithmetic operation, such as AND and OR, is executed on the data indicating the state of the memory cell MC, thereby calculating the data stored in the memory cell MC.

[Write Operation]

Next, the write operation of the semiconductor memory device according to the embodiment will be described.

Figure 18:
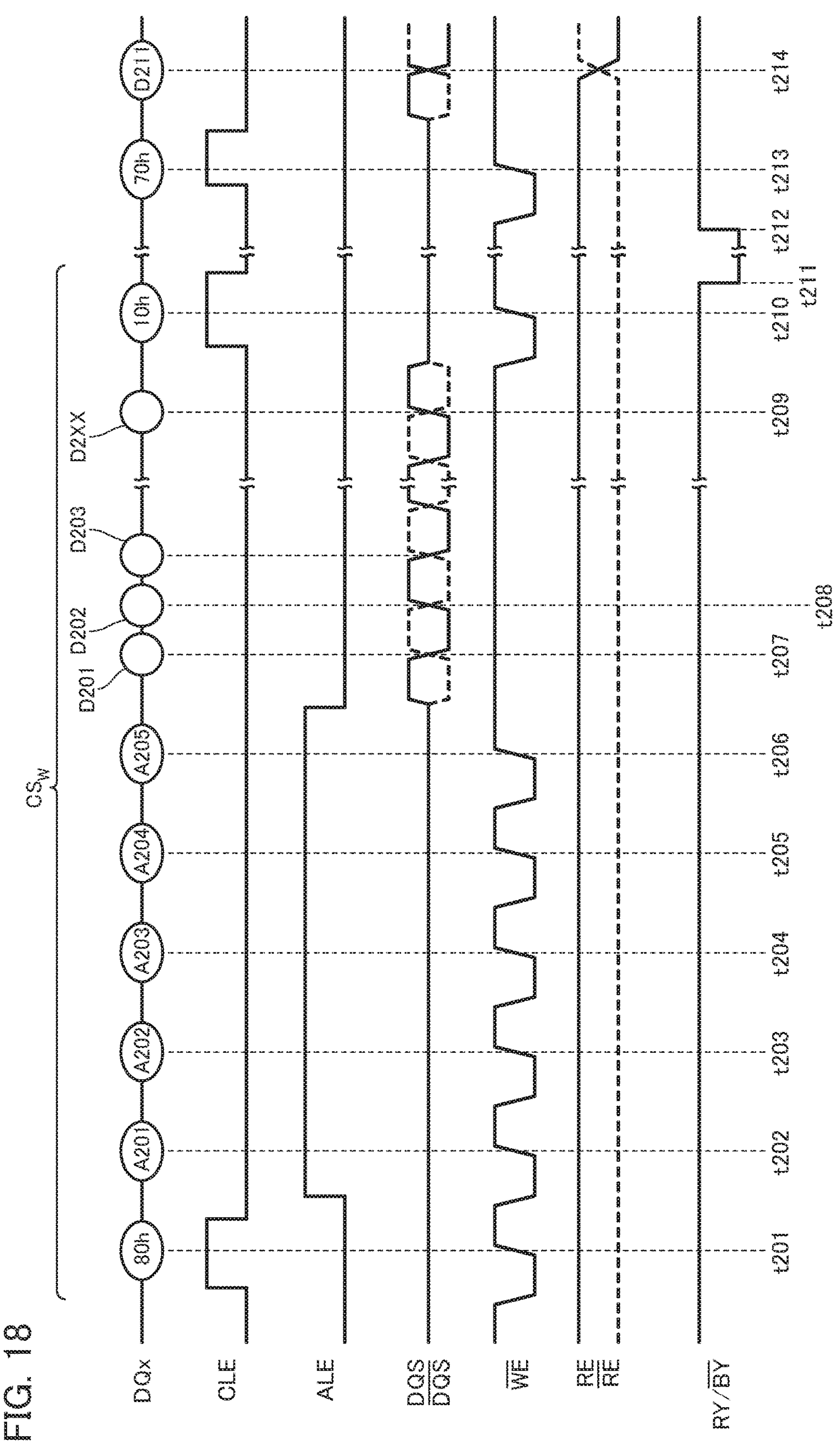
FIG. 18 is a timing chart to describe the write operation.

FIG. 18 is a timing chart to describe the write operation.

FIG. 18 exemplifies a command set $CS_W$ input to the memory die MD in the write operation. This command set $CS_W$ includes data 80*h*, A201, A202, A203, A204, A205, D201, D202 to D2XX and data 10*h*.

At a timing t201, the controller die CD inputs the data 80*h* to the memory die MD as the command data $D_{ADD}$. The data 80*h* is a command input at the start of the write operation.

At a timing t202, the controller die CD inputs the data A201 to the memory die MD as the address data $D_{ADD}$. The data A201 is a part of the column address CA.

At a timing t203, the controller die CD inputs the data A202 to the memory die MD as the address data $D_{ADD}$. The data A202 is a part of the column address CA.

At a timing t204, the controller die CD inputs the data A203 to the memory die MD as the address data $D_{ADD}$. The data A203 is a part of the row address RA. The data A203 includes, for example, a block address and a page address.

At a timing t205, the controller die CD inputs the data A204 to the memory die MD as the address data $D_{ADD}$. The data A204 is a part of the row address RA. The data A204 includes, for example, a block address and a page address.

At a timing t206, the controller die CD inputs the data A205 to the memory die MD as the address data $D_{ADD}$. The data A205 includes, for example, a chip address.

At a timing t207, the controller die CD inputs the data D201 to the memory die MD as the user data. That is, the voltages of the data signal input/output terminals DQ0 to DQ7 are set to "H" or "L" according to the respective bits of the data D201, "L" is input to the external control terminal CLE, "L" is input to the external control terminal ALE, and the input signals of the toggle signal input/output terminals DQS, /DQS are switched (toggled) in this state. The data D201 is eight-bit data among the user data written to the memory cell MC by the write operation.

At a timing t208, the controller die CD inputs the data D202 to the memory die MD as the user data. The data D202 is eight-bit data among the user data written to the memory cell MC by the write operation. Similarly, the controller die CD inputs data as the user data to the memory die MD in units of eights bits after that.

At a timing t209, the controller die CD inputs the data D2XX to the memory die MD as the user data. The data D2XX is eight-bit data among the user data written to the memory cell MC by the write operation.

At a timing t210, the controller die CD inputs the data 10*h* to the memory die MD as the command data $D_{ADD}$. The data 10*h* is a command indicative of the termination of the input of the command set $CS_W$ regarding the write operation.

At a timing t211, the terminal RY//BY enters the "L" state from the "H" state and the access to the memory die MD is inhibited. The write operation is performed in the memory die MD.

At a timing t212, the write operation in the memory die MD terminates. Additionally, the terminal RY//BY enters the "H" state from the "L" state and the access to the memory die MD is permitted.

At a timing t213, the controller die CD inputs, for example, the data 70*h* to the memory die MD as the command data $D_{CMD}$. The data 70*h* is a command that requests an output of status data latched to the status register STR (FIG. 4).

At a timing t214, the controller die CD outputs, for example, the data D211 from the memory die MD. The data D211 is the status data.

Figure 19:
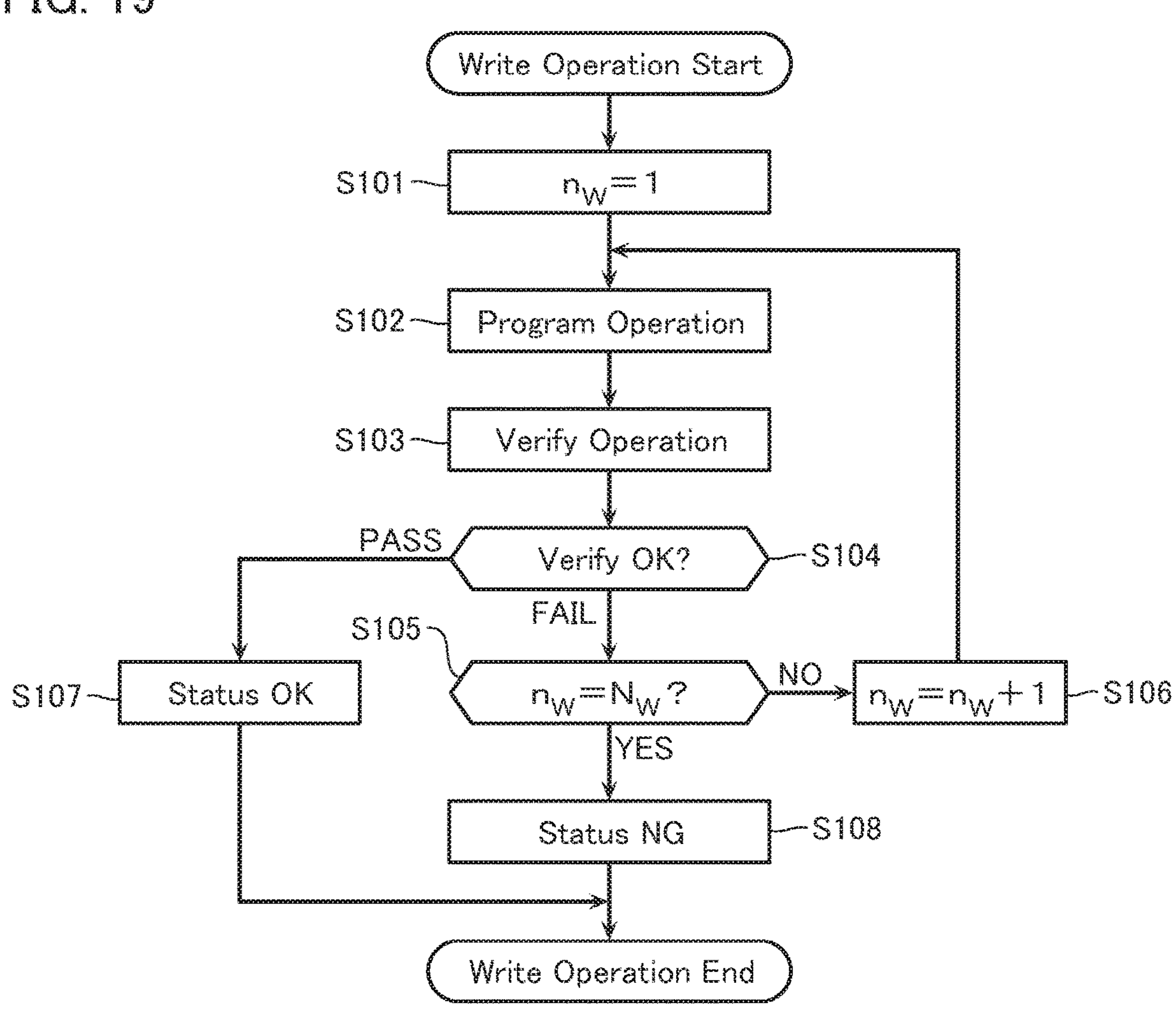
FIG. 19 is a flowchart for describing a write operation.
Figure 20:
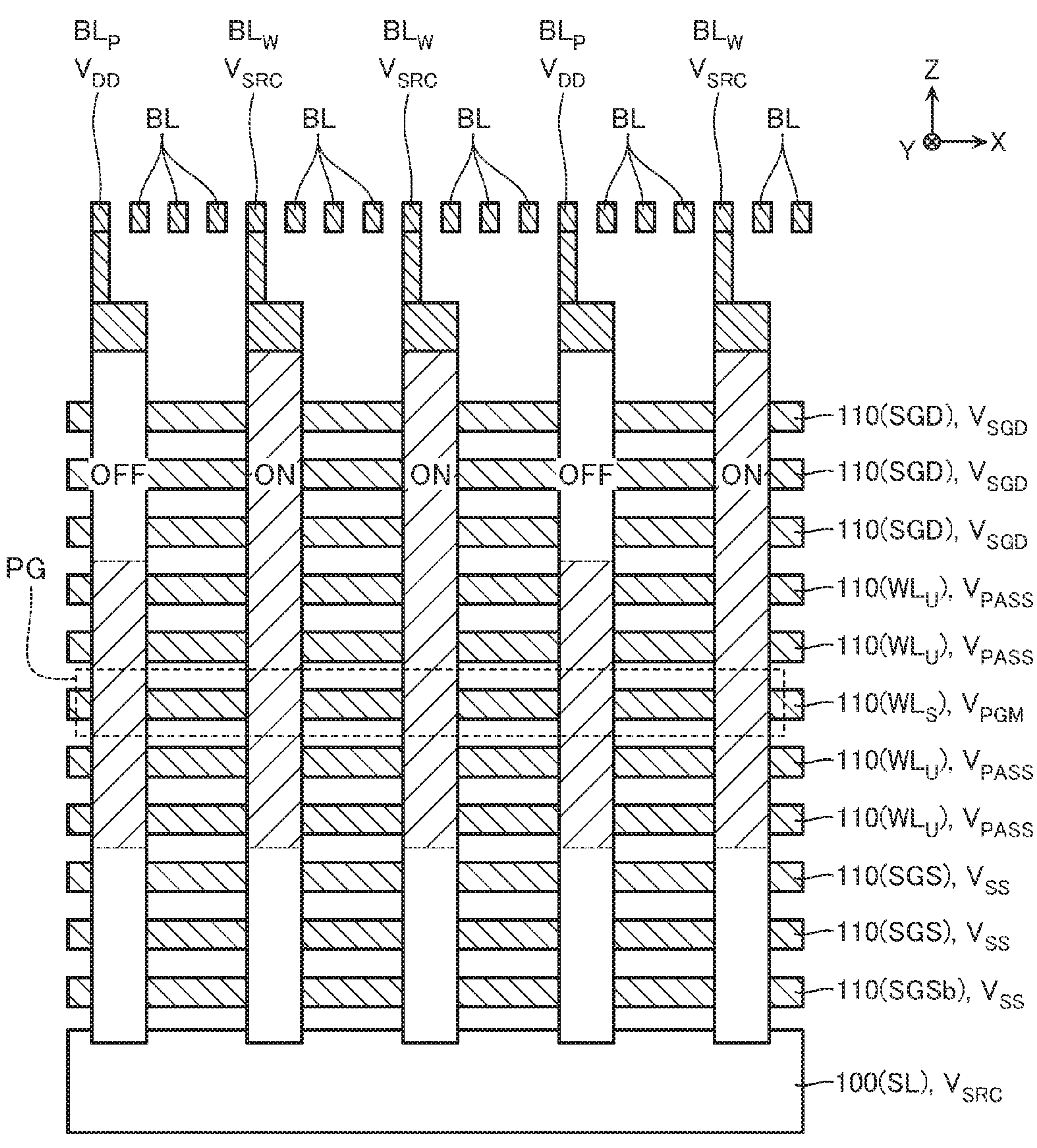
FIG. 20 is a schematic cross-sectional view for describing a program operation included in the write operation.
Figure 21:
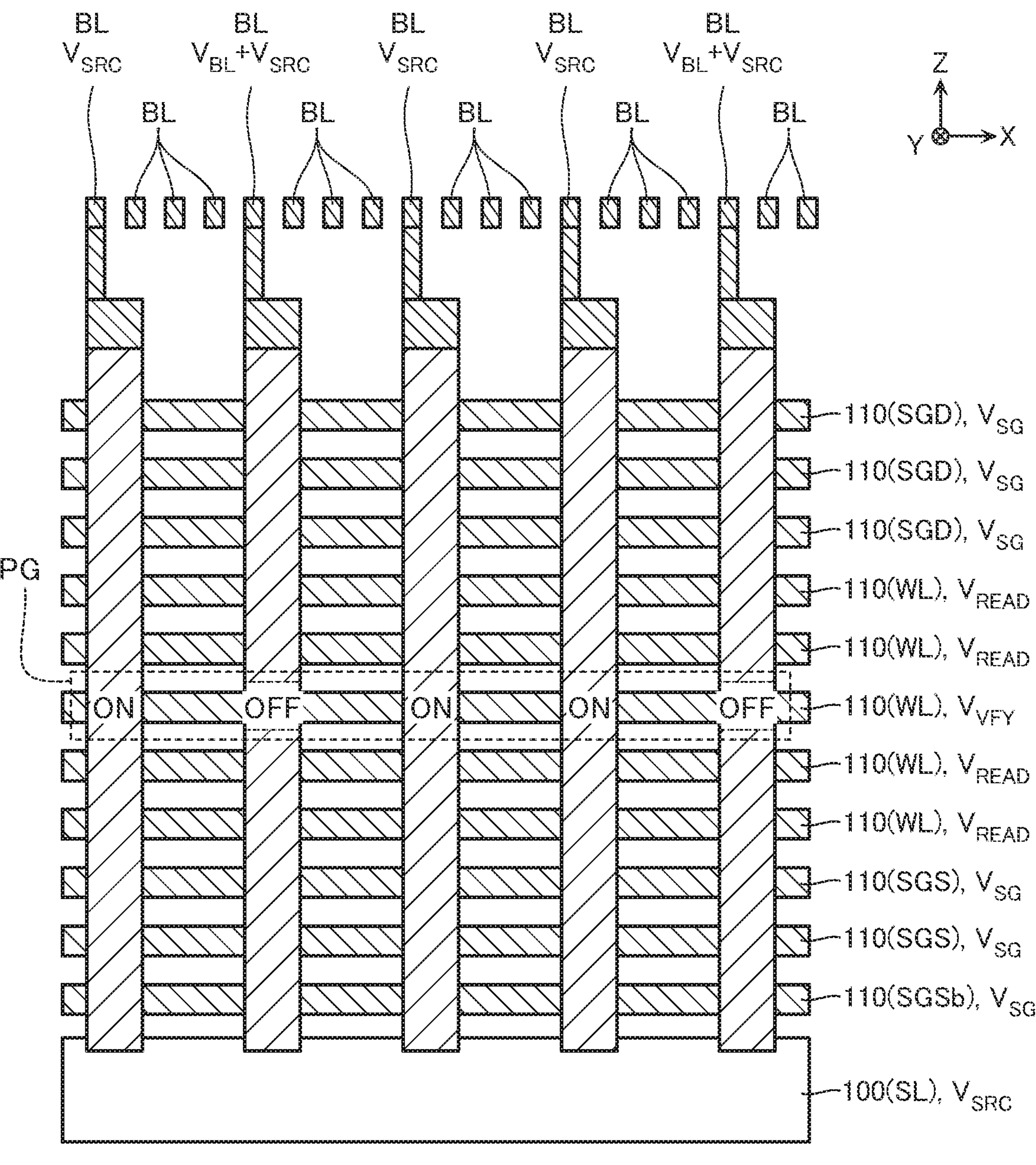
FIG. 21 is a schematic cross-sectional view for describing a verify operation included in the write operation.
Figure 22:
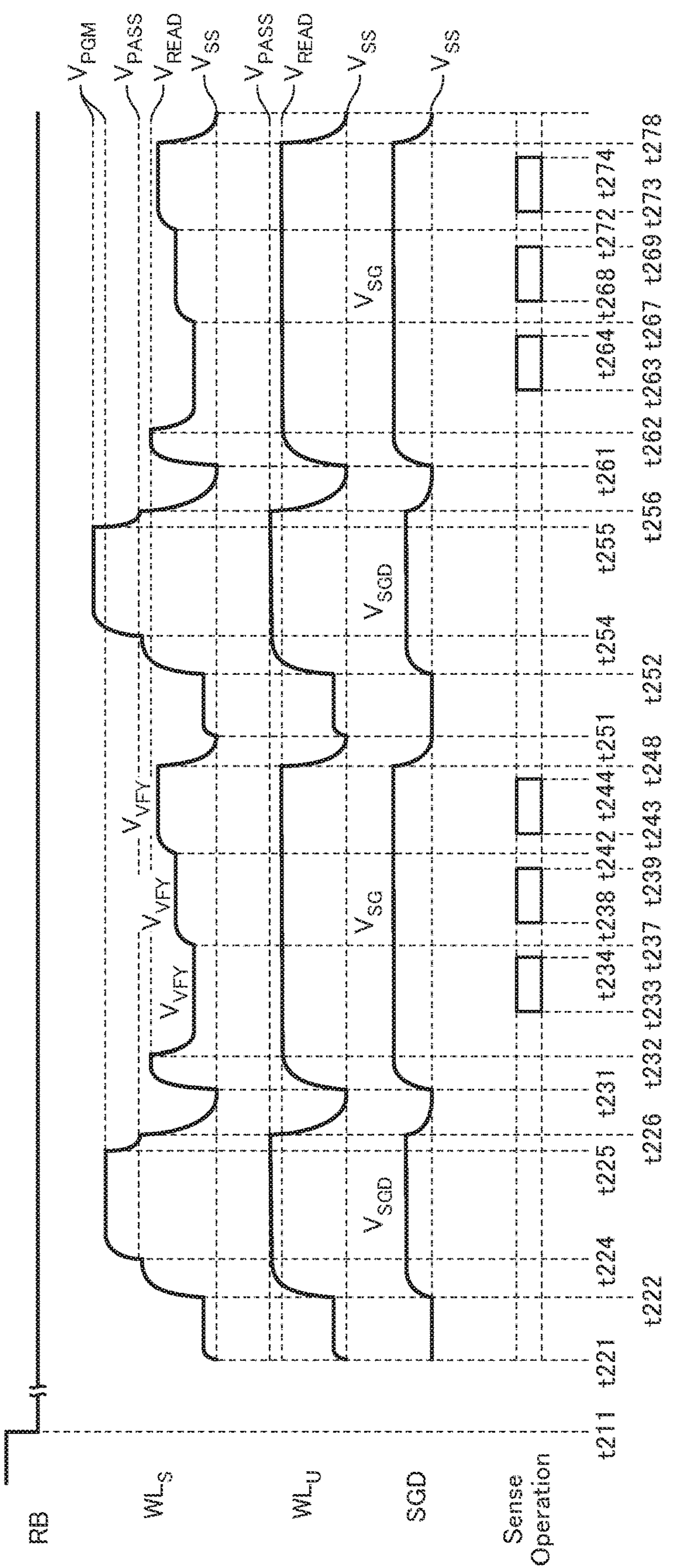
FIG. 22 is a timing chart for describing the write operation.

FIG. 19 is a flowchart for describing the write operation. FIG. 20 is a schematic cross-sectional view for describing a program operation included in the write operation. FIG. 21 is a schematic cross-sectional view for describing a verify operation included in the write operation. FIG. 22 is a timing chart for describing the write operation.

In the following description, an example where the write operation is performed on the plurality of selected memory cells MC corresponding to the selected page PG will be described.

At Step S101, as shown in FIG. 19 for example, a loop count $n_W$ is set to 1. The loop count $n_W$ is a variable indicative of the number of times of the first write loop. This operation is performed at timing t211 in FIG. 22.

At Step S102, the program operation is performed. The program operation is an operation that applies the program voltage to the selected word line $WL_S$ and increases the threshold voltage of the memory cell MC. The operation is performed in a period from timing t221 until timing t226 in FIG. 22.

At timing t221 in the program operation, for example, among the plurality of selected memory cells MC, a voltage $V_{SRC}$ is applied to a bit line $BL_W$ connected to the selected memory cell MC whose threshold voltage is adjusted. Additionally, among the plurality of selected memory cells MC, a voltage $V_{DD}$ is applied to a bit line $BL_P$ connected to the selected memory cell MC whose threshold voltage is not adjusted. Hereinafter, the selected memory cell MC on which the adjustment of the threshold voltage is performed among the plurality of selected memory cells MC is referred to as a "write memory cell MC" and the selected memory cell MC on which the adjustment of the threshold voltage is not performed is referred to as an "inhibited memory cell MC" in some cases.

At timing t222 in the program operation, a write pass voltage $V_{PASS}$ is applied to the selected word line $WL_S$ and the unselected word lines $WL_U$. Additionally, a voltage $V_{SGD}$ is applied to the drain-side select gate line SGD. The write pass voltage $V_{PASS}$ may have similar amplitude to that of the read pass voltage $V_{READ}$, or may be larger than the read pass voltage $V_{READ}$. The voltage $V_{SGD}$ is smaller than the voltage $V_{SG}$, thereby causing the drain-side select transistors STD to be in the ON state or the OFF state in accordance with the voltages of the bit lines BL.

At timing t224 in the program operation, the program voltage $V_{PGM}$ is applied to the selected word line $WL_S$. The program voltage $V_{PGM}$ is larger than the write pass voltage $V_{PASS}$.

Here, as shown in FIG. 20 for example, the voltage $V_{SRC}$ is applied to the channel of the semiconductor pillar 120 connected to the bit line $BL_W$. A comparatively large electric field is generated between the semiconductor pillar 120 and the selected word line $WL_S$. This causes the electrons in the channel of the semiconductor pillar 120 to tunnel into the electric charge accumulating film 132 (FIG. 13) via the tunnel insulating film 131 (FIG. 13). This increases the threshold voltage of the write memory cell MC.

Additionally, the channel of the semiconductor pillar 120 connected to the bit line $BL_P$ is in an electrically floating state, and this channel voltage is increased up to approximately the write pass voltage $V_{PASS}$ by capacitive coupling with the unselected word line $WL_U$. Between such a semiconductor pillar 120 and the selected word line $WL_S$, only an electric field smaller than the above-described electric field is generated. Accordingly, the electrons in the channel of the semiconductor pillar 120 do not tunnel into the electric charge accumulating film 132 (FIG. 13). Accordingly, the threshold voltage of the memory cell MC is not increased.

At timing t225 in the program operation, the write pass voltage $V_{PASS}$ is applied to the selected word line $WL_S$ and the unselected word lines $WL_U$.

At timing t226 in the program operation, the ground voltage $V_{SS}$ is applied to the selected word line $WL_S$, the unselected word lines $WL_U$, and the select gate lines (SGD, SGS, SGSb).

At Step S103 (FIG. 19), the verify operation is performed.

For example, as illustrated in FIG. 22, at timing t231 in the verify operation, the selected word line $WL_S$ and the unselected word lines $WL_U$ are applied with the read pass voltage $V_{READ}$, and all of the memory cells MC are turned to the ON state. The select gate lines (SGD, SGS, SGSb) are applied with the voltage $V_{SG}$, and the select transistors (STD, STS, STSb) are turned to the ON state.

At timing t232 in the verify operation, the selected word line $WL_S$ is applied with a certain verify voltage $V_{VFY}$. The certain verify voltage is $V_{VFY}$ one of the verify voltages $V_{VFYA}$–$V_{VFYG}$ described with reference to FIG. 14. Accordingly, for example, as illustrated in FIG. 21, a part of the selected memory cells MC are turned to the ON state, and the other selected memory cells MC are turned to the OFF state.

At timing t232, for example, the bit lines BL are charged. In this timing, bit lines BL connected to memory cells MC corresponding to a certain state are applied with a voltage $V_{BL}+V_{SRC}$, and the other bit lines BL are applied with the voltage $V_{SRC}$.

From timing t233 to timing t234 in the verify operation, for example, as illustrated in FIG. 22, a sense operation is performed, and data indicating the state of this memory cell MC is obtained.

From timing t237 to timing t239 in the verify operation, operations similar to that performed from timing t232 to timing t234 are performed corresponding to memory cells MC corresponding to another state.

From timing t242 to timing t244 in the verify operation, operations similar to that performed from timing t232 to timing t234 are performed corresponding to memory cells MC corresponding to further another state.

At timing t248 in the verify operation, the ground voltage $V_{SS}$ is applied to the selected word line $WL_S$, the unselected word line $WL_U$, and the select gate lines (SGD, SGS, SGSb).

After that, the obtained data is transferred to a counter circuit (not shown). The counter circuit counts a number of memory cells MC having threshold voltages not reached to target values, or a number of memory cells MC having threshold voltages reached to the target values.

In the example of FIG. 22, three verify voltages $V_{VFY}$ are applied to the selected word line $WL_S$. However, in the verify operation, a number of verify voltages $V_{VFY}$ applied to the selected word line $WL_S$ may be smaller than three, may be larger than three, or may be changed in accordance with the loop count $n_W$.

At Step S104 (FIG. 19), the result of the verify operation is determined. For example, with reference to the above-mentioned counter circuit, verify FAIL is determined if the number of memory cells MC having threshold voltages not reached to target values is larger than a certain number, and the process proceeds to Step S105. On the other hand, verify PASS is determined if the number of memory cells MC having threshold voltages not reached to target values is larger than the certain number, and the process proceeds to Step S107.

At Step S105, whether the loop count $n_W$ reaches a predetermined count $N_W$ or not is determined. When the loop count $n_W$ does not reach the predetermined count $N_W$, the process proceeds to Step S106. When the loop count $n_W$ reaches the predetermined count $N_W$, the process proceeds to Step S108.

At Step S106, 1 is added to the loop count $n_W$, and the process proceeds to Step S102. At Step S106, for example, the predetermined offset voltage ΔV is added to the program voltage $V_{PGM}$. Accordingly, the program voltage $V_{PGM}$ increases together with the increase in the loop count $n_W$.

At Step S107, the status data $D_{ST}$ indicative of normal termination of the write operation is stored in the status register STR (FIG. 4) to terminate the write operation. Note that the status data $D_{ST}$ is output to the controller die CD (FIG. 1) by a status read operation.

At Step S108, the status data $D_{ST}$ indicative of failing to normally terminate the write operation is stored in the status register STR (FIG. 4) to terminate the write operation.

[Erase Operation]

Next, the erase operation of the semiconductor memory device according to the embodiment will be described.

Figure 23:
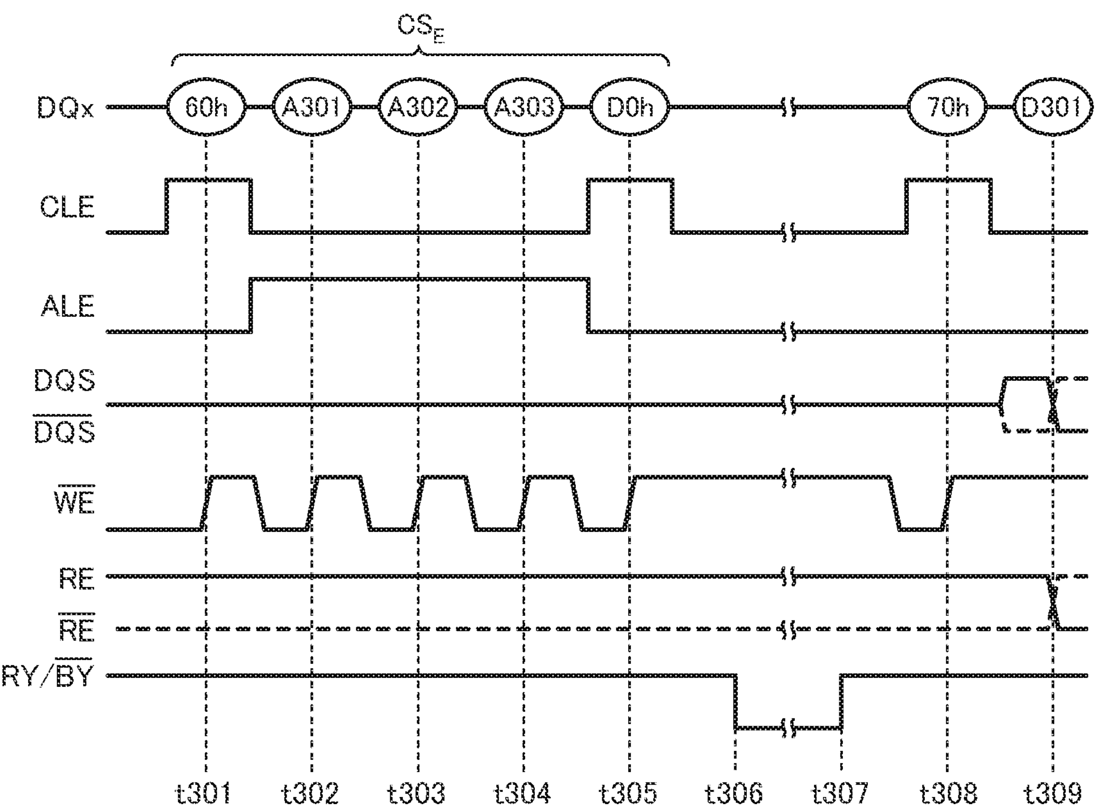
FIG. 23 is a timing chart for describing an erase operation.

FIG. 23 is a timing chart for describing the erase operation.

FIG. 23 exemplifies a command set $CS_E$ input to the memory die MD in the erase operation. This command set $CS_E$ includes data 60*h*, A301, A302, A303, and data D0*h*.

At a timing t301, the controller die CD inputs the data 60*h* to the memory die MD as the command data $D_{CMD}$. The data 60*h* is a command input at the start of the erase operation.

At a timing t302, the controller die CD inputs the data A301 to the memory die MD as the address data $D_{ADD}$. The data A301 is a part of the row address RA. The data A301 includes, for example, the block address.

At a timing t303, the controller die CD inputs the data A302 to the memory die MD as the address data $D_{ADD}$. The data A302 is a part of the row address RA. The data A302 includes, for example, the block address and the page address.

At a timing t304, the controller die CD inputs the data A303 to the memory die MD as the address data $D_{ADD}$. The data A303 includes, for example, a block address and a page address.

At a timing t305, the controller die CD inputs the data D0*h* to the memory die MD as the command data $D_{CMD}$. The data D0*h* is a command indicative of the termination of the input of the command set $CS_E$ regarding the erase operation.

At a timing t306, the terminal RY//BY enters the "L" state from the "H" state and the access to the memory die MD is inhibited. The erase operation is performed in the memory die MD.

At a timing t307, the erase operation in the memory die MD terminates. Additionally, the terminal RY//BY enters the "H" state from the "L" state and the access to the memory die MD is permitted.

At a timing t308, the controller die CD inputs, for example, the data 70*h* to the memory die MD as the command data $D_{CMD}$.

At a timing t309, the controller die CD outputs, for example, the data D301 from the memory die MD. The data D301 is the status data.

Figure 24:
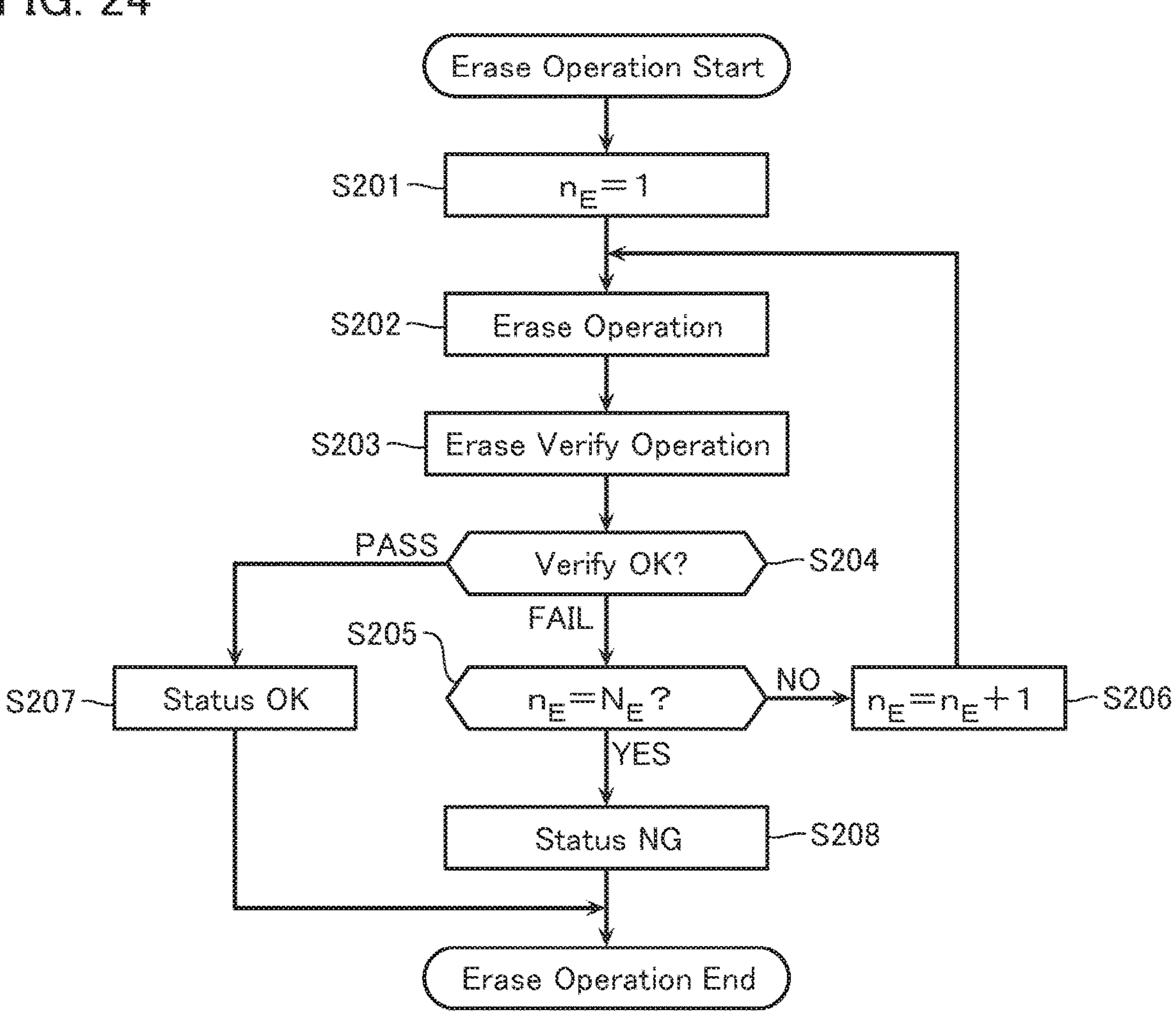
FIG. 24 is a flowchart for describing the erase operation.
Figure 25:
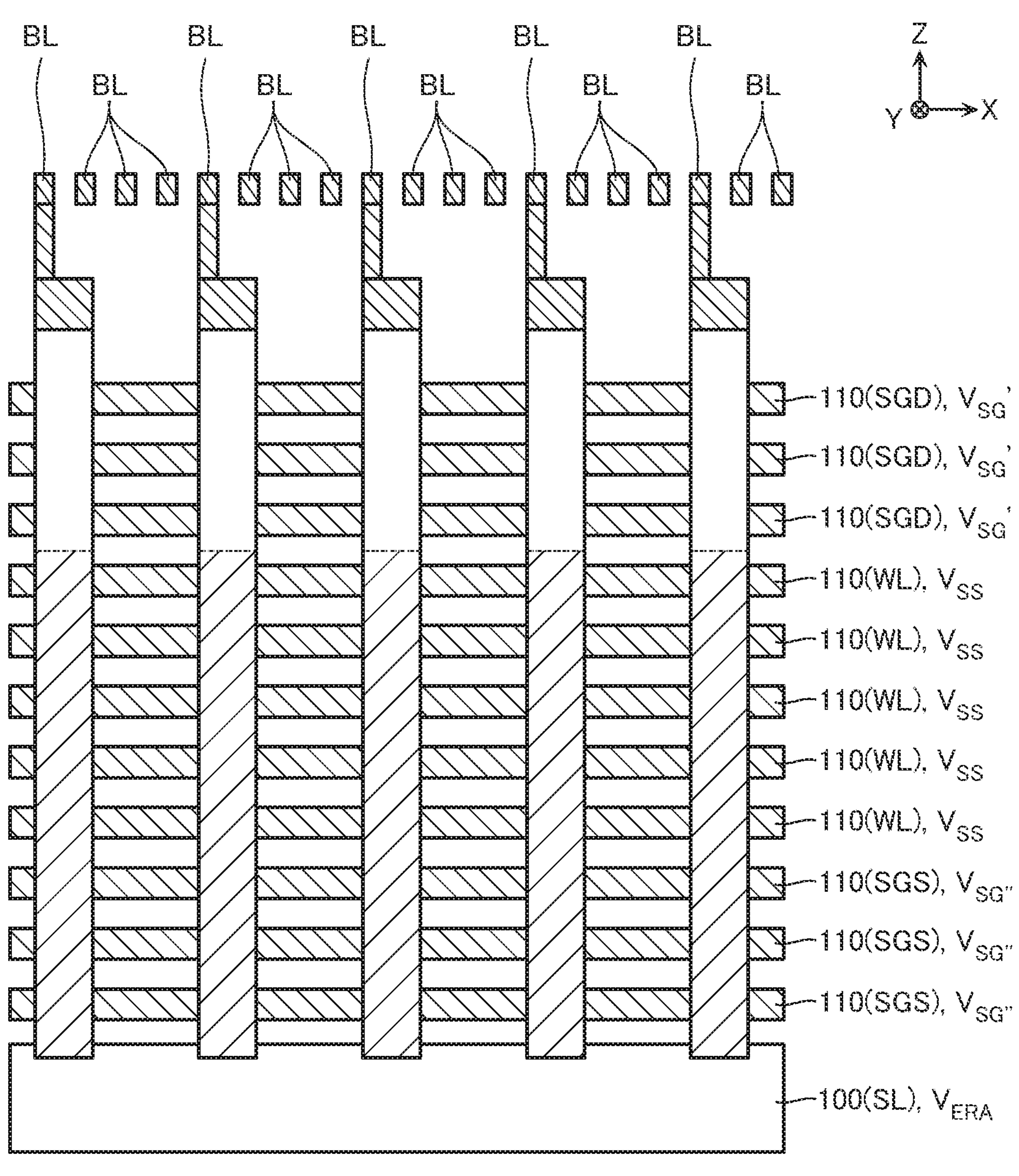
FIG. 25 is a schematic cross-sectional view for describing an erase operation included in the erase operation.
Figure 26:
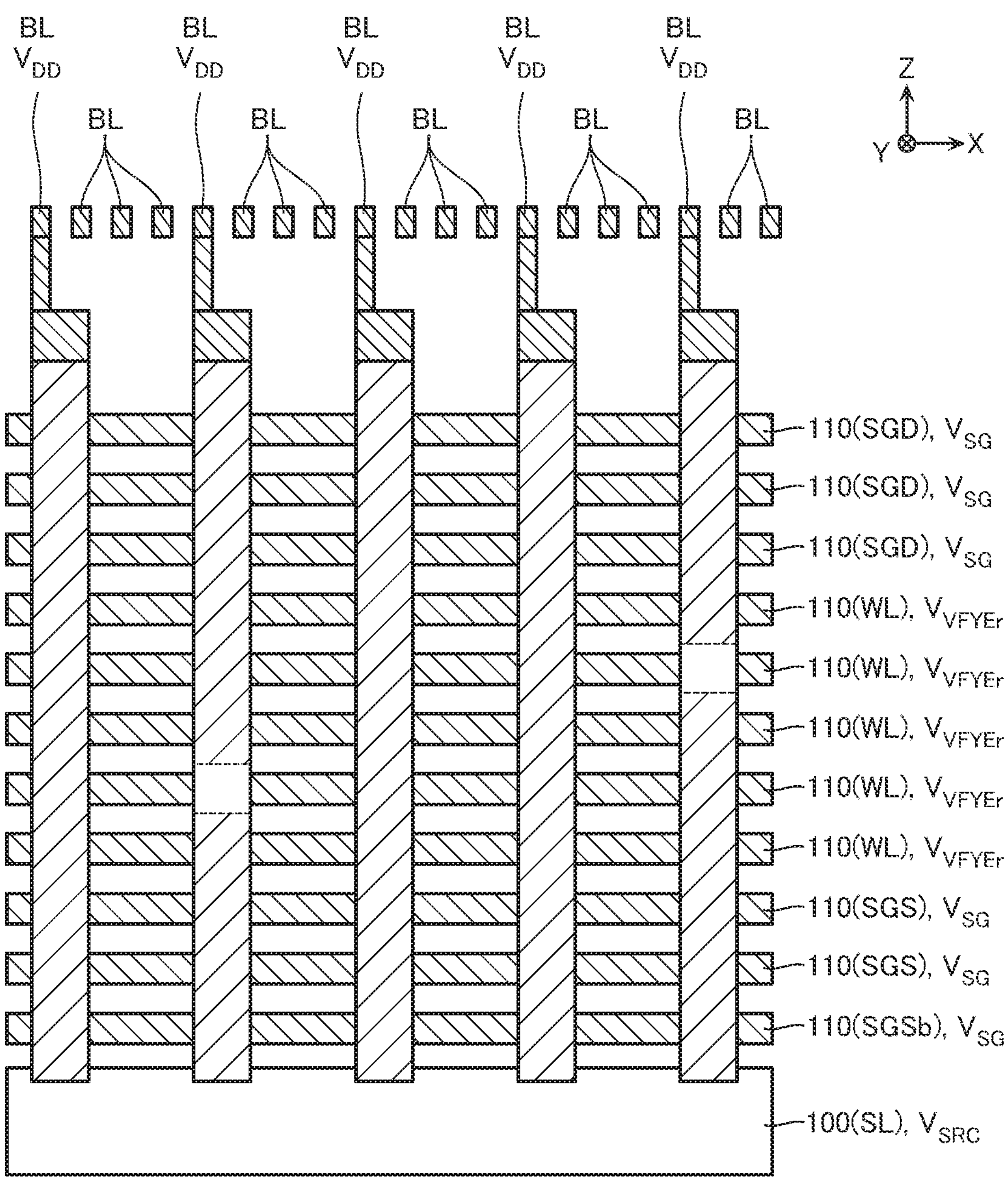
FIG. 26 is a schematic cross-sectional view for describing an erase verify operation included in the erase operation.
Figure 27:
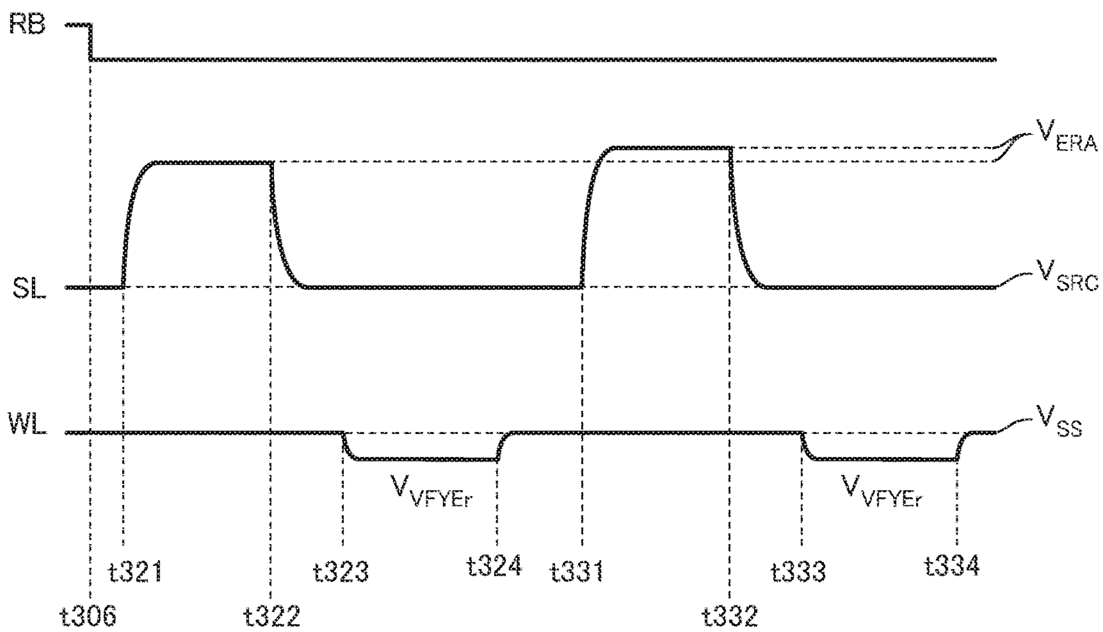
FIG. 27 is a timing chart for describing the erase operation.

FIG. 24 is a flowchart for describing the erase operation. FIG. 25 is a schematic cross-sectional view for describing an erase operation included in the erase operation. FIG. 26 is a schematic cross-sectional view for describing an erase verify operation included in the erase operation. FIG. 27 is a timing chart for describing the erase operation.

In the following description, an example where the erase operation is performed on a memory block BLK which is a target of the operation will be described.

At Step S201, as shown in FIG. 24 for example, a loop count $n_E$ is set to 1. The loop count $n_E$ is a variable indicative of the number of times of the first write loop. This operation is performed at a timing t306 in FIG. 27.

At Step S202, the erase operation is performed. The erase operation is an operation that applies the erase voltage to the source line SL and decreases the threshold voltage of the memory cell MC. The operation is performed in a period from timing t321 until timing t322 in FIG. 27.

At timing t321 in the erase operation, as shown in FIG. 25 for example, the ground voltage $V_{SS}$ is applied to the word lines WL. Additionally, a voltage $V_{SG}'$ is applied to the drain-side select gate line SGD, and a voltage $V_{SG}''$ is applied to the source-side select gate line SGS. The voltage $V_{SG}'$ has an amplitude to the extent that the drain-side select transistors STD turn to the OFF state. The voltage $V_{SG}''$ has an amplitude to the extent that channels of holes are formed in the channel regions of the source-side select transistors STS, thereby the source-side select transistors STS turn to the ON state.

At timing t321 in the erase operation, the erase voltage $V_{ERA}$ is applied to the source line SL.

At Step S203 (FIG. 24), the erase verify operation is performed.

For example, as illustrated in FIG. 26, at timing t323 in the erase verify operation, the word lines WL are applied with the erase verify voltage $V_{VFYEr}$. The select gate lines (SGD, SGS, SGSb) are applied with the voltage $V_{SG}$, and the select transistors (STD, STS, STSb) are turned to the ON state.

At timing t324 in the erase verify operation, the word lines WL and the select gate lines (SGD, SGS, SGSb) are applied with the ground voltage $V_{SS}$.

After that, the obtained data is transferred to a counter circuit (not shown). The counter circuit counts a number of memory cells MC having threshold voltages not reached to target values, or a number of memory cells MC having threshold voltages reached to the target values.

At Step S204 (FIG. 24), the result of the erase verify operation is determined. For example, with reference to the above-mentioned counter circuit, verify FAIL is determined if the number of memory cells MC having threshold voltages not reached to target values is larger than a certain number, and the process proceeds to Step S205. On the other hand, verify PASS is determined if the number of memory cells MC having threshold voltages not reached to target values is larger than the certain number, and the process proceeds to Step S207.

At Step S205, whether the loop count $n_E$ reaches a predetermined count $N_E$ or not is determined. When the loop count $n_E$ does not reach the predetermined count $N_E$, the process proceeds to Step S206. When the loop count $n_E$ reaches the predetermined count $N_E$, the process proceeds to Step S208.

At Step S206, 1 is added to the loop count $n_E$, and the process proceeds to Step S202. At Step S206, for example, the predetermined offset voltage ΔV is added to the erase voltage $V_{ERA}$. Accordingly, the erase voltage $V_{ERA}$ increases together with the increase in the loop count $n_E$.

At Step S207, the status data $D_{ST}$ indicative of normal termination of the erase operation is stored in the status register STR (FIG. 4) to terminate the erase operation. Note that the status data $D_{ST}$ is output to the controller die CD (FIG. 1) by a status read operation.

At Step S208, the status data $D_{ST}$ indicative of failing to normally terminate the erase operation is stored in the status register STR (FIG. 4) to terminate the erase operation.

[Charge Share Operation]

As described with reference to FIG. 17, from the timing t121 to the timing t122 in the read operation, all of the word lines WL included in the selected memory block BLK is charged with the read pass voltage $V_{READ}$. Additionally, as described with reference to FIG. 22, from the timing t221 to the timing t222 in the write operation, all of the word lines WL included in the selected memory block BLK is charged with the write pass voltage $V_{PASS}$. Additionally, as described with reference to FIG. 27, at the timing t321 in the erase operation, source line SL is charged with the erase voltage $V_{ERA}$.

Here, in association with the high integration of the semiconductor memory device, the number of the conductive layers 110 (FIG. 11) stacked in the Z-direction has been increasing. In association with this, the electric charge amount necessary for charging the word lines WL or the source line SL has increased, and the operating current flowing in the pad electrode P to which the power supply voltage $V_{CC}$ is applied has been increasing. In association with this, the power consumption and the amount of heat generation increase in some cases. For reducing such an operating current, for example, it is possible to lengthen the time for charging the word lines WL or the source line SL to reduce the amount of electric charge moving in a unit time. However, in this case, a time period necessary for the read operation is lengthened in some cases.

Therefore, in the embodiment, after the read operation, the write operation, or the erase operation is finished, electric charge used in these operations is used for the read operation, the write operation, or the erase operation which will be performed next. By doing this the electric charge amount necessary for performing the read operation, the write operation, or the erase operation can be decreased, thereby the operating current can be drastically decreased.

[Charge Share Operation Between Memory Dies MD]

[Charge Share Operation Between Word Line WL and Word Line WL]

Figure 28:
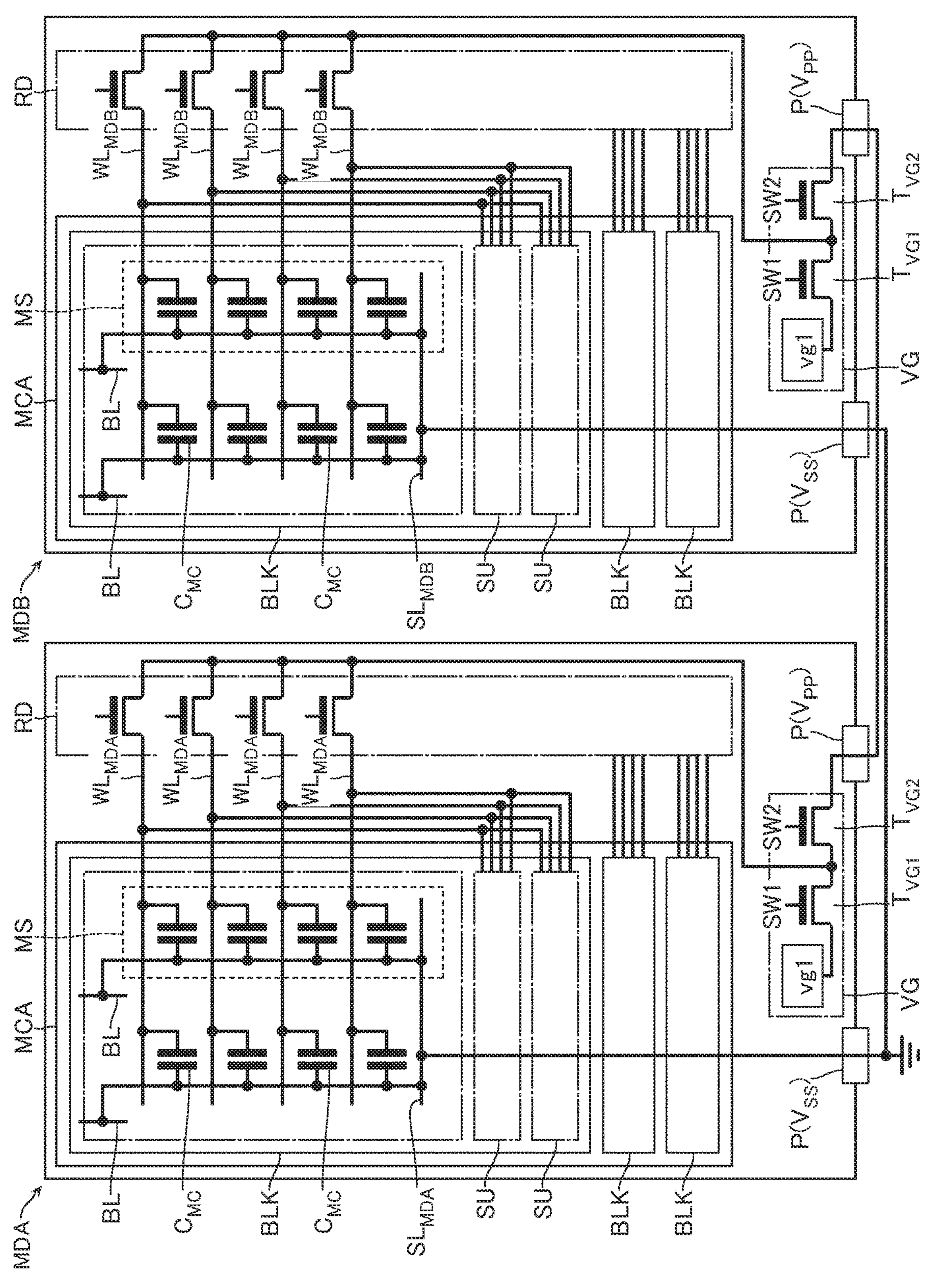
FIG. 28 is a schematic circuit diagram for illustrating the charge share operation.

Next, with reference to FIG. 28, the charge share operation between the word lines WL in a memory die MD and the word lines WL in another memory die MD will be described. FIG. 28 is a schematic circuit diagram illustrating a configuration of the semiconductor memory device according to the embodiment. In FIG. 28, two memory dies MD are shown as a memory die MDA and a memory die MDB.

Additionally, word lines WL corresponding to the memory die MDA and a memory block BLK to which the read operation or the like is performed are shown as word lines $WL_{MDA}$. Additionally, a source line SL corresponding to the memory die MDA and the memory block BLK to which the read operation or the like is performed is shown as a source line $SL_{MDA}$.

Additionally, word lines WL corresponding to the memory die MDB and a memory block BLK to which the read operation or the like is performed are shown as word lines $WL_{MDB}$. Additionally, a source line SL corresponding to the memory die MDB and the memory block BLK to which the read operation or the like is performed is shown as a source line $SL_{MDB}$.

Additionally, in FIG. 28, different from the example of FIG. 5 for example, the memory cells MC are exemplified as capacitors $C_{MC}$. The capacitor $C_{MC}$ is a capacitor including the gate electrode of the memory cell MC as one electrode, and the channel region of the memory cell MC as the other electrode.

Additionally, in FIG. 28, for convenience of explanation, an example in which the source line $SL_{MDA}$ and the source line $SL_{MDB}$ are applied with the ground voltage $V_{SS}$. Additionally, in FIG. 28, configurations in circuits are shown in a simplified manner.

For example, in case that the read operation is performed in the memory die MDA, from the timing t121 to the timing t122 described with reference to FIG. 17, the word lines $WL_{MDA}$ are charged. By doing this, among the capacitors $C_{MC}$ shown in FIG. 28, all capacitors $C_{MC}$ connected to the word lines $WL_{MDA}$ are charged.

For example, if the charge share operation is performed between the memory die MDA and the memory die MDB, in the memory die MDA and the memory die MDB, the voltages of the signal lines SW2 turns to "H" state. In association with this, all word lines $WL_{MDA}$ are conducted to the pad electrode P corresponding to the voltage $V_{PP}$. Similarly, all word lines $WL_{MDB}$ are conducted to the pad electrode P corresponding to the voltage $V_{PP}$. In association with this, about half of an electric charge in the word lines $WL_{MDA}$ is transferred to the word lines $WL_{MDB}$. After that, the word lines $WL_{MDA}$ and the word lines $WL_{MDB}$ are electrically separated.

After performing the charge share operation, the electric charge in the word lines $WL_{MDA}$ is discharged. On the other hand, the electric charge in the word lines $WL_{MDB}$ is used for the read operation or the like.

Figure 29:
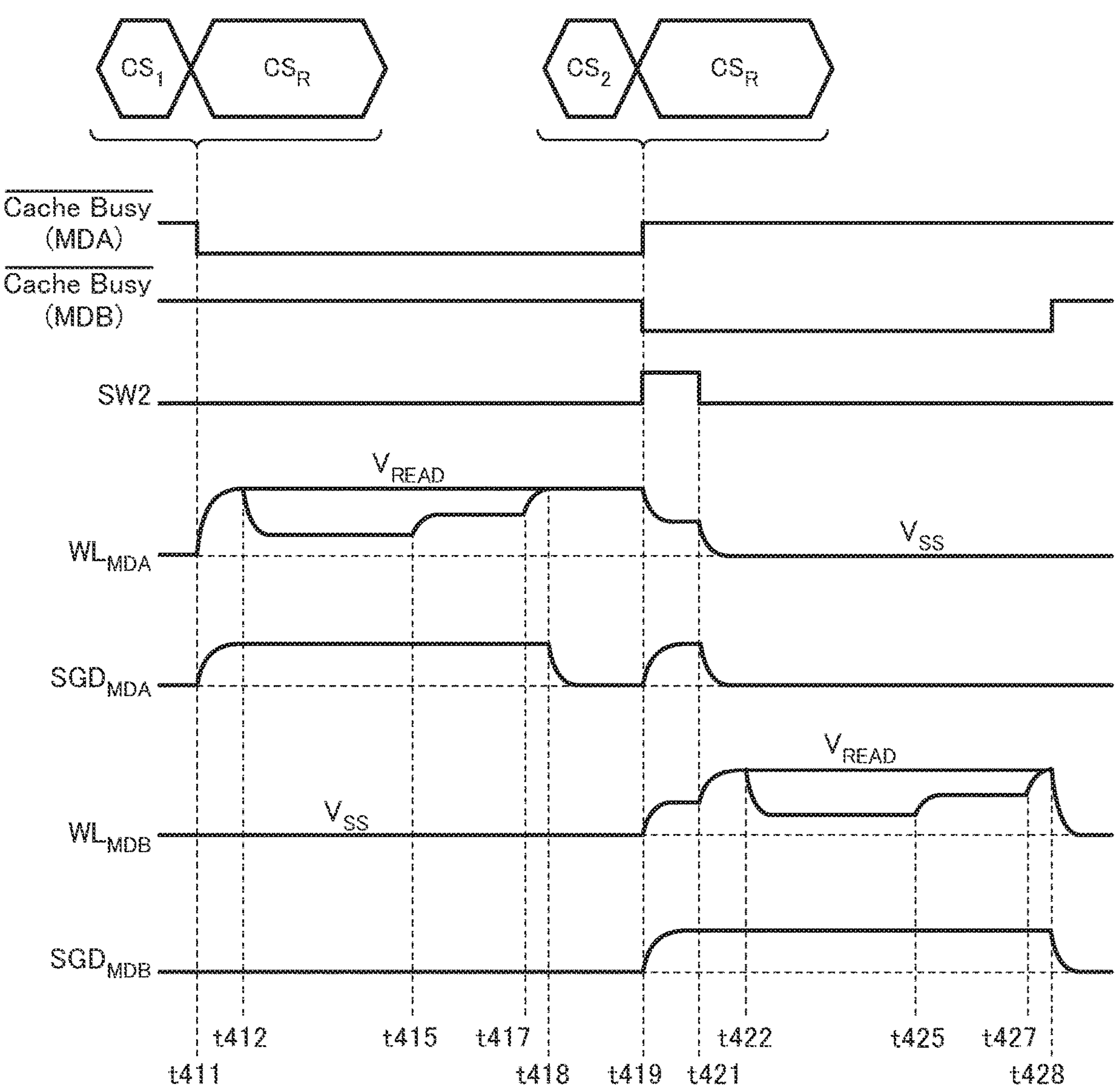
FIG. 29 is a schematic waveform diagram for illustrating the charge share operation.
Figure 30:
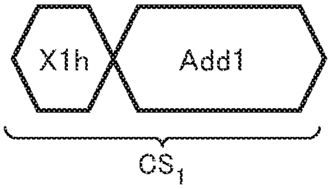
FIG. 30 is a schematic waveform diagram for illustrating a command set $CS_1$ described in FIG. 29.
Figure 31:
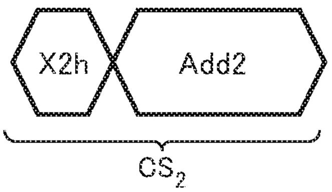
FIG. 31 is a schematic waveform diagram for illustrating a command set $CS_2$ described in FIG. 29.

Next, with reference to FIG. 29 to FIG. 31, the charge share operation between the word lines WL in a memory die MD and the word lines WL in another memory die MD will be described in more detail. FIG. 29 is a schematic waveform diagram for illustrating the charge share operation. FIG. 30 and FIG. 31 are schematic waveform diagrams for illustrating a command set $CS_1$ and a command set $CS_2$ described in FIG. 29.

In FIG. 29, a drain-side select gate line SGD corresponding to the memory die MDA and the memory block BLK to which the read operation or the like is performed is shown as a drain-side select gate line $SGD_{MDA}$. Additionally, a drain-side select gate line SGD corresponding to the memory die MDB and the memory block BLK to which the read operation or the like is performed is shown as a drain-side select gate line $SGD_{MDB}$.

In the example in FIG. 29, at timing t411, the controller die CD inputs the command set $CS_1$ and the command set $CS_R$ to the memory die MDA. For example, as shown in FIG. 30, the controller die CD inputs data X1*h* to the memory die MDA as the command data $D_{CMD}$. The data X1*h* is a command input when the charge share operation is performed after the read operation or the like is performed. Additionally, the controller die CD inputs data Add1 to the memory die MDA as the address data $D_{ADD}$. The data Add1 includes, for example, a chip address, a block address, or the like corresponding to the word lines $WL_{MDA}$.

From timing t411 to timing t418, the read operation is performed in the memory die MDA. The operation in the memory die MDA from the timing t411 to the timing t418 is performed similarly to the operation from the timing t121 to the timing t128 described with reference to FIG. 17.

Although illustration is omitted in FIG. 29, at the timing t411, an internal signal/Cache Busy turns to the "L" state from the "H" state. The internal signal/Cache Busy can be read by performing the status read operation or the like.

At timing t418, the memory die MDA is set to a standby mode. In the standby mode, voltages of the word lines $WL_{MDA}$ are maintained to the read pass voltage $V_{READ}$. Additionally, in the standby mode according to the embodiment, a plurality of the transistors $T_{WLU}$, $T_{DRV4}$ disposed in a current path between the word lines $WL_{MDA}$ and the voltage generation unit vg2 (FIG. 6) are turned to the ON state. For example, in the standby mode according to the embodiment, a voltage of the signal line BLKSEL is maintained to the "H" state. Additionally, in the standby mode according to the embodiment, the memory cells MC corresponding to the word lines $WL_{MDA}$ are electrically separated from the bit lines BL and the source line SL by adjusting the voltages of the select gate lines SG. In the example of FIG. 29, the voltage of the drain-side select gate line $SGD_{MDA}$ decreases to the ground voltage $V_{SS}$, thereby the memory cells MC corresponding to the word lines $WL_{MDA}$ are electrically separated from the bit lines BL. Additionally, in the standby mode according to the embodiment, the voltage of the internal signal /Cache Busy is maintained to the "L" state after the read voltage is finished.

In the example in FIG. 29, at timing t419, the controller die CD inputs the command set $CS_2$ and the command set $CS_R$ to the memory die MDB. For example, as shown in FIG. 31, the controller die CD inputs data X2*h* to the memory die MDB as the command data $D_{CMD}$. The data X2*h* is a command input when the charge share operation is performed. Additionally, the controller die CD inputs data Add2 to the memory die MDB as the address data $D_{ADD}$. The data Add2 includes, for example, a chip address, a block address, or the like corresponding to the word lines $WL_{MDB}$.

At timing t419, the standby mode is released. Additionally, the charge share operation is performed. In association with this, the voltage of the signal line SW2 in the memory die MDA and the voltage of the signal line SW2 in the memory die MDB turn to "H" state from "L" state. Additionally, the voltages of the select gate lines (SGD, SGS, SGSb) are adjusted, thereby memory cells MC corresponding to the word lines $WL_{MDA}$, $WL_{MDB}$ are conducted at least one of the bit line BL and the source line SL. For example, in the example of FIG. 29, the voltage of the drain-side select gate lines $SGD_{MDA}$, $SGD_{MDB}$ are increased to the above-mentioned voltage $V_{SG}$. By doing this, as described with reference to FIG. 28, the electric charge in the word lines $WL_{MDA}$ is transferred to the word lines $WL_{MDB}$ via the pad electrode P of the memory die MDA and the pad electrode P of the memory die MDB. Additionally, at timing t421, the voltages of the signal lines SW2 turn to "L" state form "H" state. By this, the word lines $WL_{MDA}$ and the word lines $WL_{MDB}$ are electrically separated. The time from the timing t419 to the timing t421 may be short enough. For example, at this timing, the voltages of the word lines $WL_{MDB}$ need not to converge to about ½ $V_{READ}$.

From timing t421 to timing t428, the read operation is performed in the memory die MDB. The operation in the memory die MDB from the timing t421 to the timing t428 is performed similarly to the operation from the timing t121 to the timing t128 described with reference to FIG. 17. However, from the timing t121 to the timing t122 in FIG. 17, the voltages of the word lines WL increase from the ground voltage $V_{SS}$ to the read pass voltage $V_{READ}$. On the other hand, from the timing t421 to the timing t422 in FIG. 29, the voltages of the word lines $WL_{MDB}$ increase from the voltage of about half of the read pass voltage $V_{READ}$ to the read pass voltage $V_{READ}$.

In FIG. 28 and FIG. 29, an example that a part of the electric charge charged in the read operation is used in another read operation performed next is described. However, it is also possible to use the part of the electric charge charged in the read operation for the write operation performed next. Additionally, it is also possible to use a part of the electric charge charged in the write operation for the read operation or the write operation performed next.

[Charge Share Operation Between Word Line WL and Source Line SL]

Figure 32:
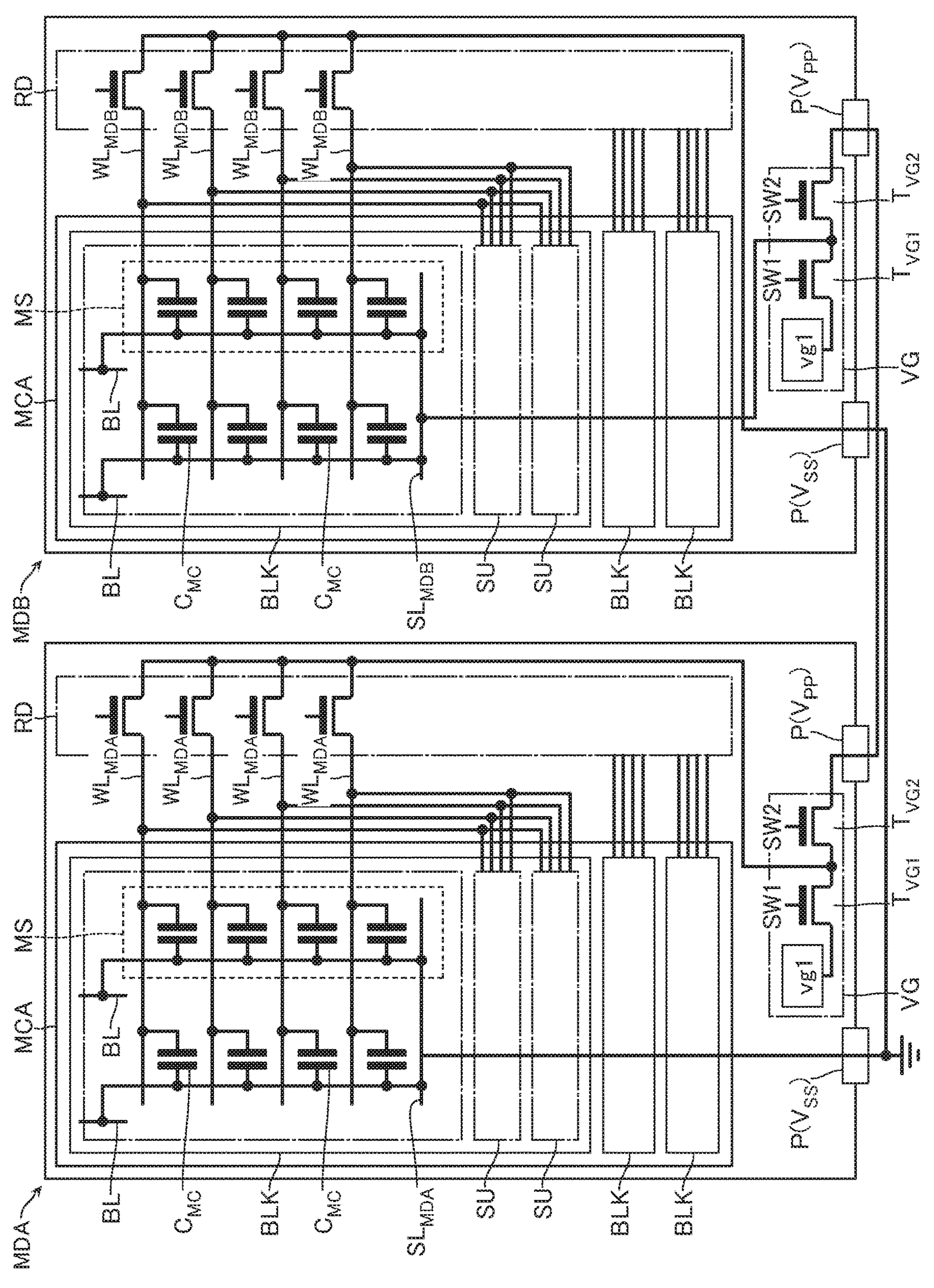
FIG. 32 is a schematic circuit diagram for illustrating the charge share operation.

Next, with reference to FIG. 32, the charge share operation between the word lines WL in a memory die MD and the source line SL in another memory die MD will be described. FIG. 32 is a schematic circuit diagram illustrating a configuration of the semiconductor memory device according to the embodiment.

The charge share operation exemplified in FIG. 32 is basically performed similarly to the charge share operation described with reference to FIG. 28. However, in the example of FIG. 32, when the charge share operation is performed, all word lines $WL_{MDA}$ are conducted to the pad electrode P corresponding to the voltage $V_{PP}$. Additionally, the source line $SL_{MDB}$ is conducted to the pad electrode P corresponding to the voltage $V_{PP}$. In association with this, about half of an electric charge in the word lines $WL_{MDA}$ is transferred to the source line $SL_{MDB}$. After that, the word lines $WL_{MDA}$ and the source line $SL_{MDB}$ are electrically separated.

After performing the charge share operation, the electric charge in the word lines $WL_{MDA}$ is discharged. On the other hand, the electric charge in the source line $SL_{MDB}$ is used for the erase operation or the like.

Figure 33:
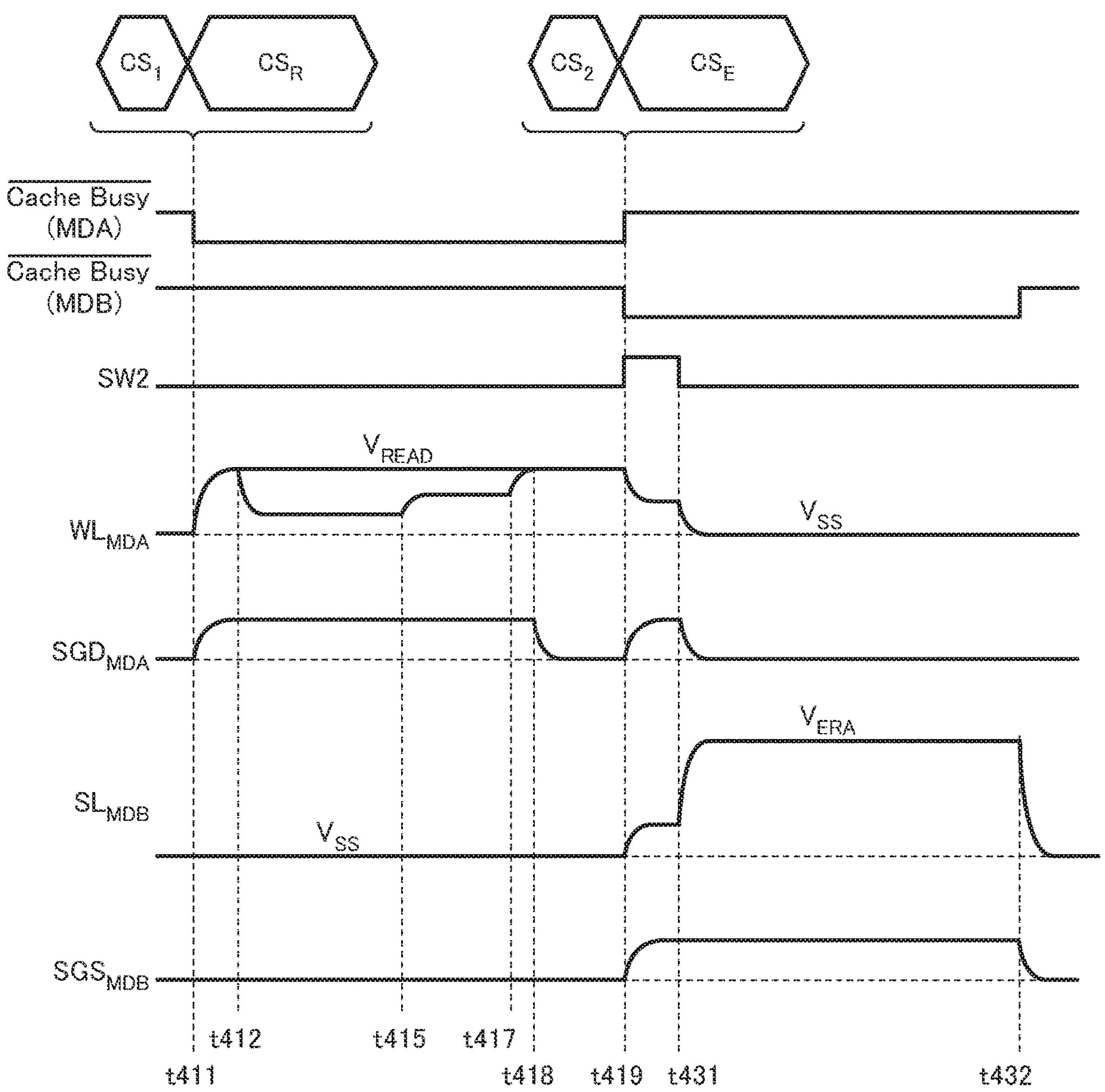
FIG. 33 is a schematic waveform diagram for illustrating the charge share operation.

Next, with reference to FIG. 33, the charge share operation between the word lines WL in a memory die MD and the source line SL in another memory die MD will be described in more detail. FIG. 33 is a schematic waveform diagram for illustrating the charge share operation.

In FIG. 33, a drain-side select gate line SGD corresponding to the memory die MDA and a memory block BLK to which the read operation or the like is performed is shown as a drain-side select gate line $SGD_{MDA}$. Additionally, a source-side select gate line SGS corresponding to the memory die MDB and a memory block BLK to which the erase operation or the like is performed is shown as a source-side select gate line $SGS_{MDB}$.

The charge share operation exemplified in FIG. 33 is basically performed similarly to the charge share operation described with reference to FIG. 29.

However, in the example in FIG. 33, at timing t419, the controller die CD inputs the command set $CS_2$ and the command set $CS_E$ to the memory die MDB.

Additionally at timing t419, the charge share operation is performed, and the electric charge in the word lines $WL_{MDA}$ is transferred to the source line $SL_{MDB}$. Additionally, at timing t431, the voltages of the signal lines SW2 turn to "L" state form "H" state. By this, the word lines $WL_{MDA}$ and the source line $SL_{MDB}$ are electrically separated. The time from the timing t419 to the timing t431 may be short enough. For example, at this timing, the voltage of the source line $SL_{MDB}$ need not to converge to about ½ $V_{READ}$.

From timing t431 to timing t432, the erase operation is performed in the memory die MDB. The operation in the memory die MDB from the timing t431 to the timing t432 is performed similarly to the operation from the timing t321 to the timing t322 described with reference to FIG. 27. However, at the timing t321 in FIG. 27, the voltage of the source line SL increases from the ground voltage $V_{SS}$ to the erase voltage $V_{ERA}$. On the other hand, at the timing t431 in FIG. 33, the voltage of the source line $SL_{MDB}$ increases from the voltage of about half of the read pass voltage $V_{READ}$ to the erase voltage $V_{ERA}$.

In FIG. 32 and FIG. 33, an example that a part of the electric charge charged in the read operation is used in the erase operation performed next is described. However, it is also possible to use the part of the electric charge charged in the write operation for the erase operation performed next. Additionally, it is also possible to use a part of the electric charge charged in the erase operation for the read operation or the write operation performed next.

[Charge Share Operation Between Source Line SL and Source Line SL]

Figure 34:
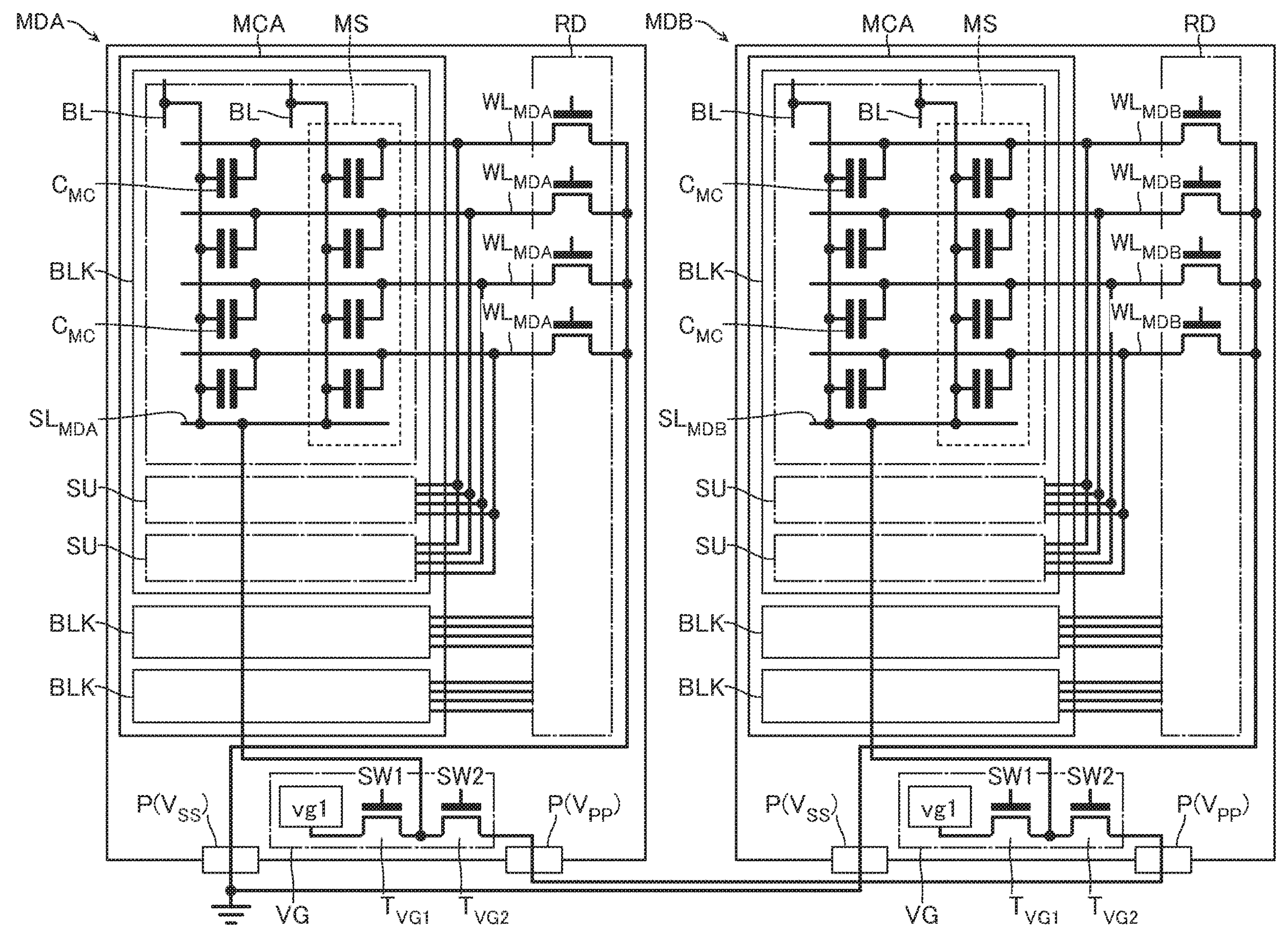
FIG. 34 is a schematic circuit diagram for illustrating the charge share operation.

Next, with reference to FIG. 34, the charge share operation between the source line SL in a memory die MD and the source line SL in another memory die MD will be described. FIG. 34 is a schematic circuit diagram illustrating a configuration of the semiconductor memory device according to the embodiment.

The charge share operation exemplified in FIG. 34 is basically performed similarly to the charge share operation described with reference to FIG. 32. However, in the example of FIG. 34, when the charge share operation is performed, the source line $SL_{MDA}$ is conducted to the pad electrode P corresponding to the voltage $V_{PP}$. Additionally, the source line $SL_{MDB}$ is conducted to the pad electrode P corresponding to the voltage $V_{PP}$. In association with this, about half of an electric charge in the source line $SL_{MDA}$ is transferred to the source line $SL_{MDB}$. After that, the source line $SL_{MDA}$ and the source line $SL_{MDB}$ are electrically separated.

After performing the charge share operation, the electric charge in the source line $SL_{MDA}$ is discharged. On the other hand, the electric charge in the source line $SL_{MDB}$ is used for the erase operation or the like.

Figure 35:
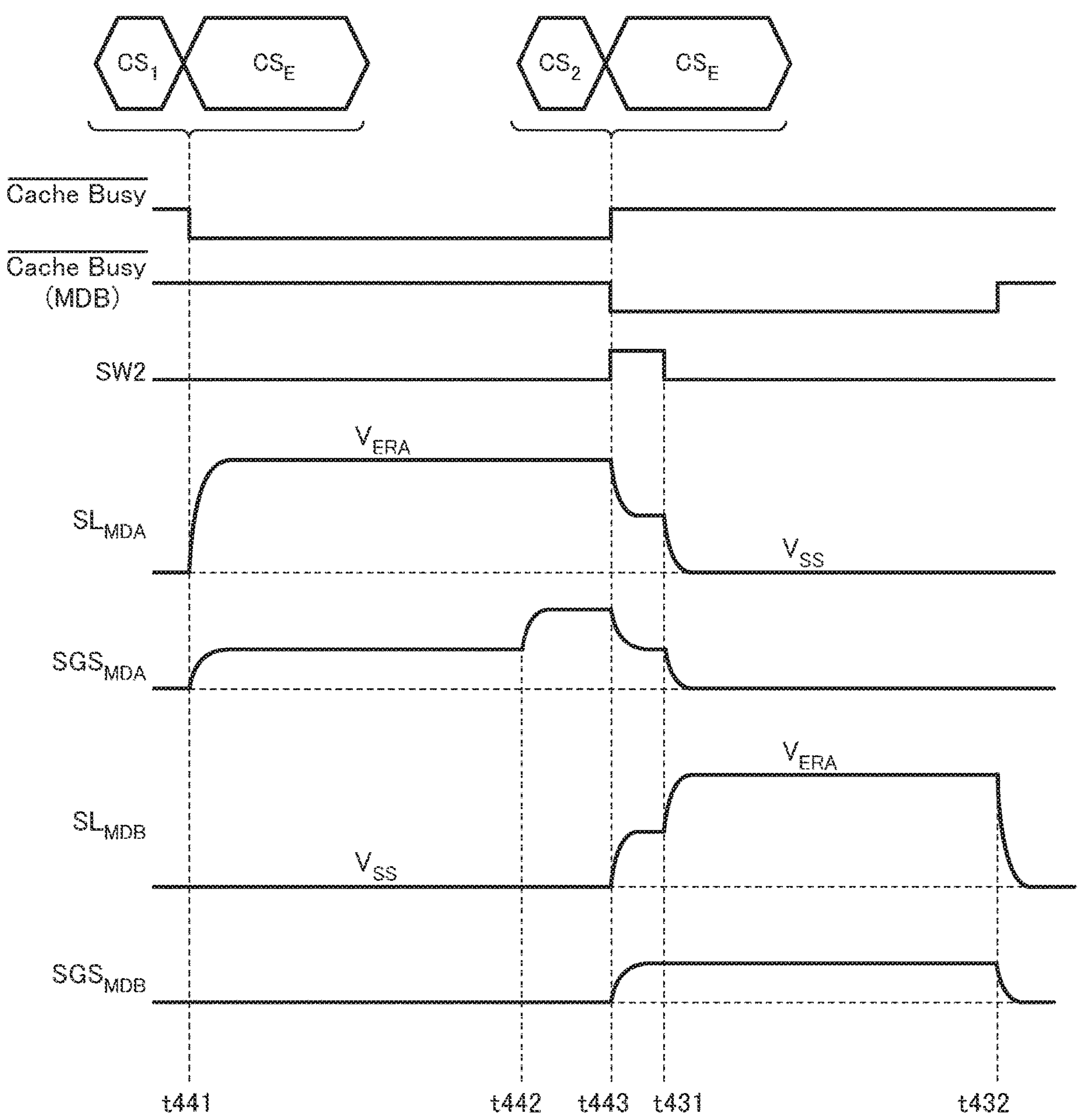
FIG. 35 is a schematic waveform diagram for illustrating the charge share operation.

Next, with reference to FIG. 35, the charge share operation between the source line SL in a memory die MD and the source line SL in another memory die MD will be described in more detail. FIG. 35 is a schematic waveform diagram for illustrating the charge share operation.

In FIG. 35, a source-side select gate line SGS corresponding to the memory die MDA and a memory block BLK to which the erase operation or the like is performed is shown as a source-side select gate line $SGS_{MDA}$. Additionally, a source-side select gate line SGS corresponding to the memory die MDB and a memory block BLK to which the erase operation or the like is performed is shown as a source-side select gate line $SGS_{MDB}$.

The charge share operation exemplified in FIG. 35 is basically performed similarly to the charge share operation described with reference to FIG. 33.

However, in the example in FIG. 35, at timing t441, the controller die CD inputs the command set CS 1 and the command set $CS_E$ to the memory die MDA.

From timing t441 to timing t442, the erase operation is performed in the memory die MDA. The operation in the memory die MDA from the timing t441 to the timing t442 is performed similarly to the operation from the timing t321 to the timing t322 described with reference to FIG. 27.

At timing t442, the memory die MDA is set to the standby mode. In the standby mode, the voltage of the source line $SL_{MDA}$ is maintained to the erase voltage $V_{ERA}$. Additionally, in the standby mode according to the embodiment, the memory cells MC corresponding to the word lines $WL_{MDA}$ are electrically separated from the bit lines BL and the source line SL by adjusting the voltages of the select gate lines SG. In the example of FIG. 35, the voltage of the source-side select gate line $SGS_{MDA}$ increases to a voltage turning the source-side select transistor STS to the OFF state.

In the example in FIG. 35, at timing t443, the controller die CD inputs the command set $CS_2$ and the command set $CS_E$ to the memory die MDB.

Additionally at timing t443, the charge share operation is performed. In accordance with this, the voltages of the signal lines SW2 turn to "H" state form "L" state. By this, as described with reference to FIG. 34, the electric charge in the source line $SL_{MDA}$ is transferred to the source line $SL_{MDB}$. Additionally, at timing t431, the voltages of the signal lines SW2 turn to "L" state form "H" state. By this, the source line $SL_{MDA}$ and the source line $SL_{MDB}$ are electrically separated. The time from the timing t443 to the timing t431 may be short enough. For example, at this timing, the voltage of the source line $SL_{MDB}$ need not to converge to about ½ $V_{READ}$.

From timing t431 to timing t432, the erase operation is performed in the memory die MDB. The operation in the memory die MDB from the timing t431 to the timing t432 is performed similarly to the operation from the timing t431 to the timing t432 described with reference to FIG. 33. However, at the timing t431 in FIG. 33, the voltage of the source line SL increases from the voltage of about half of the read pass voltage $V_{READ}$ to the erase voltage $V_{ERA}$. On the other hand, at the timing t431 in FIG. 35, the voltage of the source line $SL_{MDB}$ is charged from the voltage of about half of the erase voltage $V_{ERA}$ to the erase voltage $V_{ERA}$.

[Charge Share Operation Between Memory Cell Arrays MCA]

[Charge Share Operation Between Word Line WL and Word Line WL]

Figure 36:
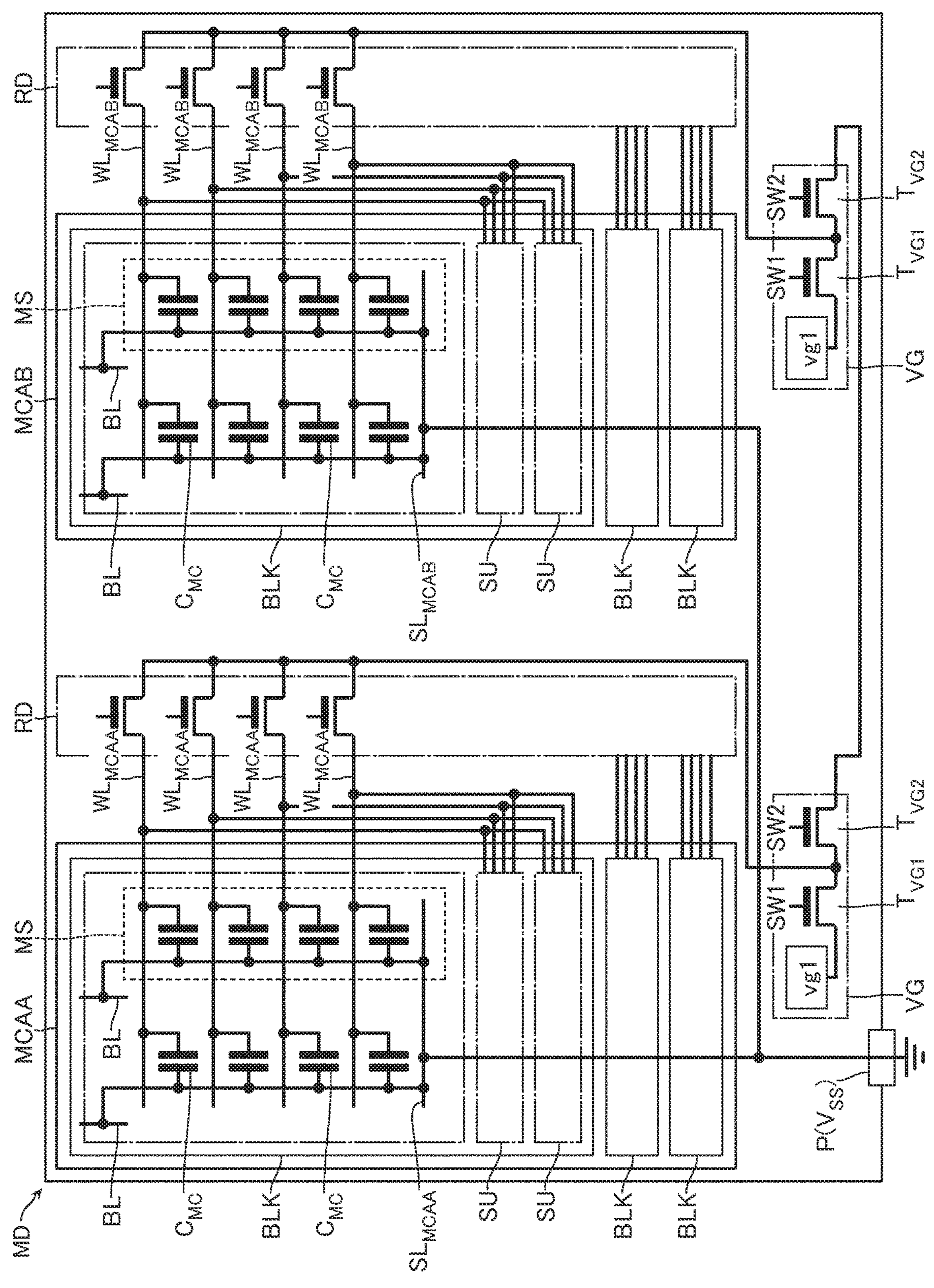
FIG. 36 is a schematic circuit diagram for illustrating the charge share operation.

Next, with reference to FIG. 36, the charge share operation between the word lines WL in a memory cell array MCA and the word lines WL in another memory cell array MCA will be described. FIG. 36 is a schematic circuit diagram illustrating a configuration of the semiconductor memory device according to the embodiment. In FIG. 36, two memory cell arrays MCA are shown as a memory cell array MCAA and a memory cell array MCAB.

Additionally, word lines WL corresponding to the memory cell array MCAA and a memory block BLK to which the read operation or the like is performed are shown as word lines $WL_{MCAA}$. Additionally, a source line SL corresponding to the memory cell array MCAA is shown as a source line $SL_{MCAA}$.

Additionally, word lines WL corresponding to the memory cell array MCAB and a memory block BLK to which the read operation or the like is performed are shown as word lines $WL_{MCAB}$. Additionally, a source line SL corresponding to the memory cell array MCAB is shown as a source line $SL_{MCAB}$.

Additionally, in FIG. 36, for convenience of explanation, an example in which the source line $SL_{MCAA}$ and the source line $SL_{MCAB}$ are applied with the ground voltage $V_{SS}$. Additionally, in FIG. 36, configurations in circuits are shown in a simplified manner.

For example, in case that the read operation is performed in the memory cell array MCAA, from the timing t121 to the timing t122 described with reference to FIG. 17, the word lines $WL_{MCAA}$ are charged. By doing this, among the capacitors $C_{MC}$ shown in FIG. 36, all capacitors $C_{MC}$ connected to the word lines $WL_{MCAA}$ are charged.

For example, if the charge share operation is performed between the memory cell array MCAA and the memory cell array MCAB, the voltages of two signal lines SW2 corresponding to the memory cell array MCAA and the memory cell array MCAB turn to "H" state. In association with this, all word lines $WL_{MCAA}$ are conducted to all word lines $WL_{MCAB}$. In association with this, about half of an electric charge in the word lines $WL_{MCAA}$ is transferred to the word lines $WL_{MCAB}$. After that, the word lines $WL_{MCAA}$ and the word lines $WL_{MCAB}$ are electrically separated.

After performing the charge share operation, the electric charge in the word lines $WL_{MCAA}$ is discharged. On the other hand, the electric charge in the word lines $WL_{MCAB}$ is used for the read operation or the like.

Figure 37:
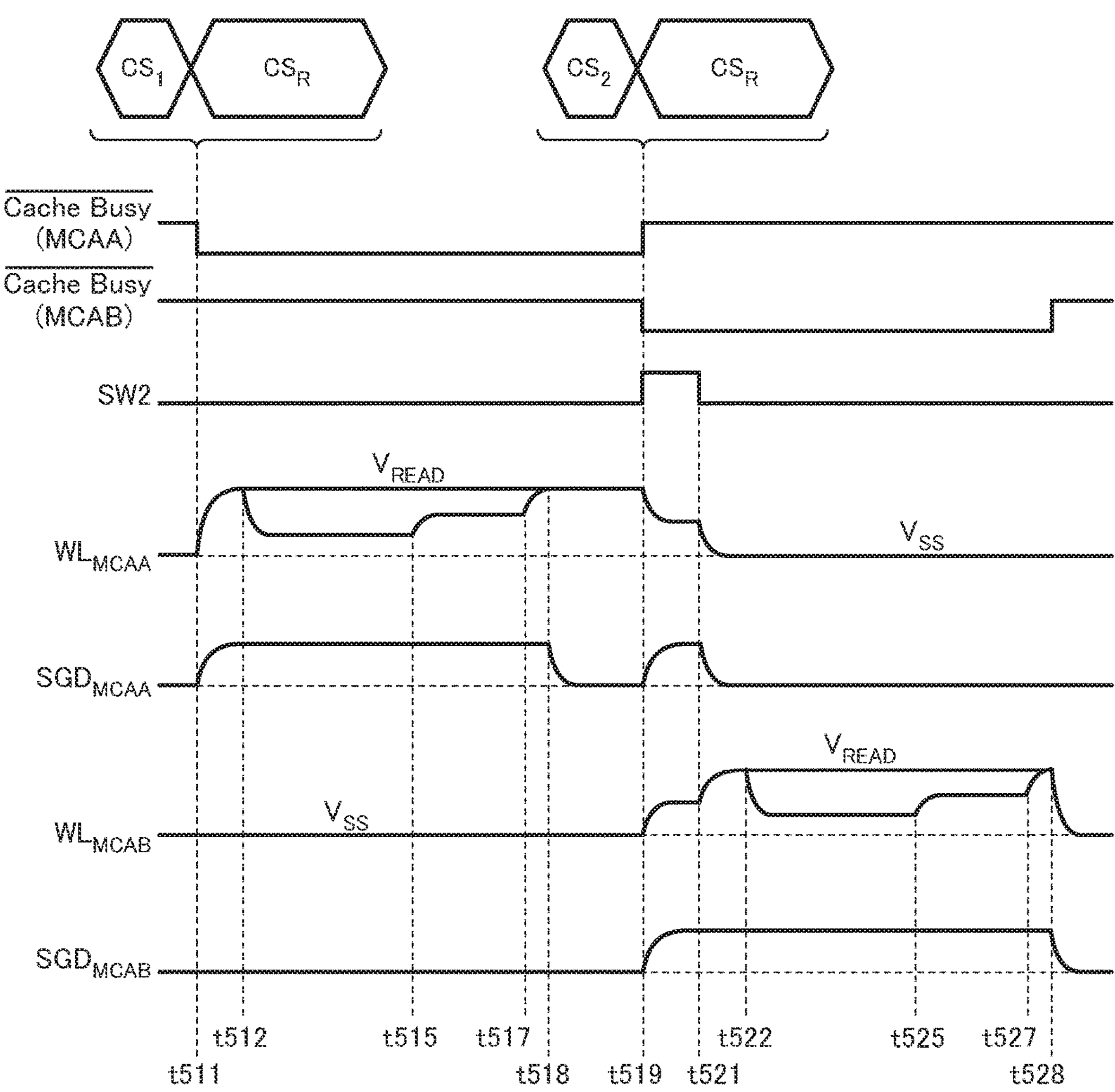
FIG. 37 is a schematic waveform diagram for illustrating the charge share operation.

Next, with reference to FIG. 37, the charge share operation between the word lines WL in a memory cell array MCA and the word lines WL in another memory cell array MCA will be described in more detail. FIG. 37 is a schematic waveform diagram for illustrating the charge share operation.

In FIG. 37, a drain-side select gate line SGD corresponding to the memory cell array MCAA and a memory block BLK to which the read operation or the like is performed is shown as a drain-side select gate line $SGD_{MCAA}$. Additionally, a drain-side select gate line SGD corresponding to the memory cell array MCAB and a memory block BLK to which the read operation or the like is performed is shown as a drain-side select gate line $SGD_{MCAB}$.

In the example in FIG. 37, at timing t511, the controller die CD inputs the command set $CS_1$ and the command set $CS_R$ to the memory die MD.

From timing t511 to timing t518, the read operation is performed in the memory cell array MCAA. The operation in the memory cell array MCAA from the timing t511 to the timing t518 is performed similarly to the operation from the timing t121 to the timing t128 described with reference to FIG. 17.

At timing t518, memory cell array MCAA is set to the standby mode.

In the example in FIG. 37, at timing t519, the controller die CD inputs the command set $CS_2$ and the command set $CS_R$ to the memory die MD.

At timing t519, the standby mode is released. Additionally, the charge share operation is performed. In association with this, the voltages of the signal lines SW2 turn to "H" state from "L" state. By doing this, as described with reference to FIG. 36, the electric charge in the word lines $WL_{MCAA}$ is transferred to the word lines $WL_{MCAB}$. Additionally, at timing t521, the voltages of the signal lines SW2 turn to "L" state form "H" state. By this, the word lines $WL_{MCAA}$ and the word lines $WL_{MCAB}$ are electrically separated. The time from the timing t519 to the timing t521 may be short enough. For example, at this timing, the voltages of the word lines $WL_{MCAB}$ need not to converge to about ½ $V_{READ}$.

From timing t521 to timing t528, the read operation is performed in the memory cell array MCAB. The operation in the memory cell array MCAB from the timing t521 to the timing t528 is performed similarly to the operation from the timing t121 to the timing t128 described with reference to FIG. 17. However, from the timing t121 to the timing t122 in FIG. 17, the voltages of the word lines WL increase from the ground voltage $V_{SS}$ to the read pass voltage $V_{READ}$. On the other hand, from the timing t521 to the timing t522 in FIG. 37, the voltages of the word lines $WL_{MCAB}$ increase from the voltage of about half of the read pass voltage $V_{READ}$ to the read pass voltage $V_{READ}$.

In FIG. 36 and FIG. 37, an example that a part of the electric charge charged in the read operation is used in another read operation performed next is described. However, it is also possible to use the part of the electric charge charged in the read operation for the write operation performed next. Additionally, it is also possible to use a part of the electric charge charged in the write operation for the read operation or the write operation performed next.

[Charge Share Operation Between Word Line WL and Source Line SL]

Figure 38:
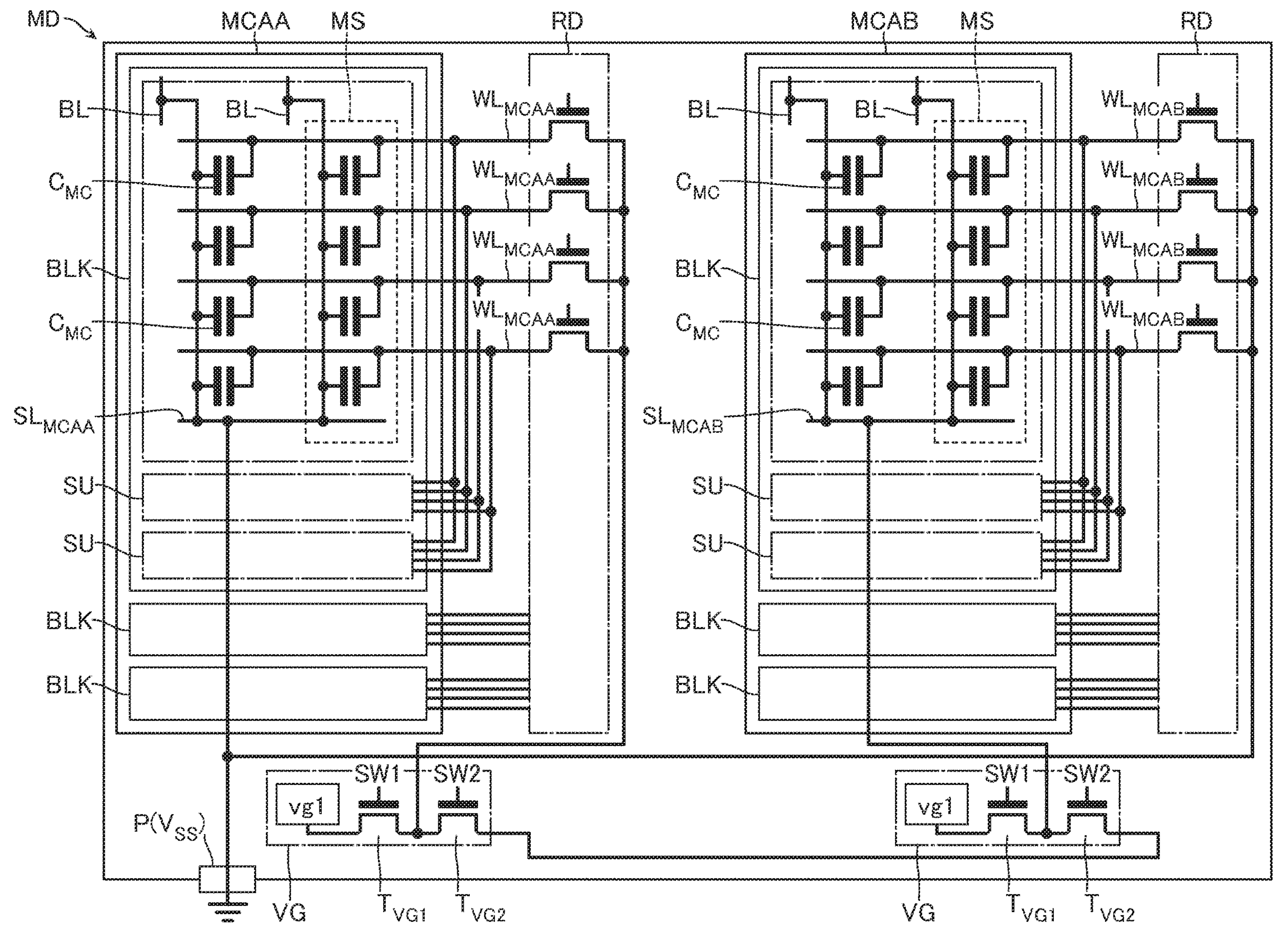
FIG. 38 is a schematic circuit diagram for illustrating the charge share operation.

Next, with reference to FIG. 38, the charge share operation between the word lines WL in a memory cell array MCA and the source line SL in another memory cell array MCA will be described. FIG. 38 is a schematic circuit diagram illustrating a configuration of the semiconductor memory device according to the embodiment.

The charge share operation exemplified in FIG. 38 is basically performed similarly to the charge share operation described with reference to FIG. 36. However, in the example of FIG. 38, when the charge share operation is performed, all word lines $WL_{MCAA}$ are conducted to the source line $SL_{MCAB}$ In association with this, about half of an electric charge in the word lines $WL_{MCAA}$ is transferred to the source line $SL_{MCAB}$. After that, the word lines $WL_{MCAA}$ and the source line $SL_{MCAB}$ are electrically separated.

After performing the charge share operation, the electric charge in the word lines $WL_{MCAA}$ is discharged. On the other hand, the electric charge in the source line $SL_{MCAB}$ is used for the erase operation or the like.

Figure 39:
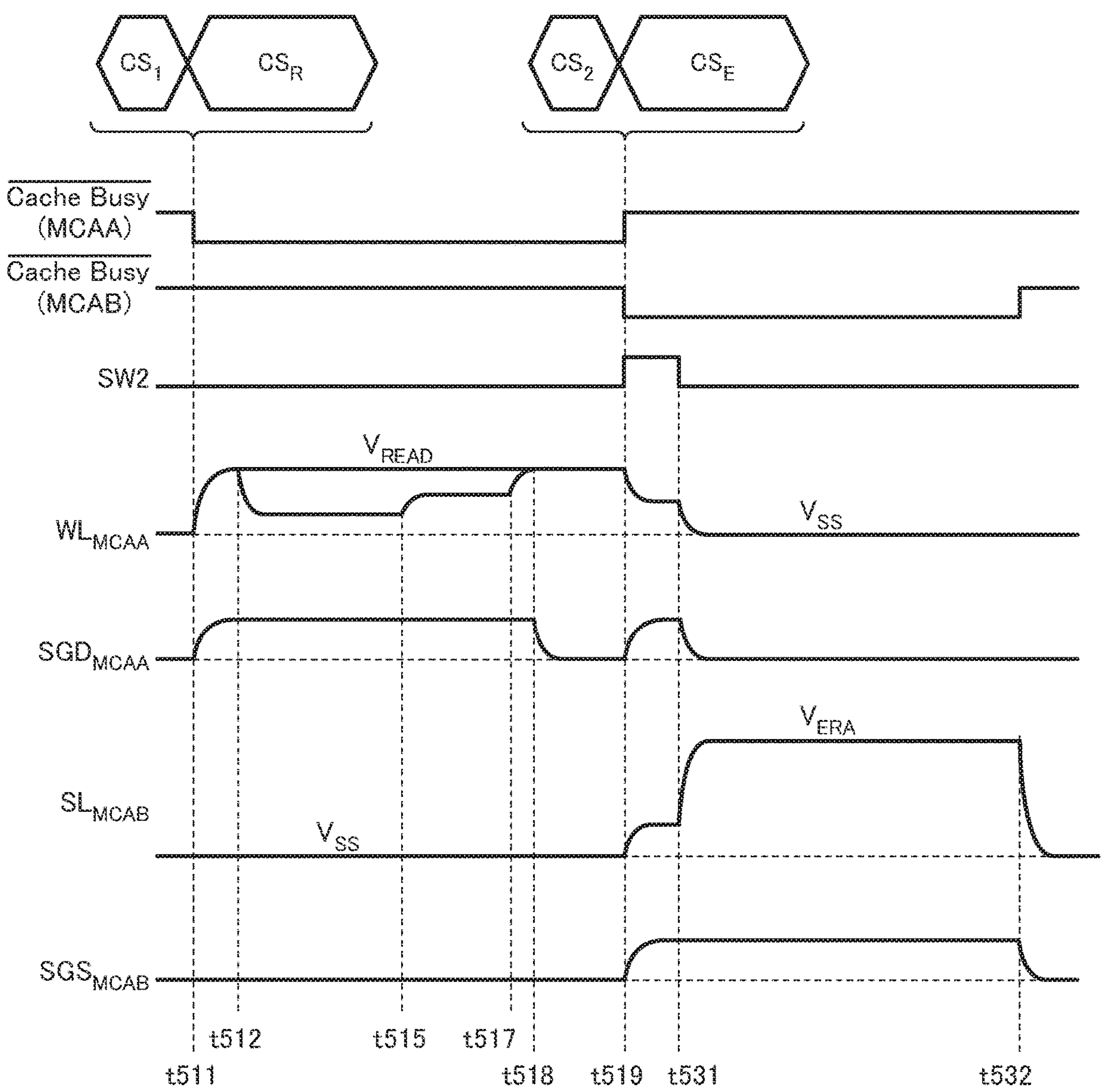
FIG. 39 is a schematic waveform diagram for illustrating the charge share operation.

Next, with reference to FIG. 39, the charge share operation between the word lines WL in a memory cell array MCA and the source line SL in another memory cell array MCA will be described in more detail. FIG. 39 is a schematic waveform diagram for illustrating the charge share operation.

In FIG. 39, a drain-side select gate line SGD corresponding to the memory cell array MCAA and a memory block BLK to which the read operation or the like is performed is shown as a drain-side select gate line $SGD_{MCAA}$. Additionally, a source-side select gate line SGS corresponding to the memory cell array MCAB and a memory block BLK to which the erase operation or the like is performed is shown as a source-side select gate line $SGS_{MCAB}$.

The charge share operation exemplified in FIG. 39 is basically performed similarly to the charge share operation described with reference to FIG. 37.

However, in the example in FIG. 39, at timing t519, the controller die CD inputs the command set $CS_2$ and the command set $CS_E$ to the memory die MD.

Additionally at timing t519, the charge share operation is performed, and the electric charge in the word lines $WL_{MCAA}$ is transferred to the source line $SL_{MCAB}$. Additionally, at timing t531, the voltages of the signal lines SW2 turn to "L" state form "H" state. By this, the word lines $WL_{MCAA}$ and the source line $SL_{MCAB}$ are electrically separated. The time from the timing t519 to the timing t531 may be short enough. For example, at this timing, the voltage of the source line $SL_{MCAB}$ need not to converge to about ½ $V_{READ}$.

From timing t531 to timing t532, the erase operation is performed in the memory cell array MCAB. The operation in the memory cell array MCAB from the timing t531 to the timing t532 is performed similarly to the operation from the timing t321 to the timing t322 described with reference to FIG. 27. However, at the timing t321 in FIG. 27, the voltage of the source line SL increases from the ground voltage $V_{SS}$ to the erase voltage $V_{ERA}$. On the other hand, at the timing t531 in FIG. 39, the voltage of the source line $SL_{MCAB}$ increases from the voltage of about half of the read pass voltage $V_{READ}$ to the erase voltage $V_{ERA}$.

In FIG. 38 and FIG. 39, an example that a part of the electric charge charged in the read operation is used in the erase operation performed next is described. However, it is also possible to use the part of the electric charge charged in the write operation for the erase operation performed next. Additionally, it is also possible to use a part of the electric charge charged in the erase operation for the read operation or the write operation performed next.

[Charge Share Operation Between Source Line SL and Source Line SL]

Figure 40:
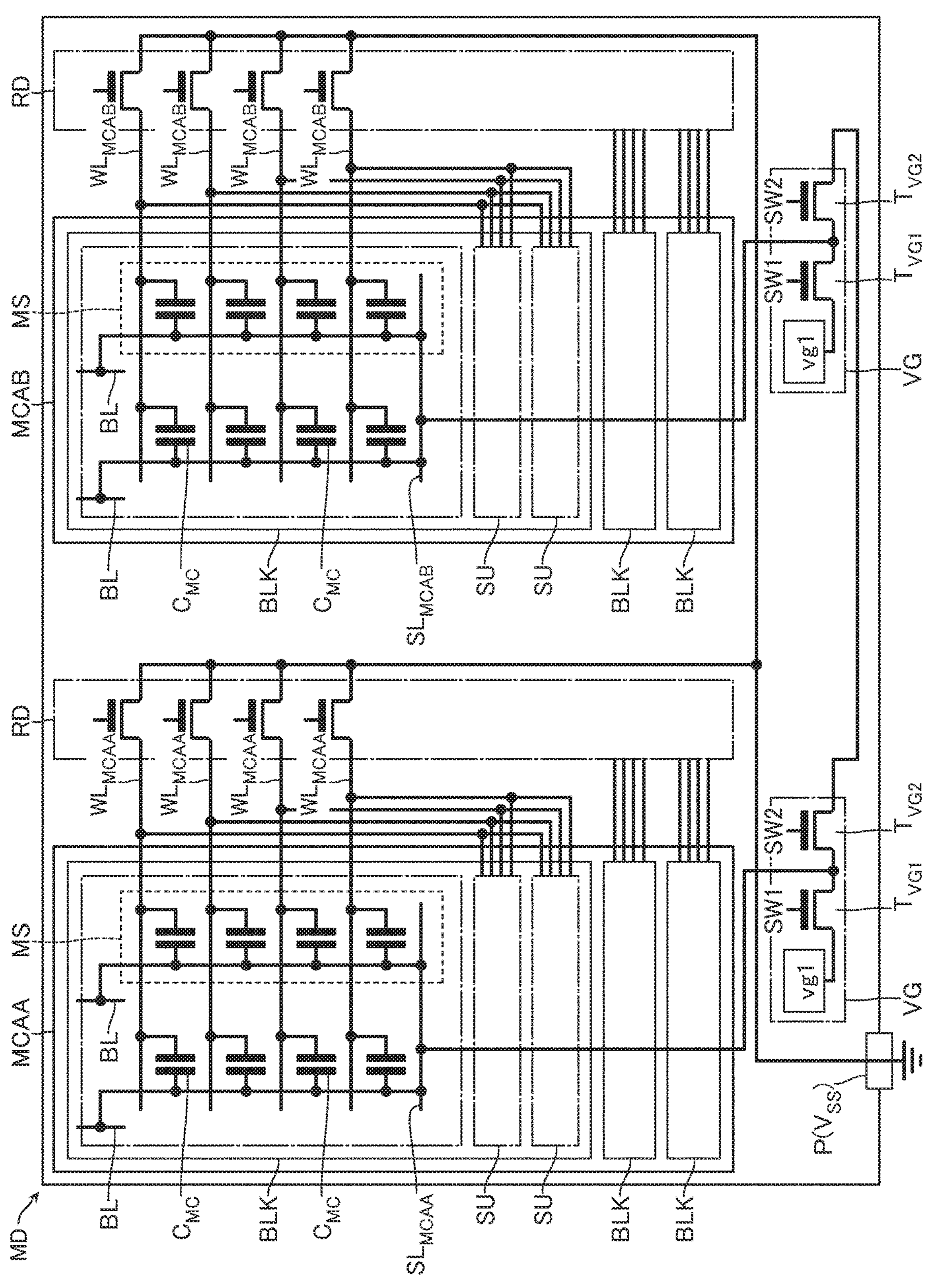
FIG. 40 is a schematic circuit diagram for illustrating the charge share operation.

Next, with reference to FIG. 40, the charge share operation between the source line SL in a memory cell array MCA and the source line SL in another memory cell array MCA will be described. FIG. 40 is a schematic circuit diagram illustrating a configuration of the semiconductor memory device according to the embodiment.

The charge share operation exemplified in FIG. 40 is basically performed similarly to the charge share operation described with reference to FIG. 38. However, in the example of FIG. 40, when the charge share operation is performed, the source line $SL_{MCAA}$ is conducted to the source line $SL_{MCAB}$. In association with this, about half of an electric charge in the source line $SL_{MCAA}$ is transferred to the source line $SL_{MCAB}$. After that, the source line $SL_{MCAA}$ and the source line $SL_{MCAB}$ are electrically separated.

After performing the charge share operation, the electric charge in the source line $SL_{MCAA}$ is discharged. On the other hand, the electric charge in the source line $SL_{MCAB}$ is used for the erase operation or the like.

Figure 41:
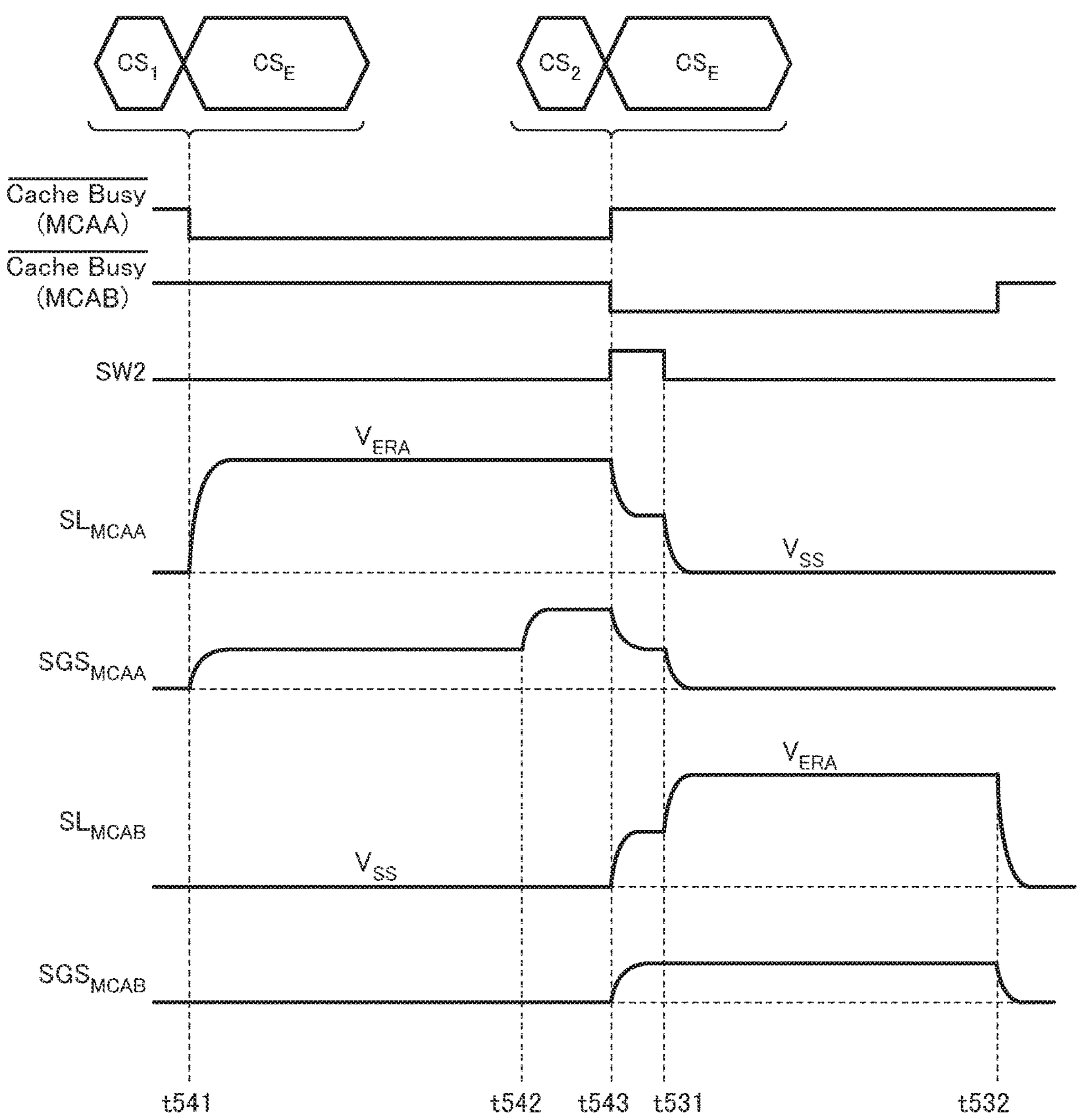
FIG. 41 is a schematic waveform diagram for illustrating the charge share operation.

Next, with reference to FIG. 41, the charge share operation between the source line SL in a memory cell array MCA and the source line SL in another memory cell array MCA will be described in more detail. FIG. 41 is a schematic waveform diagram for illustrating the charge share operation.

In FIG. 41, a source-side select gate line SGS corresponding to the memory cell array MCAA and a memory block BLK to which the erase operation or the like is performed is shown as a source-side select gate line $SGS_{MCAA}$. Additionally, a source-side select gate line SGS corresponding to the memory cell array MCAB and a memory block BLK to which the erase operation or the like is performed is shown as a source-side select gate line $SGS_{MCAB}$.

The charge share operation exemplified in FIG. 41 is basically performed similarly to the charge share operation described with reference to FIG. 39.

However, in the example in FIG. 41, at timing t541, the controller die CD inputs the command set $CS_1$ and the command set $CS_E$ to the memory die MD.

From timing t541 to timing t542, the erase operation is performed in the memory cell array MCAA. The operation in the memory cell array MCAA from the timing t541 to the timing t542 is performed similarly to the operation from the timing t321 to the timing t322 described with reference to FIG. 27.

At timing t542, memory cell array MCAA is set to the standby mode. In the standby mode, voltages of the source line $SL_{MCAA}$ is maintained to the erase voltage $V_{ERA}$. Additionally, in the standby mode according to the embodiment, the memory cells MC corresponding to the word lines $WL_{MCAA}$ are electrically separated from the bit lines BL and the source lines SL by adjusting the voltage of the select gate lines SG. In the example of FIG. 41, the voltage of the source-side select gate line $SGS_{MCAA}$ increases to a voltage turning the source-side select transistor STS in the OFF state.

In the example in FIG. 41, at timing t543, the controller die CD inputs the command set $CS_2$ and the command set $CS_E$ to the memory die MD.

Additionally at timing t543, the charge share operation is performed. In accordance with this, the voltages of the signal lines SW2 turn to "H" state form "L" state. By this, as described with reference to FIG. 40, the electric charge in the source line $SL_{MCAA}$ is transferred to the source line $SL_{MCAB}$. Additionally, at timing t531, the voltages of the signal lines SW2 turn to "L" state form "H" state. By this, the source line $SL_{MCAA}$ and the source line $SL_{MCAB}$ are electrically separated. The time from the timing t543 to the timing t531 may be short enough. For example, at this timing, the voltage of the source line $SL_{MCAB}$ need not to converge to about ½ $V_{READ}$.

From timing t531 to timing t532, the erase operation is performed in the memory cell array MCAB. The operation in the memory cell array MCAB from the timing t531 to the timing t532 is performed similarly to the operations from the timing t531 to the timing t532 described with reference to FIG. 39. However, at the timing t531 in FIG. 39, the voltage of the source line SL increases from the voltage of about half of the read pass voltage $V_{READ}$ to the erase voltage $V_{ERA}$. On the other hand, at the timing t531 in FIG. 41, the voltage of the source line $SL_{MCAB}$ increases from the voltage of about half of the erase voltage $V_{ERA}$ to the erase voltage $V_{ERA}$.

[Charge Share Operation Between Memory Blocks BLK]

Figure 42:
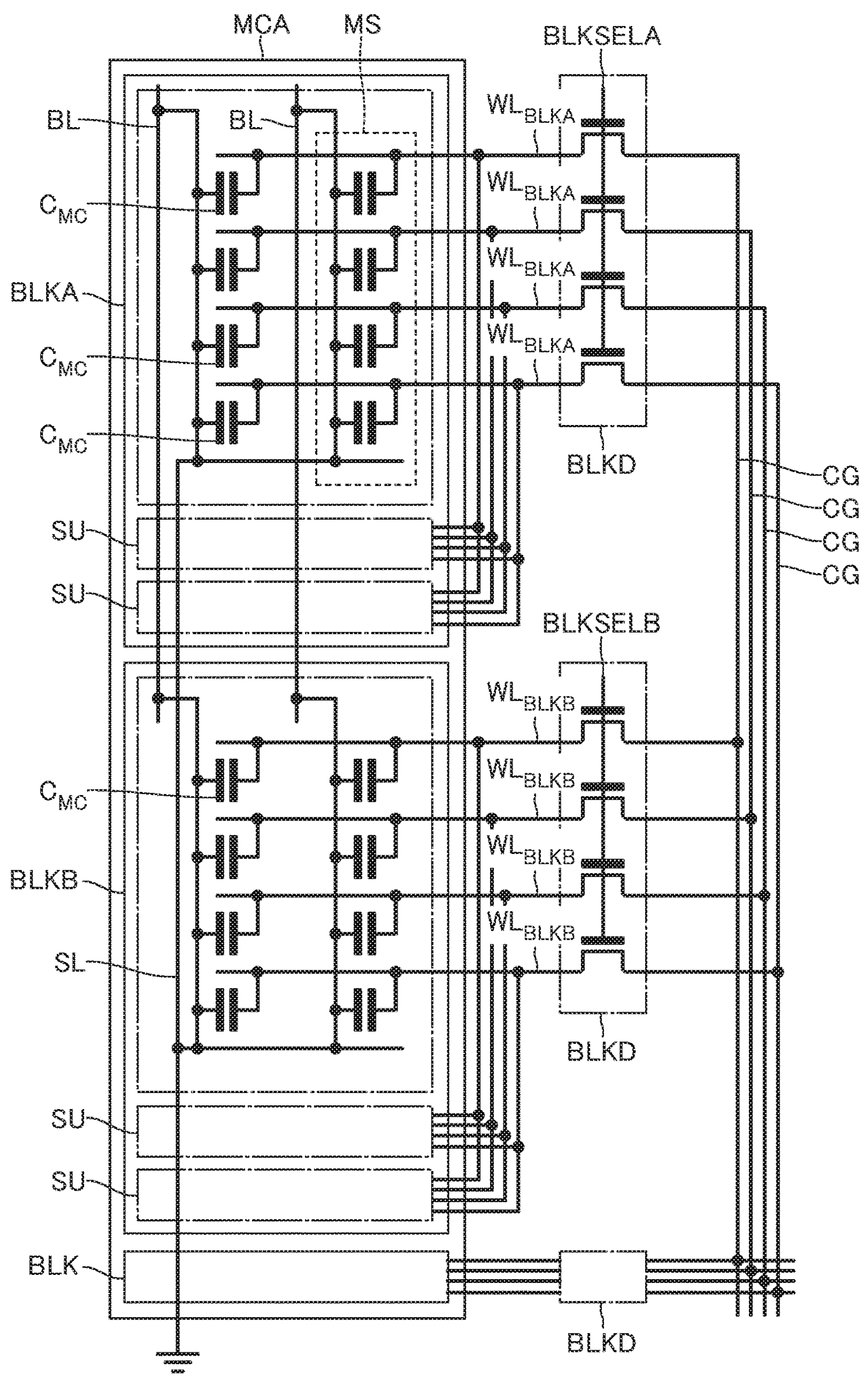
FIG. 42 is a schematic circuit diagram for illustrating the charge share operation.

Next, with reference to FIG. 42, the charge share operation between the word lines WL in a memory block BLK and the word lines WL in another memory block BLK will be described. FIG. 42 is a schematic circuit diagram illustrating a configuration of the semiconductor memory device according to the embodiment. In FIG. 42, two memory blocks BLK are shown as a memory block BLKA and a memory block BLKB.

Additionally, word lines WL corresponding to the memory block BLKA are shown as word lines $WL_{BLKA}$.

Additionally, word lines WL corresponding to the memory block BLKB are shown as word lines $WL_{BLKB}$.

Additionally, in FIG. 42, for convenience of explanation, an example in which the source line SL is applied with the ground voltage $V_{SS}$. Additionally, in FIG. 42, configurations in circuits are shown in a simplified manner.

For example, in case that the read operation is performed in the memory block BLKA, from the timing t121 to the timing t122 described with reference to FIG. 17, the word lines $WL_{BLKA}$ are charged. By doing this, among the capacitors $C_{MC}$ shown in FIG. 42, all capacitors $C_{MC}$ connected to the word lines $WL_{BLKA}$ are charged.

For example, if the charge share operation is performed between the memory block BLKA and the memory block BLKB, voltages of signal lines BLKSELA, BLKSELB turn to "H" state. In association with this, all word lines $WL_{BLKA}$ are conducted to all word lines $WL_{BLKB}$. In association with this, about half of an electric charge in the word lines $WL_{BLKA}$ is transferred to the word lines $WL_{BLKB}$. After that, the word lines $WL_{BLKA}$ and the word lines $WL_{BLKB}$ are electrically separated.

After performing the charge share operation, the electric charge in the word lines $WL_{BLKA}$ is discharged. On the other hand, the electric charge in the word lines $WL_{BLKB}$ is used for the read operation or the like.

Figure 43:
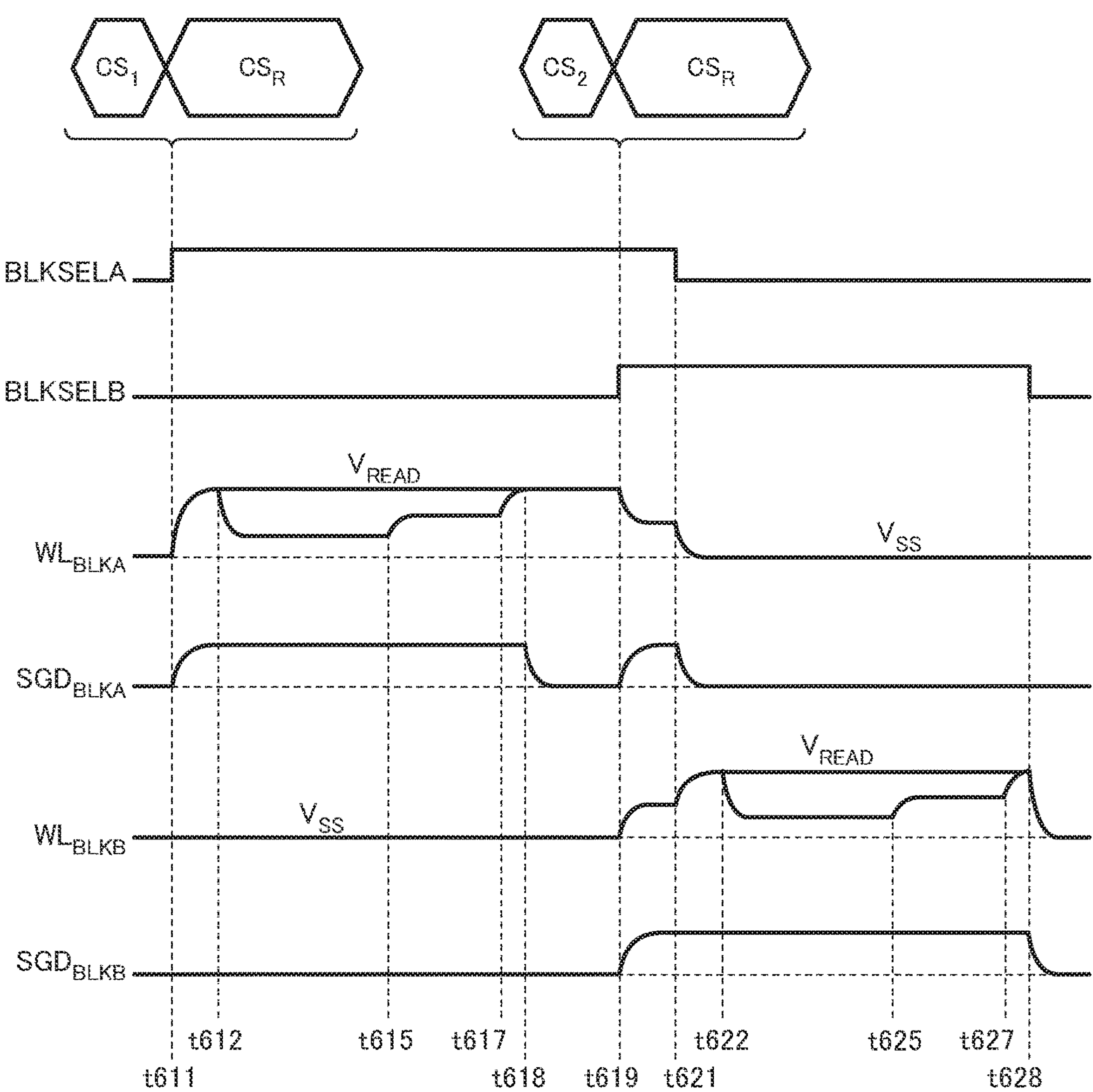
FIG. 43 is a schematic waveform diagram for illustrating the charge share operation.

Next, with reference to FIG. 43, the charge share operation between the word lines WL in a memory block BLK and the word lines WL in another memory block BLK will be described in more detail. FIG. 43 is a schematic waveform diagram for illustrating the charge share operation.

In FIG. 43, a drain-side select gate line SGD corresponding to the memory block BLKA is shown as a drain-side select gate line $SGD_{BLKA}$. Additionally, a drain-side select gate line SGD corresponding to the memory block BLKB is shown as a drain-side select gate line $SGD_{BLKB}$.

In the example in FIG. 43, at timing t611, the controller die CD inputs the command set $CS_1$ and the command set $CS_R$ to the memory die MD.

From timing t611 to timing t618, the read operation is performed in the memory block BLKA. The operation in the memory block BLKA from the timing t611 to the timing t618 is performed similarly to the operation from the timing t121 to the timing t128 described with reference to FIG. 17. At timing t611, the voltage of the signal line BLKSELA turns to "H" state from "L" state.

At timing t618, memory block BLKA is set to the standby mode.

In the example in FIG. 43, at timing t619, the controller die CD inputs the command set $CS_2$ and the command set $CS_R$ to the memory die MD.

At timing t619, the standby mode is released. Additionally, the charge share operation is performed. In association with this, the voltage of the signal line BLKSELB turns to "H" state from "L" state. By doing this, as described with reference to FIG. 42, the electric charge in the word lines $WL_{BLKA}$ is transferred to the word lines $WL_{BLKB}$. Additionally, at timing t621, the voltage of the signal line BLKSELA turns to "L" state form "H" state. By this, the word lines $WL_{BLKA}$ and the word lines $WL_{BLKB}$ are electrically separated. The time from the timing t619 to the timing t621 may be short enough. For example, at this timing, the voltage of the word lines $WL_{BLKB}$ need not to converge to about ½ $V_{READ}$.

From timing t621 to timing t628, the read operation is performed in the memory block BLKB. The operation in the memory block BLKB from the timing t621 to the timing t628 is performed similarly to the operation from the timing t121 to the timing t128 described with reference to FIG. 17. However, from the timing t121 to the timing t122 in FIG. 17, the voltages of the word lines WL increase from the ground voltage $V_{SS}$ to the read pass voltage $V_{READ}$. On the other hand, from the timing t621 to the timing t622 in FIG. 43, the voltages of the word lines $WL_{BLKB}$ increase from the voltage of about half of the read pass voltage $V_{READ}$ to the read pass voltage $V_{READ}$.

In FIG. 42 and FIG. 43, an example that a part of the electric charge charged in the read operation is used in another read operation performed next is described. However, it is also possible to use the part of the electric charge charged in the read operation for the write operation performed next. Additionally, it is also possible to use a part of the electric charge charged in the write operation for the read operation or the write operation performed next.

Second Embodiment

Figure 44:
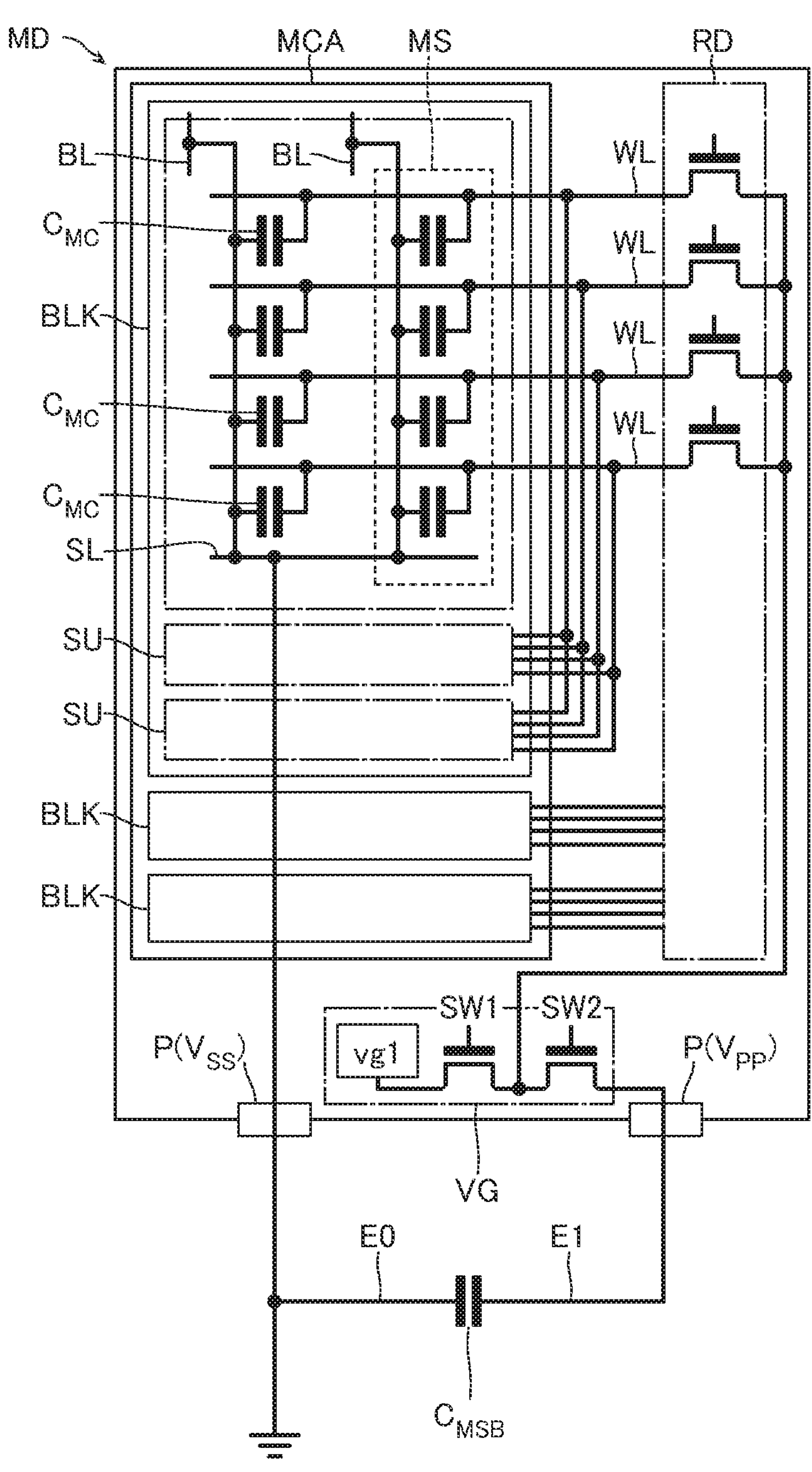
FIG. 44 is a schematic circuit diagram illustrating a part of a semiconductor memory device according to a second embodiment.

Next, with reference to FIG. 44, a semiconductor memory device according to a second embodiment will be described. FIG. 44 is a schematic circuit diagram illustrating a part of the semiconductor memory device according to the second embodiment.

The semiconductor memory device according to the second embodiment is basically configured similarly to the semiconductor memory device according to the first embodiment. However, in the semiconductor memory device according to the second embodiment, a capacitor $C_{MSB}$ is disposed between the pad electrode P to which the ground voltage $V_{SS}$ is applied and the pad electrode P to which the voltage $V_{PP}$ is applied. The capacitor $C_{MSB}$ may be, for example, disposed on the mounting substrate MSB described with reference to FIG. 2. In the illustrated example, a terminal of the capacitor $C_{MSB}$ connected to the pad electrode P to which the ground voltage $V_{SS}$ is applied is shown as a terminal E0, and the other terminal of the capacitor $C_{MSB}$ connected to the pad electrode P to which the voltage $V_{PP}$ is applied is shown as a terminal E1.

In the semiconductor memory device according to the embodiment, when the charge share operation is performed after the read operation, the write operation, or the erase operation, the charge is transferred to the capacitor $C_{MSB}$, not to the word lines WL or the source line SL of another memory die MD, another memory cell array MCA, or another memory block BLK. Additionally, in the semiconductor memory device according to the embodiment, when the charge share operation is performed, the memory die MD, the memory cell array MCA, or the memory block BLK is not set to the standby mode, and the charge share operation is performed immediately.

[Charge Share Operation Between Memory Dies MD]

Figure 45:
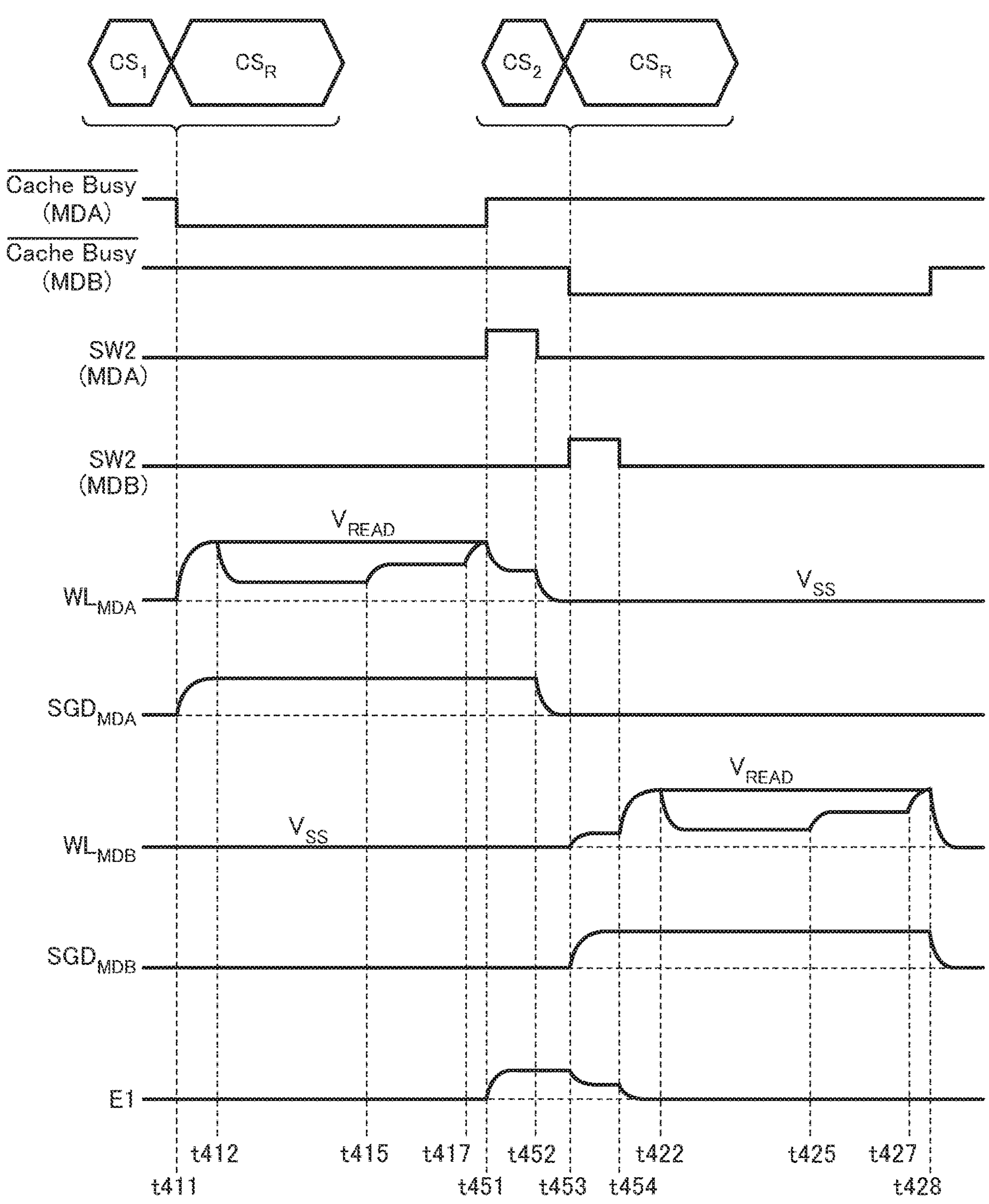
FIG. 45 is a schematic waveform diagram for illustrating the charge share operation.

Next, with reference to FIG. 45, the charge share operation between the word lines WL in a memory die MD and the word lines WL in another memory die MD will be described. FIG. 45 is a schematic waveform diagram for illustrating the charge share operation.

The charge share operation exemplified in FIG. 45 is basically performed similarly to the charge share operation described with reference to FIG. 29.

However, in the example of FIG. 45, the read operation is finished at timing t451.

Additionally, at timing t451, the charge share operation is performed between the memory die MDA and the capacitor $C_{MSB}$. In association with this, the voltage of the signal line SW2 corresponding to the memory die MDA turns to "H" state from "L" state. By doing this, the electric charge in the word lines $WL_{MDA}$ is transferred to the electrode of the capacitor $C_{MSB}$ corresponding to the terminal E1. Additionally, at timing t452, the voltage of the signal line SW2 corresponding to the memory die MDA turns to "L" state from "H" state. By this, the word lines $WL_{MDA}$ and the terminal E1 are electrically separated. The time from the timing t451 to the timing t452 may be short enough. For example, at this timing, the voltage of the terminal E1 need not to converge to about ½ $V_{READ}$.

Additionally, at timing t453, the charge share operation is performed between the memory die MDB and the capacitor $C_{MSB}$. In association with this, the voltage of the signal line SW2 corresponding to the memory die MDB turns to "H" state from "L" state. By doing this, the electric charge in the electrode of the capacitor $C_{MSB}$ corresponding to the terminal E1 is transferred to the word lines $WL_{MDB}$. Additionally, at timing t454, the voltage of the signal line SW2 corresponding to the memory die MDB turns to "L" state from "H" state. By this, the word lines $WL_{MDB}$ and the terminal E1 are electrically separated. The time from the timing t453 to the timing t454 may be short enough. For example, at this timing, the voltage of the terminal E1 need not to converge to about ¼ $V_{READ}$.

In FIG. 45, an example that a part of the electric charge charged in the read operation is used in another read operation performed next is described. However, it is also possible to use the part of the electric charge charged in the read operation for the write operation performed next. Additionally, it is also possible to use a part of the electric charge charged in the write operation for the read operation or the write operation performed next.

[Charge Share Operation Between Memory Cell Arrays MCA]

Figure 46:
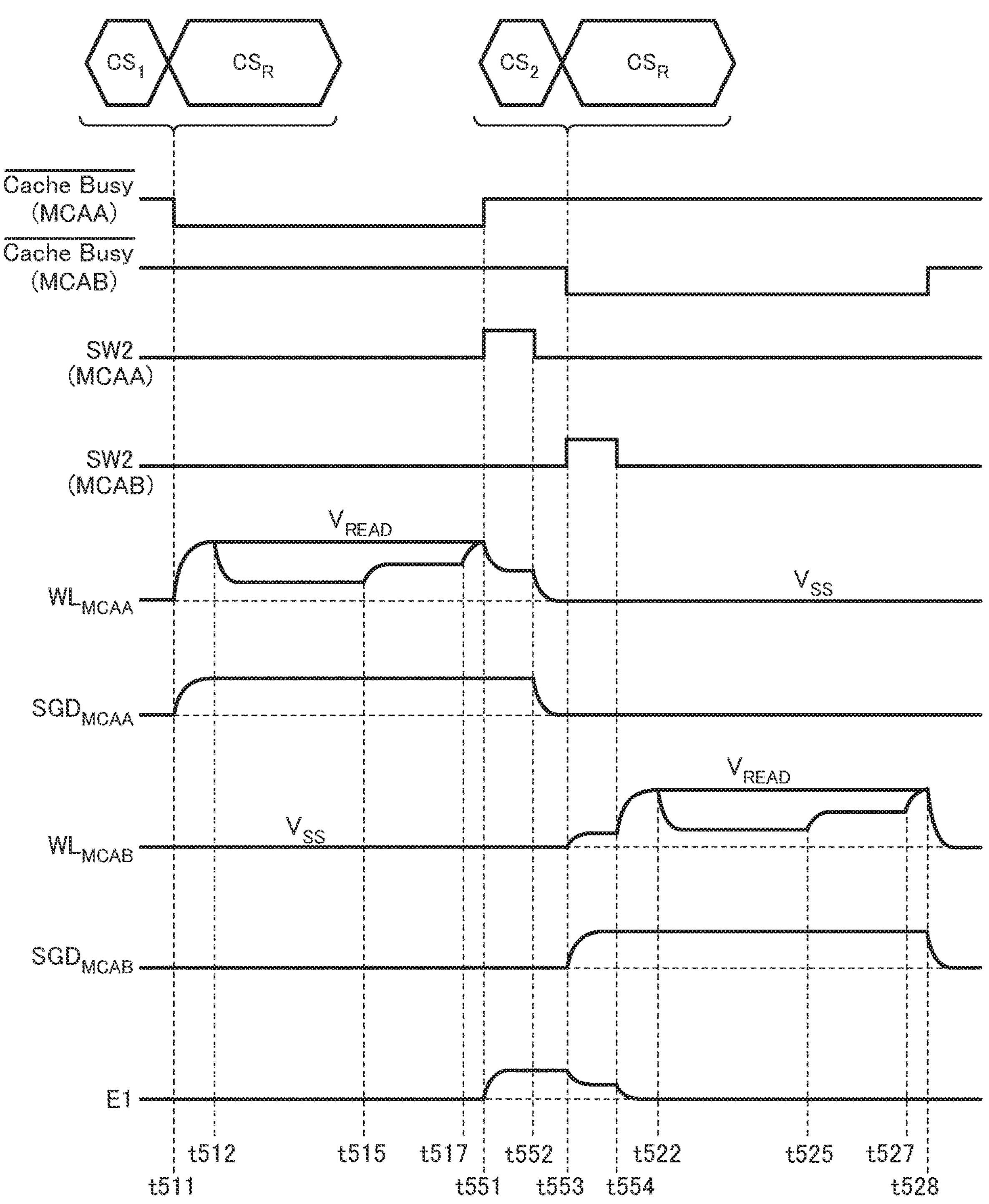
FIG. 46 is a schematic waveform diagram for illustrating the charge share operation.

Next, with reference to FIG. 46, the charge share operation between the word lines WL in a memory cell array MCA and the word lines WL in another memory cell array MCA will be described. FIG. 46 is a schematic waveform diagram for illustrating the charge share operation.

The charge share operation exemplified in FIG. 46 is basically performed similarly to the charge share operation described with reference to FIG. 37.

However, in the example of FIG. 46, the read operation is finished at timing t551.

Additionally, at timing t551, the charge share operation is performed between the memory cell array MCAA and the capacitor $C_{MSB}$. In association with this, the voltage of the signal line SW2 corresponding to the memory cell array MCAA turns to "H" state from "L" state. By doing this, the electric charge in the word lines $WL_{MCAA}$ is transferred to the electrode of the capacitor $C_{MSB}$ corresponding to the terminal E1. Additionally, at timing t552, the voltage of the signal line SW2 corresponding to the memory cell array MCAA turns to "L" state from "H" state. By this, the word lines $WL_{MCAA}$ and the terminal E1 are electrically separated. The time from the timing t551 to the timing t552 may be short enough. For example, at this timing, the voltage of the terminal E1 need not to converge to about ½ $V_{READ}$.

Additionally, at timing t553, the charge share operation is performed between the memory cell array MCAB and the capacitor $C_{MSB}$. In association with this, the voltage of the signal line SW2 corresponding to the memory cell array MCAB turns to "H" state from "L" state. By doing this, the electric charge in the electrode of the capacitor $C_{MSB}$ corresponding to the terminal E1 is transferred to the word lines $WL_{MCAB}$. Additionally, at timing t554, the voltage of the signal line SW2 corresponding to the memory cell array MCAB turns to "L" state from "H" state. By this, the word lines $WL_{MCAB}$ and the terminal E1 are electrically separated. The time from the timing t553 to the timing t554 may be short enough. For example, at this timing, the voltage of the terminal E1 need not to converge to about ¼ $V_{READ}$.

In FIG. 46, an example that a part of the electric charge charged in the read operation is used in another read operation performed next is described. However, it is also possible to use the part of the electric charge charged in the read operation for the write operation performed next. Additionally, it is also possible to use a part of the electric charge charged in the write operation for the read operation or the write operation performed next.

[Charge Share Operation Between Memory Blocks BLK]

Figure 47:
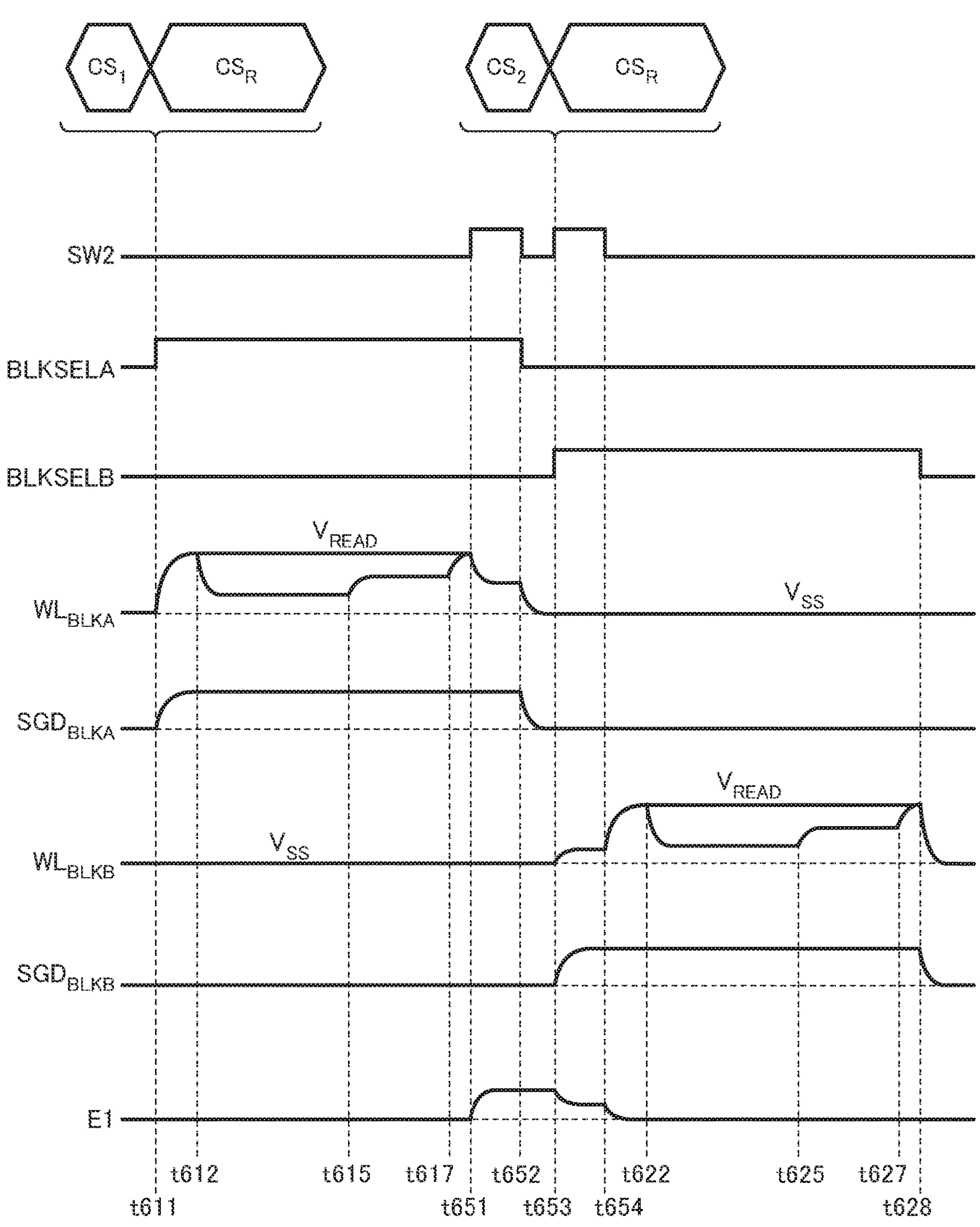
FIG. 47 is a schematic waveform diagram for illustrating the charge share operation.

Next, with reference to FIG. 47, the charge share operation between the word lines WL in a memory block BLK and the word lines WL in another memory block BLK will be described. FIG. 47 is a schematic waveform diagram for illustrating the charge share operation.

The charge share operation exemplified in FIG. 47 is basically performed similarly to the charge share operation described with reference to FIG. 43.

However, in the example of FIG. 47, the read operation is finished at timing t651.

Additionally, at timing t651, the charge share operation is performed between the memory block BLKA and the capacitor $C_{MSB}$. In association with this, the voltage of the signal line SW2 turns to "H" state from "L" state. By doing this, the electric charge in the word lines $WL_{BLKA}$ is transferred to the electrode of the capacitor $C_{MSB}$ corresponding to the terminal E1. Additionally, at timing t652, the voltage of the signal line SW2 turns to "L" state from "H" state. Additionally, the voltage of the signal line BLKSELA turns to "L" state from "H" state. By this, the word lines $WL_{BLKA}$ and the terminal E1 are electrically separated. The time from the timing t651 to the timing t652 may be short enough. For example, at this timing, the voltage of the terminal E1 need not to converge to about ½ $V_{READ}$.

Additionally, at timing t653, the charge share operation is performed between the memory block BLKB and the capacitor $C_{MSB}$. In association with this, the voltage of the signal line SW2 turns to "H" state from "L" state. Additionally, the voltage of the signal line BLKSELB turns to "H" state from "L" state. By doing this, the electric charge in the electrode of the capacitor $C_{MSB}$ corresponding to the terminal E1 is transferred to the word lines $WL_{BLKB}$. Additionally, at timing t654, the voltage of the signal line SW2 turns to "L" state from "H" state. By this, the word lines $WL_{BLKB}$ and the terminal E1 are electrically separated. The time from the timing t653 to the timing t654 may be short enough. For example, at this timing, the voltage of the terminal E1 need not to converge to about ¼ $V_{READ}$.

In FIG. 47, an example that a part of the electric charge charged in the read operation is used in another read operation performed next is described. However, it is also possible to use the part of the electric charge charged in the read operation for the write operation performed next. Additionally, it is also possible to use a part of the electric charge charged in the write operation for the read operation or the write operation performed next.

Other Embodiments

The semiconductor memory devices according to the first embodiment to the second embodiment have been described above. However, the semiconductor memory devices described above are merely examples, and the configuration, the operation, and the like are adjustable as necessary.

For example, in the first embodiment and the second embodiment, examples in which the electric charge is transferred via the pad electrode P which is able to apply the voltage $V_{PP}$, when the charge share operation is performed via one or a plurality of memory dies MD. However, such method is merely an example. For example, other pad electrodes P are available for the charge share operation instead of the pad electrode P which is able to apply the voltage $V_{PP}$. As other pad electrodes P, for example, pad electrodes P used for test or the like of the semiconductor memory device or the like are conceivable.

Additionally, the semiconductor memory devices according to the first embodiment to the second embodiment are configured to be able to perform all of the charge share operation between the memory dies MD, the charge share operation between the memory cell arrays MCA, and the charge share operation between the memory blocks BLK. However, such configurations are merely examples. For example, the semiconductor memory devices according to the first embodiment to the second embodiment may be configured to perform at least one of the three charge share operations. In such cases, a part or all of the data Add1 included in the command set $CS_1$ described with reference to FIG. 30, and a part or all of the data Add2 included in the command set $CS_2$ described with reference to FIG. 31 may be omitted. In case that all of the data Add1 and all of the data Add2 are omitted, the data X1*h* included in the command set $CS_1$ and the data X2*h* included in the command set $CS_2$ each function as prefix commands according to next command sets.

Additionally, in examples of FIG. 28 to FIG. 35 and FIG. 45, electric charge is transferred from one memory die MD to another memory die MD.

However, for example, it is also possible to transfer electric charge from a plurality of memory dies MD to one or a plurality of memory dies MD. In this case, for example, the controller die CD may input the command set $CS_1$ and a command set for the operations (for example, the command set $CS_R$, the command set $CS_W$, or the command set $CS_E$) to a plurality of memory dies MD. Additionally, after the operation, the plurality of memory dies MD may be set to the standby mode. Additionally, in the charge share operation, the signal lines SW2 of the plurality of memory dies MD may be turned to "H" state from "L" state in the charge share operation.

Additionally, for example, it is also possible to transfer electric charge from one or a plurality of memory dies MD to a plurality of memory dies MD. In this case, for example, the controller die CD may input the command set $CS_2$ and the command set for the operations to a plurality of memory dies MD. Additionally, in the charge share operation, the signal lines SW2 of the plurality of memory dies MD may be turned to "H" state from "L" state in the charge share operation.

Additionally, in examples of FIG. 36 to FIGS. 41 and FIG. 46, electric charge is transferred from one memory cell array MCA to another one memory cell array MCA.

However, for example, it is also possible to transfer electric charge from a plurality of memory cell arrays MCA to one or a plurality of memory cell arrays MCA. In this case, for example, the controller die CD may input the command set $CS_1$ and the command set for the operations to a plurality of memory cell arrays MCA. Additionally, after the operation, the plurality of memory cell arrays MCA may be set to the standby mode. Additionally, in the charge share operation, the signal lines SW2 each corresponding to the plurality of memory cell arrays MCA may be turned to "H" state from "L" state in the charge share operation.

Additionally, for example, it is also possible to transfer electric charge from one or a plurality of memory cell arrays MCA to a plurality of memory cell arrays MCA. In this case, for example, the controller die CD may input the command set $CS_2$ and the command set for the operations to a plurality of memory cell arrays MCA. Additionally, in the charge share operation, the signal lines SW2 each corresponding to the plurality of memory cell arrays MCA may be turned to "H" state from "L" state in the charge share operation.

Additionally, in examples of FIG. 42 to FIG. 43 and FIG. 47, electric charge is transferred from one memory block BLK to another one memory block BLK.

However, for example, it is also possible to transfer electric charge from a plurality of memory blocks BLK to one or a plurality of memory blocks BLK. In this case, for example, the controller die CD may input the command set $CS_1$ and the command set for the operations to a plurality of memory blocks BLK. Additionally, after the operation, the plurality of memory blocks BLK may be set to the standby mode. Additionally, in the charge share operation, the signal lines BLKSEL each corresponding to the plurality of memory blocks BLK may be turned to "H" state in the charge share operation.

Additionally, for example, it is also possible to transfer electric charge from one or a plurality of memory blocks BLK to a plurality of memory blocks BLK. In this case, for example, the controller die CD may input the command set $CS_2$ and the command set for the operations to a plurality of memory blocks BLK. Additionally, in the charge share operation, the signal lines BLKSEL each corresponding to the plurality of memory blocks BLK may be turned to "H" state from "L" state in the charge share operation.

OTHERS

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:

a first memory cell;

a first word line connected to the first memory cell;

a first bit line connected to the first memory cell;

a second memory cell;

a second word line connected to the second memory cell; and a second bit line connected to the second memory cell, wherein:

the semiconductor memory device is configured to perform:

a first operation which is a read operation or a write operation to the first memory cell; and a second operation which is a read operation or a write operation to the second memory cell, the semiconductor memory device transitions to a standby mode after performing the first operation in response to an input of a first command set and a second command set, the semiconductor memory device performs a charge share operation to equalize voltages of the first word line and the second word line after the standby mode is released in response to an input of a third command set and a fourth command set during the standby mode, and the semiconductor memory device performs the second operation using at least a part of an electric charge generated when the first operation is performed.

2. The semiconductor memory device according to claim 1, further comprising:

a first memory die; and a second memory die, wherein:

the first memory die includes the first memory cell, and the second memory die includes the second memory cell.

3. The semiconductor memory device according to claim 2, further comprising a third memory die including a third memory cell, wherein:

the semiconductor memory device is configured to perform a third operation which is a read operation, a write operation, or an erase operation to the third memory cell, and in a case that the second operation is performed after performing the first operation and the third operation, the semiconductor memory device performs the second operation using at least a part of an electric charge generated when the first operation is performed, and at least a part of an electric charge generated when the third operation is performed.

4. The semiconductor memory device according to claim 2, further comprising a fourth memory die including a fourth memory cell, wherein:

the semiconductor memory device is configured to perform a fourth operation which is a read operation, a write operation, or an erase operation to the fourth memory cell, and in a case that the second operation and the fourth operation are performed after performing the first operation, the semiconductor memory device performs the second operation and the fourth operation using at least a part of an electric charge generated when the first operation is performed.

5. The semiconductor memory device according to claim 1, further comprising a first memory die, the first memory die including a first memory cell array and a second memory cell array, the first memory cell array including the first memory cell, and the second memory cell array including the second memory cell.

6. The semiconductor memory device according to claim 5, wherein:

the first memory die further includes a third memory cell array, the third memory cell array includes a third memory cell, the semiconductor memory device is configured to perform a third operation which is a read operation, a write operation, or an erase operation to the third memory cell, and in a case that the second operation is performed after performing the first operation and the third operation, the semiconductor memory device performs the second operation using at least a part of an electric charge generated when the first operation is performed, and at least a part of an electric charge generated when the third operation is performed.

7. The semiconductor memory device according to claim 5, wherein:

the first memory die further includes a fourth memory cell array, the fourth memory cell array includes a fourth memory cell, the semiconductor memory device is configured to perform a fourth operation which is a read operation, a write operation, or an erase operation to the fourth memory cell, and in a case that the second operation and the fourth operation are performed after performing the first operation, the semiconductor memory device performs the second operation and the fourth operation using at least a part of an electric charge generated when the first operation is performed.

8. The semiconductor memory device according to claim 1, further comprising a first memory cell array, the first memory cell array including a first memory block and a second memory block, the first memory block including the first memory cell, and the second memory block including the second memory cell.

9. The semiconductor memory device according to claim 8, wherein:

the first memory cell array further includes a third memory block, the third memory block includes a third memory cell, the semiconductor memory device is configured to perform a third operation which is a read operation, a write operation, or an erase operation to the third memory cell, and in a case that the second operation is performed after performing the first operation and the third operation, the semiconductor memory device performs the second operation using at least a part of an electric charge generated when the first operation is performed, and at least a part of an electric charge generated when the third operation is performed.

10. The semiconductor memory device according to claim 8, wherein:

the first memory cell array further includes a fourth memory block, the fourth memory block includes a fourth memory cell, the semiconductor memory device is configured to perform a fourth operation which is a read operation, a write operation, or an erase operation to the fourth memory cell, and in a case that the second operation and the fourth operation are performed after performing the first operation, the semiconductor memory device performs the second operation and the fourth operation using at least a part of an electric charge generated when the first operation is performed.

11. The semiconductor memory device according to claim 1, wherein:

the second command set and the fourth command set are input to the semiconductor memory device when the read operation or the write operation is performed, the first command set is input to the semiconductor memory device after the read operation or the write operation is performed and before the charge share operation is performed, and the third command set is input to the semiconductor memory device when the charge share operation is performed.

12. The semiconductor memory device according to claim 1, wherein:

the first command set includes an address data corresponding to the first memory cell, and the third command set includes an address data corresponding to the second memory cell.

* * * * *